(12) United States Patent
Ito et al.

(10) Patent No.: US 7,169,327 B2
(45) Date of Patent: Jan. 30, 2007

(54) COMPOSITE PARTICLE FOR DIELECTRICS, ULTRAMICROPARTICULATE COMPOSITE RESIN PARTICLE, COMPOSITION FOR FORMING DIELECTRICS AND USE THEREOF

(75) Inventors: Nobuyuki Ito, Tokyo (JP); Hideaki Masuko, Tokyo (JP); Satomi Hasegawa, Tokyo (JP); Nakaatsu Yoshimura, Tokyo (JP)

(73) Assignee: JSR Corporation, Tokyo (JP)

( * ) Notice: Subject to any disclaimer, the term of this patent is extended or adjusted under 35 U.S.C. 154(b) by 366 days.

(21) Appl. No.: 10/240,266

(22) PCT Filed: Jan. 24, 2002

(86) PCT No.: PCT/JP02/00499

§ 371 (c)(1),
(2), (4) Date: Sep. 30, 2002

(87) PCT Pub. No.: WO02/061765

PCT Pub. Date: Aug. 8, 2002

(65) Prior Publication Data

US 2003/0151032 A1    Aug. 14, 2003

(30) Foreign Application Priority Data

Jan. 29, 2001  (JP) .............................. 2001-20290
Jul. 13, 2001  (JP) .............................. 2001-214473

(51) Int. Cl.
   *H01B 1/22*  (2006.01)
   *B32B 33/00* (2006.01)
(52) U.S. Cl. .................. 252/500; 252/512; 252/570; 361/750; 361/751; 428/407

(58) Field of Classification Search ................ 252/570, 252/572, 500, 520.2, 520.21; 428/403, 407; 501/136, 137, 138, 139; 361/750, 751
See application file for complete search history.

(56) References Cited

U.S. PATENT DOCUMENTS

| | | | |
|---|---|---|---|
| 2,322,353 A | | 6/1943 | Fruth |
| 4,115,114 A | | 9/1978 | Quang et al. |
| 4,452,830 A | | 6/1984 | Yoshizumi |
| 4,595,515 A | * | 6/1986 | Wakino et al. ............... 252/62 |
| 4,737,446 A | * | 4/1988 | Cohen et al. ............... 430/311 |
| 5,296,426 A | * | 3/1994 | Burn .......................... 501/139 |
| 5,374,453 A | * | 12/1994 | Swei et al. ................. 427/226 |
| 5,773,519 A | | 6/1998 | Ito et al. |
| 5,967,964 A | | 10/1999 | Hattori et al. |
| 6,146,749 A | | 11/2000 | Miyamoto et al. |
| 6,214,923 B1 | | 4/2001 | Goto et al. |
| 6,268,054 B1 | * | 7/2001 | Costantino et al. ......... 428/403 |
| 6,280,658 B1 | * | 8/2001 | Atarashi et al. ............ 252/572 |
| 6,586,513 B1 | * | 7/2003 | Goto et al. ................. 524/399 |
| 6,610,114 B1 | * | 8/2003 | Towery et al. ............... 51/308 |
| 6,656,590 B1 | * | 12/2003 | Venigalla et al. ........... 428/403 |

FOREIGN PATENT DOCUMENTS

| | | |
|---|---|---|
| EP | 1 091 371 A2 | 4/2001 |
| JP | 57-10663 | 1/1982 |
| JP | 57-70153 | 4/1982 |
| JP | 58-174421 | 10/1983 |
| JP | 61-141616 | 6/1986 |
| JP | 3-254011 | 11/1991 |
| JP | 4-55555 | 2/1992 |
| JP | 5-37161 | 2/1993 |
| JP | 5-128912 | 5/1993 |
| JP | 5-160334 | 6/1993 |
| JP | 6-84407 | 3/1994 |
| JP | 6-287018 | 10/1994 |
| JP | 7-45948 | 2/1995 |
| JP | 7-94855 | 4/1995 |
| JP | 7-268163 | 10/1995 |
| JP | 8-41247 | 2/1996 |
| JP | 9-208865 | 8/1997 |
| JP | 9-235495 | 9/1997 |
| JP | 10-60280 | 3/1998 |
| JP | 11-49951 | 2/1999 |
| JP | 11-60947 | 3/1999 |

| JP | 2000-235933 | | 8/2000 |
| JP | 2002-121079 | * | 4/2002 |
| WO | WO 97/15934 | | 5/1997 |
| WO | WO 99/67189 | * | 12/1999 |

OTHER PUBLICATIONS

Patent Abstracts of Japan, JP 09-012742, Jan. 14, 1997.
Jaromir Kosar: "Light-sensitive systems: chemistry and application of nonsilver halide photographic processes" Wiley Series on Photographic Science and Technology and the Graphic Arts, pp. 338-353 John Wiley & Sons, Inc., New York 1965.
W.S. Deforest: "Photoresist" McGraw-Hill, Inc., New York, pp. 48-55 1975.

* cited by examiner

*Primary Examiner*—Mark Kopec
(74) *Attorney, Agent, or Firm*—Oblon, Spivak, McClelland, Maier & Neustadt, P.C.

(57) ABSTRACT

The dielectric-forming composition according to the invention is characterized by consisting of:
  composite particles for dielectrics in which part or all of the surfaces of inorganic particles with permittivity of 30 or greater are coated with a conductive metal or a compound thereof, or a conductive organic compound or a conductive inorganic material; and
  (B) a resin component constituted of at least one of a polymerizable compound and a polymer.

In addition, another dielectric-forming composition according to the invention is characterized by containing:
  ultrafine particle-resin composite particles composed of (J) inorganic ultrafine particles with the average particle size of 0.1 μm or smaller, and (B) a resin component constituted of at least one of a polymerizable compound and a polymer, wherein part or all of the surfaces of the inorganic ultrafine particles (J) are coated with the resin component (B), and the ultrafine particle-resin composite particles contain 20% by weight or more of the inorganic ultrafine particles (J); and
  inorganic particles with the average particle size of 0.1 to 2 μm and permittivity of 30 or greater, or inorganic composite particles in which a conductive metal or a compound thereof, or a conductive organic compound or a conductive inorganic material is deposited on the part or all of the surfaces of the inorganic particles.

17 Claims, 8 Drawing Sheets

COMPOSITE PARTICLE FOR DIELECTRICS, ULTRAMICROPARTICULATE COMPOSITE RESIN PARTICLE, COMPOSITION FOR FORMING DIELECTRICS AND USE THEREOF

TECHNICAL FIELD

The present invention relates to composite particles for dielectrics, a dielectric-forming composition containing these composite particles for dielectrics, aqueous dispersions for electrodeposition containing this composition, a photosensitive transfer film and dielectric formed of the above described composition and aqueous dispersions for electrodeposition, a dielectrics with a conductive foil (this dielectric formed on the conductive foil), and an electronic part, multilayer circuit board and wiring board comprising this dielectric.

Also, the present invention relates to ultrafine particle-resin composite particles, a dielectric-forming composition containing these ultrafine particle-resin composite particles, aqueous dispersions for electrodeposition containing this composition, a dielectric formed of the above described composition and aqueous dispersions for electrodeposition, a dielectric with a conductive foil (this dielectric formed on the conductive foil), and an electronic part, multilayer circuit board and wiring board comprising this dielectric.

BACKGROUND ART

In recent years, techniques in which a layer having high permittivity is formed on a composite printed-wiring board or the like, and this layer is used in a condenser or the like have been known. This layer having high permittivity is prepared by, for example, methods in which a fibrous reinforcement such as glass fibers is impregnated with an organic solvent solution comprising a thermosetting resin with inorganic powders of high permittivity added in the solution, in order to offset brittleness of the thermosetting resin, and the solvent is removed by baking to cure the resin, and so on. In the conventional methods, however, it has usually been difficult to obtain a layer having high permittivity such as 30 or greater or 50 or greater.

In addition, attempts have been made to obtain dielectric layers of high permittivity using various kinds of inorganic powders. For example, it is known that a dielectric layer of high permittivity could be obtained by addition of $Fe_3O_4$, ZnO+ carbon or the like as inorganic powders to polystyrene. However, this system has a disadvantage that even though the permittivity can be increased, the dielectric loss tangent of the resulting dielectric layer increases, and therefore the amount of heat generated in the dielectric layer in the alternating current electric field increases, which may cause degradation of the multilayer printed-wiring board with a dielectric film provided thereon and the like, and failures such as destruction of joints due to thermal stress, leading to situations in which reliability and endurance of the semiconductor board are likely compromised.

In addition, for example, a composite material of high permittivity containing metal-coated powders of high permittivity and non metal-coated powders of high permittivity is described in Japanese Patent Laid-Open No. 6-84407, but when a composite material with permittivity of 30 or greater is to be obtained, for example, by the method described in the aforementioned publication, the dielectric loss tangent is worsened, thus making it difficult to obtain a composite material having high permittivity and small dielectric loss tangent.

On the other hand, usually, the method is well known in which inorganic powders of high permittivity are baked at a high temperature to form a dielectric layer in order to obtain high permittivity. However, there is a disadvantage that this method cannot be applied in the case where the dielectric layer is formed in a situation in which electronic parts are mounted on the wiring board, and thus is incapable of being applied commonly to processes for producing various kinds of semiconductor boards, because baking at a temperature as high as, for example, 1000° C. is required (the problem described hitherto is referred to as "Disadvantage 1").

Therefore, it has been desired that a dielectric layer of high permittivity with reduced heat loss is provided by low-temperature baking, and that inorganic particles and a composition capable of providing such a dielectric layer are produced (Problem 1).

In addition, screen printing and the like are known as methods of forming the dielectric layer, but they have a disadvantage that as the board is upsized and fineness of wiring is enhanced, requirement for accuracy of positions of patterns becomes so vigorous that it cannot be satisfied by usual printing (Disadvantage 2).

Therefore, for coping with Disadvantage 2 in addition to Disadvantage 1, it has been desired that a dielectric layer of high permittivity with reduced heat loss is provided by low-temperature baking, and that a dielectric-forming composition capable of forming patterns of higher dimensional accuracy is produced (Problem 2).

On the other hand, in recent years, low permittivity and low dielectric loss tangent have been required as properties of materials for package boards in association with increased frequencies of signals, and therefore the mainstream of materials for package boards has been changed from ceramics to resins. Under such a background, techniques relating to printed-wiring boards using resin substrates include, for example, a technique disclosed in Japanese Patent Publication No. 4-55555. In this publication, a method is proposed in which an interlayer resin insulation layer is formed on a glass epoxy board with an inner conductive circuit formed thereon using epoxy acrylate, and subsequently openings for formation of via holes are formed by photolithography method, its surface is subjected to roughness treatment, and a plating resist is provided thereon, then an outer conductive circuit and via holes are formed by plating treatment.

For the interlayer resin insulation layer composed of a resin such as epoxy acrylate, however, in order to ensure adhesion to the conductive circuit as a conductor, its surface and the surface of the conductive circuit must be roughened. Therefore, there is a disadvantage that when high frequency signals are transmitted, they are transmitted through only the roughened surface area of the conductive circuit due to the skin effect, and a noise occurs in the signal due to irregularities of the surface. This disadvantage has been significant especially when the resin substrate having lower permittivity and lower dielectric loss tangent compared to the ceramic board is used.

In addition, the resin substrate has a disadvantage such that it tends to accumulate heat because its heat radiation is poor compared to the conductive board and ceramic board, and consequently the diffusion rate of copper ions constituting the conductive circuit is increased, thereby setting up a migration to cause rupture of the interlayer insulation. Then, for solving the problems described above, the technique is proposed in Japanese Patent Laid-Open No. 7-45948 and Japanese Patent Laid-Open No. 7-94865 in which a resin is coated and formed by spin coating or the like on one side of a board made of resin or the like, and a metal (chrome, nickel, titanium, etc.) capable of improving adhesion to the conductive patterns is provided on the resin layer.

However, in the situation in which it is strongly desired to further reduce the size of the printed-wiring board having the IC mounted thereon for downsizing the entire device such as a cellular phone equipped with the printed-wiring board, the area on which electronic parts such as a resister and condenser other than IC chips is reduced, thus making it increasingly difficult to implement those electronic parts on the printed-wiring board.

Therefore, it has been required that a multilayer circuit board having a condenser funcation in a buildup wiring layer (Problem 3) should be provided.

In addition, a wiring board provided thereon with a plurality of layers including a signal layer, a power layer, a grounding layer and the like via an electrical insulation layer is used in the semiconductor device. Recently, even the semiconductor device containing plastic moldings has come to deal with extremely high-speed signals, and therefore the electric properties of the semiconductor device dealing with such high-speed signals have become controversial. That is, in the semiconductor device, for example, fluctuations of signals in switching affect the power supply line to cause fluctuations in voltage of the power supply, and fluctuations on the power supply side affect the grounding side, and these actions become significant as the speed of the signal is increased.

In the case of a single-layer wiring board, it is known that for the power potential and the grounding potential when the signal goes into switching, the power potential is significantly fluctuated due to ON-OFF of the switching signal. As a method for curbing such fluctuations in voltage, it is known that a decoupling condenser for curbing fluctuations by increasing an electric capacitance between the power supply line and the grounding line at a position close to the semiconductor chip to absorb fluctuations in potential by the electric capacitance.

However, in connection with this conventional wiring board, it is possible to cope with a rise in speed of the signal transmitted and the growth of power noises associated with high-density mounting by enlarging the width of the signal layer and increasing the number of mounted bypass condensers in making a design of wirings, but coping with them in this way results in a problem in which high-density mounting of electronic circuit components on the wiring board cannot be achieved. Furthermore, wiring board of low permittivity such as fluorine resin substrates have come to be applied for enhancement of signal speed. For these wiring boards, however, the same material is applied to the power supply system as well, the bypass condenser had to be used to cope with the power noise. In addition, techniques in which the wiring board is coated with a material of high permittivity are disclosed in Japanese Patent Laid-Open No. 5-37161 and Japanese Patent Laid-Open No. 5-160334, but the techniques have a disadvantage that a sufficient condenser capacity cannot be obtained if the area of the wiring board is reduced (Problem 4).

The present invention is to solve such problems associated with the prior art, and has the following objects.

The present invention is to solve the problem associated with the prior art as described above (Problem 1), and aims to provide inorganic particles and a dielectric-forming composition capable of forming dielectric layers of high permittivity with reduced heat loss and capable of being baked at a low temperature, and a film of high permittivity formed of this composition, and an electronic part comprising this film of high permittivity (Invention 1).

Also, the present invention is to solve the problem associated with the prior art as described above (Problem 1), and aims to provide dielectric layers with conductive foils of high permittivity with reduced heat loss and capable of being baked at a low temperature. In addition, the invention aims to provide condensers comprising such dielectric layers with conductive foils (Invention 2).

In addition, the present invention is to solve the problem associated with the prior art as described above (Problem 2), and aims to provide a dielectric-forming composition capable of forming in good dimensional accuracy a dielectric layer of high permittivity with reduced heat loss and capable of being baked at a low temperature, a photosensitive transfer film, and a dielectric and an electronic part formed of this composition (Inventions 3, 4).

The present invention is to solve the problem associated with the prior art as described above (Problem 1), and has as its object provision of ultrafine particle-resin composite particles capable of forming a dielectric layer of high permittivity with reduced heat loss and capable of being fired at a low temperature, a dielectric-forming composition, a dielectric with conductive foils formed of this composition, and an electronic part comprising this dielectric (Invention 5).

The present invention has been made to solve the above described problem with the prior art (Problem 3), and aims to provide a multilayer circuit board having a condenser function in a buildup wiring layer, and to provide a method allowing this multilayer circuit board to be produced advantageously (Invention 6).

The present invention has been made to solve the above described problem with the prior art (Problem 4), and has as its object provision of a wiring board having at least a signal layer, a power layer, a grounding layer and an insulation layer, wherein the wiring board contains a condenser having a large capacitance with a dielectric layer provided between the above described power layer and grounding layer (Invention 7).

DISCLOSURE OF INVENTION

The inventors have made vigorous studies to solve the above described Problem 1, and found that a dielectric capable of being baked at a low temperature of 500° C. or lower and having high permittivity and small dielectric loss tangent can be formed, by using a dielectric-forming composition constituted of particles coated with a conductive metal or an organic compound in part or all the surfaces, and a resin component leading to completion of the present invention (Invention 1).

In addition, the inventors have also found that the above described composite particles for dielectrics have specific sizes and permittivity, and a dielectric layer with a conductive foil having provided on the conductive foil a dielectric layer using a dielectric-forming composition containing the composite particles for dielectrics and the above described resin component at a given ratio is laminated onto a conductive substrate at a low temperature of 300° C. or lower, whereby a condenser with a dielectric of high permittivity and small dielectric loss tangent situated between electrodes can be formed, and resulted in leading to completion of the present invention (Invention 2).

In addition, the inventors have made vigorous studies to solve the above described Problem 2, and found that a dielectric capable of being baked at a low temperature of 500° C. or lower, having high permittivity and small dielectric loss tangent, and having a pattern of higher dimensional accuracy can be formed by using a dielectric-forming composition having a specific resin as the resin component in Invention 1, leading to completion of the present invention (Invention 3).

In addition, the inventors have found that such a dielectric-forming composition is suitable for the photosensitive transfer film, leading to completion of the present invention (Invention 4).

In addition, as a result of making vigorous studies to solve the above Problem 1, the inventors have found that by using a dielectric-forming composition containing (i) ultrafine particle-resin composite particles constituted of inorganic ultrafine particles of specific sizes and a specific resin component, and (ii) inorganic particles or inorganic composite particles with a conductive metal in which an organic compound or the like is deposited on part or all of the surfaces of the inorganic particles, a dielectric capable of being baked at a low temperature of 500° C. or lower, and having high permittivity and small dielectric loss tangent can be formed, leading to completion of the present invention (Invention 5).

In addition, the inventors have made vigorous studies to solve the above described Problem 3, and found that the dielectric using the dielectric-forming composition according to the above described Inventions 1 to 5 is suitable for the multilayer circuit board having a condenser function in the buildup wiring layer, leading to completion of the present invention (Invention 6).

In addition, the inventors have made vigorous studies to solve the above described Problem 4, and found that the dielectric using the dielectric-forming composition according to the above described Inventions 1 to 5 is suitable for the wiring board having at least a signal layer, a power layer, a grounding layer and an insulation layer, leading to completion of the present invention (Invention 7).

Specifically, the present invention is as follows.

The composite particles for dielectrics of the present invention are characterized in that (A) part or all of the surfaces of inorganic particles with permittivity of 30 or greater are coated with a conductive metal or a compound thereof, or a conductive organic compound or a conductive inorganic material.

The above described inorganic particles are preferably constituted of a titanium based metal oxide.

Preferably, the average size of the above described composite particles for dielectrics is 0.1 to 5 µm, and the amount of deposit of the above described conductive metal or compound thereof, or conductive organic compound or conductive inorganic material is 1 to 40% by weight, and the specific surface area thereof is 1 to 20 m$^2$/g.

The dielectric-forming composition according to the present invention is characterized by consisting of:

(A) composite particles for dielectrics in which part or all of the surfaces of inorganic particles with permittivity of 30 or greater are coated with a conductive metal or a compound thereof, or a conductive organic compound or a conductive inorganic material; and (B) a resin component constituted of at least one of a polymerizable compound and a polymer.

The above described dielectric-forming composition is capable of forming a dielectric with permittivity of 30 or greater and dielectric loss tangent of 0.1 or smaller when heated at a temperature of 500° C. or lower.

The above described inorganic particles are preferably constituted of a titanium based metal oxide.

Preferably, the average size of the above described composite particles for dielectrics is 0.1 to 5 µm, and the amount of deposit of the conductive metal or compound thereof, or conductive organic compound or conductive inorganic material is 1 to 40% by weight, and the specific surface area thereof is 1 to 20 m$^2$/g; and the volume ratio of the above described composite particles for dielectrics (A) to the above described resin component (B) constituted of at least one of a polymerizable compound and a polymer (volume of the composite particles for dielectrics/volume of the resin component constituted of at least one of a polymerizable compound and a polymer (A/B)) is 40/60 to 80/20.

The aqueous dispersions for electrodeposition according to the present invention are characterized by being capable of forming a dielectric with permittivity of 30 or greater and dielectric loss tangent of 0.1 or smaller when heated at a temperature of 500° C. or lower, and consisting of:

(A) composite particles for dielectrics in which part or all of the surfaces of inorganic particles with permittivity of 30 or greater are coated with a conductive metal or a compound thereof, or a conductive organic compound or a conductive inorganic material; and (B) a resin component constituted of at least one of a polymerizable compound and a polymer. In this case, the above described resin component (B) constituted of at least one of a polymerizable compound and a polymer is preferably organic particles capable of being electro-deposited.

Another dielectric-forming composition according to the present invention is such that the above described resin component (B) is preferably composed of:

(C) an alkali soluble resin;

(D) a compound containing an ethylene based unsaturated group; and (E) a photopolymerization initiator.

In addition, for another dielectric-forming composition of the present invention, it is preferable that the average size of the above described composite particles for dielectrics (A) is 0.1 to 2 µm, and the above described resin component (B) constituted of at least one of a polymerizable compound and a polymer is composed of:

(F) a resin capable of undergoing alkali development; and (G) a photosensitive acid producing compound.

In addition, for the dielectric-forming composition of the present invention, the above described resin component (B) may be composed of:

(H) at least one compound selected from the group consisting of hydrolyzable silane compounds expressed by the general formula [1] described below, hydrolysates thereof and condensates thereof.

$$(R^1)_p Si(X)_{4-P} \quad [1]$$

(In the above general formula [1], $R^1$ represents a non-hydrolyzable organic group having 1 to 12 carbon atoms. In addition, X represents a hydrolyzable group, and p is an integer number of 0 to 3. Furthermore, if the coefficient [p] of the $R^1$ and the coefficient [4−p] of X described above are each equal to or greater than 2, the groups represented by $R^1$ and the groups represented by X, respectively, may or may not be the same.).

In addition, for the dielectric-forming composition of the present invention, the above described resin component (B) may be composed of:

(H) at least one compound selected from the group consisting of hydrolyzable silane compounds expressed by the general formula [1] described below, hydrolysates thereof and condensates thereof; and (I) a photo acid generator.

$(R^1)_p Si(X)_{4-p}$        [1]

(In the above general formula [1], $R^1$ represents a non-hydrolyzable organic group having 1 to 12 carbon atoms. In addition, X represents a hydrolyzable group, and p is an integer number of 0 to 3. Furthermore, if the coefficient [p] of the $R^1$ and the coefficient [4−p] of X described above are each equal to or greater than 2, the groups represented by $R^1$ and the groups represented by X, respectively, may or may not be the same.).

The ultrafine particle-resin composite particles according to the present invention are (J) inorganic ultrafine particles with the average particle size of 0.1 μm or smaller, and (B) a resin component constituted of at least one of a polymerizable compound and a polymer, wherein part or all of the surfaces of the above described inorganic ultrafine particles (J) are coated with the above described resin component (B), and the above described inorganic ultrafine particles (J) are contained in the amount of 20% by weight or greater.

The above described inorganic ultrafine particles (J) are preferably constituted of a titan based metal oxide.

Another dielectric-forming composition according to the present invention is characterized by containing the above described ultrafine particle-resin composite particles, and inorganic particles with the average particle size of 0.1 to 2 μm and the permittivity of 30 or greater, or inorganic composite particles in which a conductive metal or a compound thereof, or a conductive organic compound or a conductive inorganic material is deposited on part or all of the surfaces of the inorganic particles.

The dielectric forming electrodeposition solution according to the present invention is characterized by having dispersed in a dispersion medium ultrafine particle-resin composite particles, and inorganic particles with the average particle size of 0.1 to 2 μm and the permittivity of 30 or greater, or inorganic composite particles in which a conductive metal or a compound thereof, or a conductive organic compound or a conductive inorganic material is deposited on part or all of the surfaces of the inorganic particles.

The photosensitive transfer film according to the present invention is characterized by comprising with a substrate film and a photosensitive transfer layer formed on the substrate film, wherein the photosensitive transfer layer is constituted of the above described dielectric-forming composition and have a thickness of 5 to 100 μm.

The dielectric according to the present invention is formed using the above described dielectric-forming composition, the dielectric forming electrodeposition solution or the above described photosensitive transfer film.

The dielectric with a conductive foil according to the present invention is characterized in that the above described dielectric is formed on the conductive foil.

The dielectric layer with a conductive foil capable of being laminated according to the present invention is characterized by comprising (A) dielectric composite particles in which a conductive metal or a compound thereof, or a conductive organic compound or a conductive inorganic material is deposited on part of the surfaces of inorganic particles with the average particle size of 1μ or smaller and permittivity of 100 or greater, and (B) a resin constituted of at least one of a polymerizable compound and a polymer, wherein a dielectric layer with thickness of 1 to 20 μm and permittivity of 30 or greater is provided on the conductive foil, with the dielectric layer formed of a dielectric-forming composition containing:

70% by weight or more of (A); and

30% by weight or less of (B), when the total amount of the above described (A) and (B) is 100% by weight.

The electronic part according to the present invention is characterized by comprising the above described dielectric.

The multilayer circuit board according to the present invention is characterized by being a buildup multilayer circuit board in which conductor layers and interlayer resin insulation layers are laminated alternatingly on an insulation substrate, and the conductor layers are connected to each other by a via hole, wherein the above described dielectric layer is formed between the two conductor layers neighboring in the vertical direction.

The wiring board according to the present invention is characterized by being a wiring board having at least a signal layer, a power layer, a grounding layer and an insulation layer, wherein the above described dielectric layer is formed between the above described power layer and the above described grounding layer.

Figure 1:
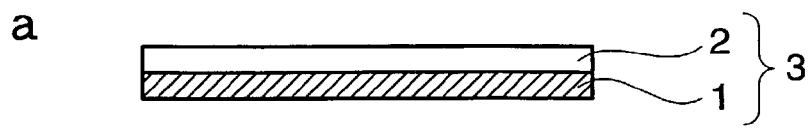
FIG. 1 is a schematic diagram of a method (1) of forming a condenser comprising a dielectric layer with a conductive foil of the present invention.
Figure 1:
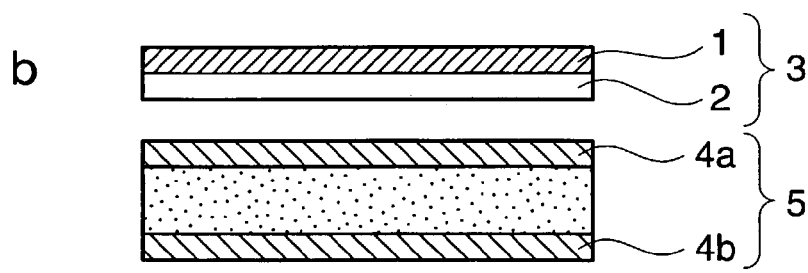
Figure 1:
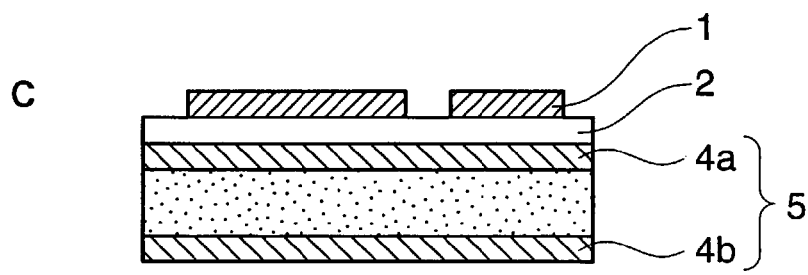
Figure 1:
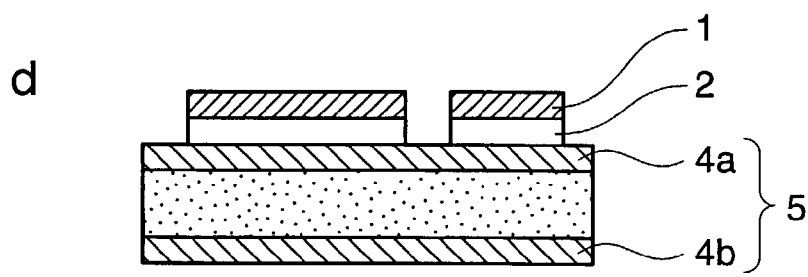
Figure 1:
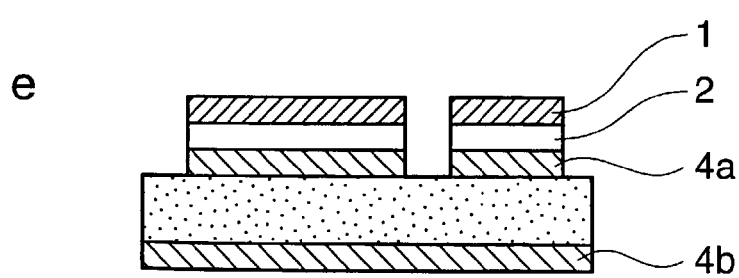
Figure 2:
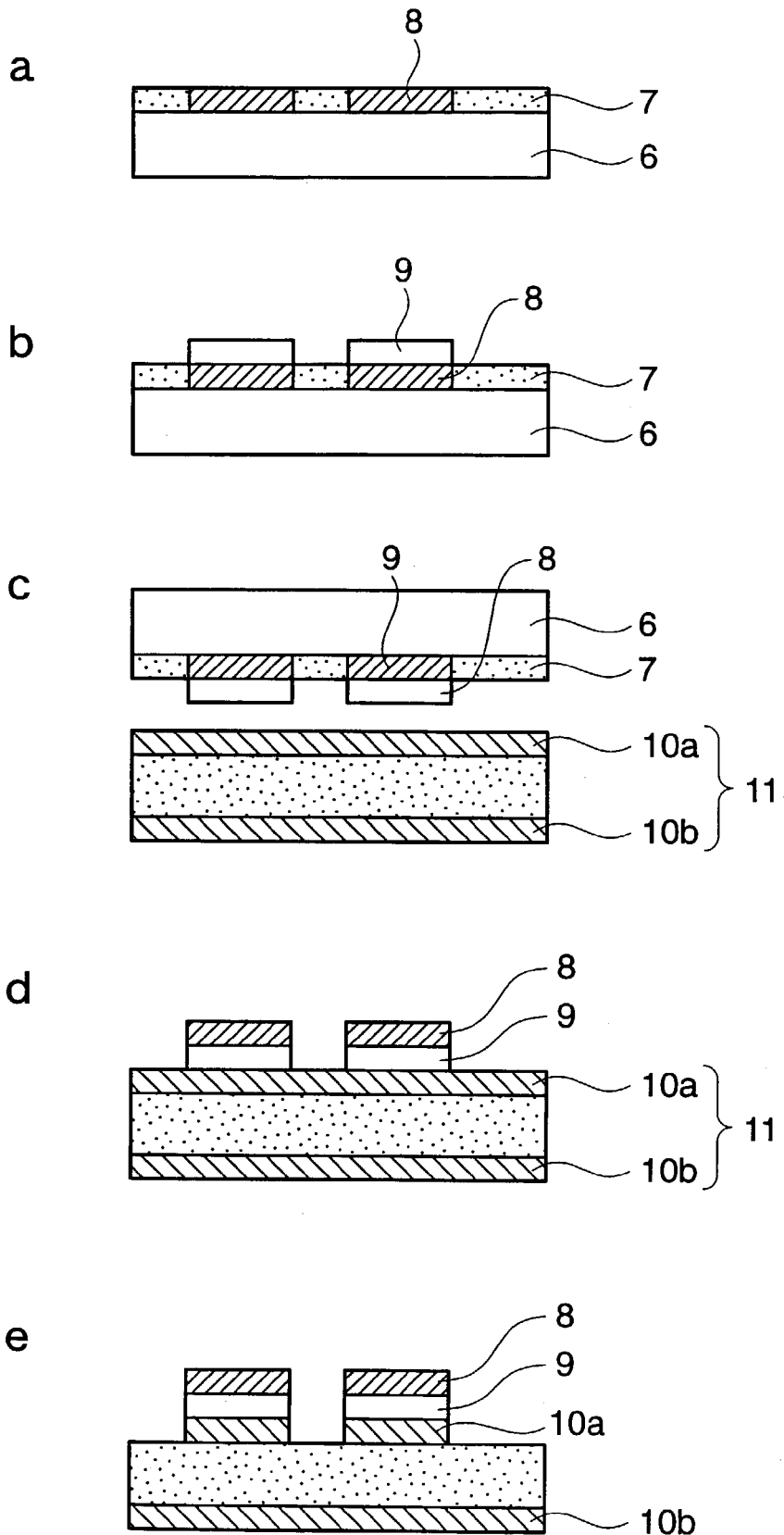
FIG. 2 is a schematic diagram of a method (2) of forming a condenser comprising a dielectric layer with a conductive foil of the present invention.

Furthermore, the symbols in FIGS. 1 and 2 denote the following items.

1 conductive foil
2 electro-deposited dielectric layer
3 dielectric layer with a conductive foil
4a upper conductive layer
4b lower conductive layer
5 conductive substrate
6 substrate
7 resist layer
8 plated conductive foil
9 electro-deposited dielectric layer
10a upper conductive layer
10b lower conductive layer
11 conductive substrate FIGS. 3A to 3F each show a part of the step of producing a multilayer circuit board according to the present invention.

FIGS. 4A to 4D each show a part of the step of producing the multilayer circuit board according to the present invention.

FIGS. 5A to 5D each show a part of the step of producing the multilayer circuit board according to the present invention.

Figure 3:
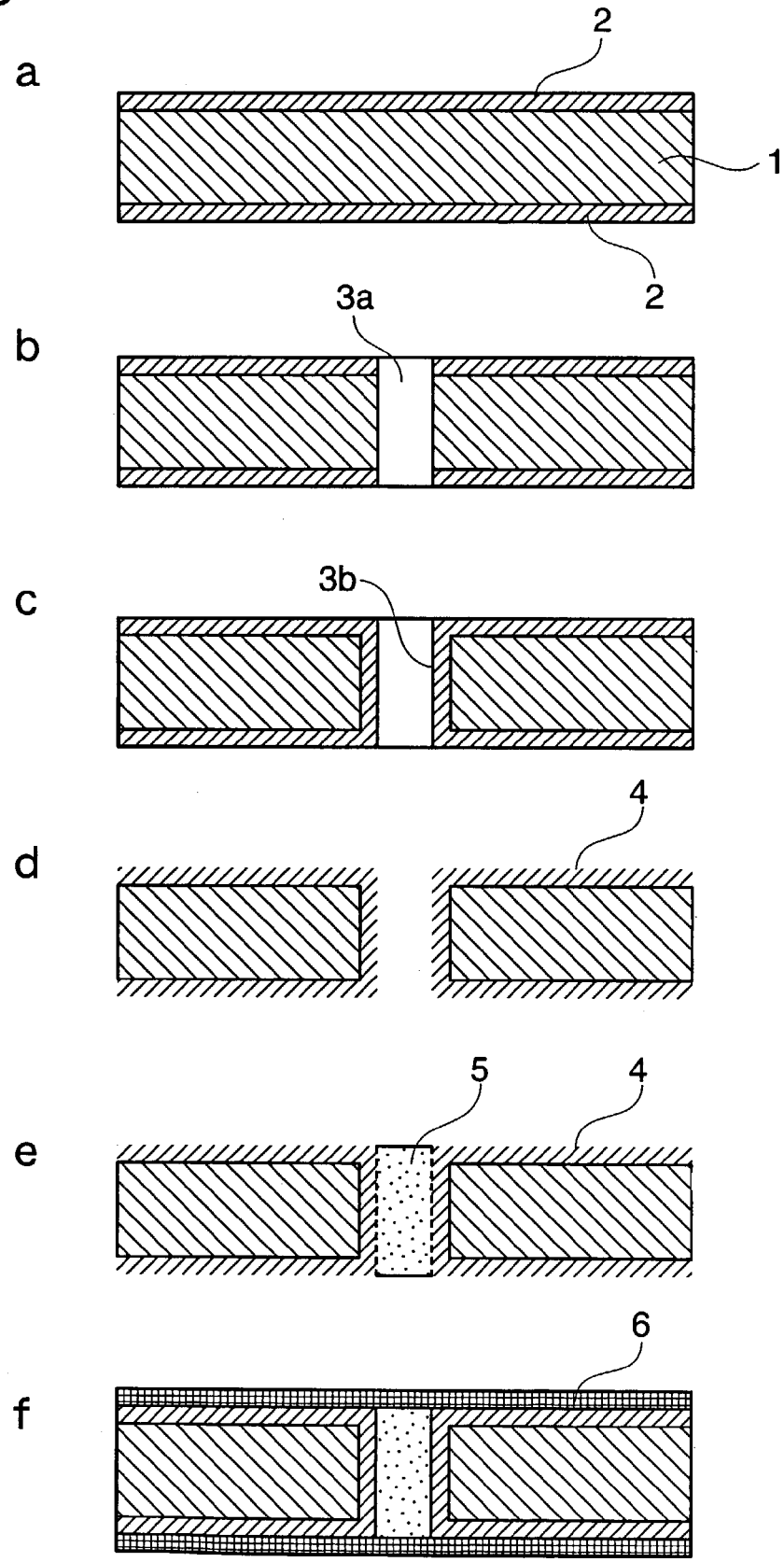
Figure 4:
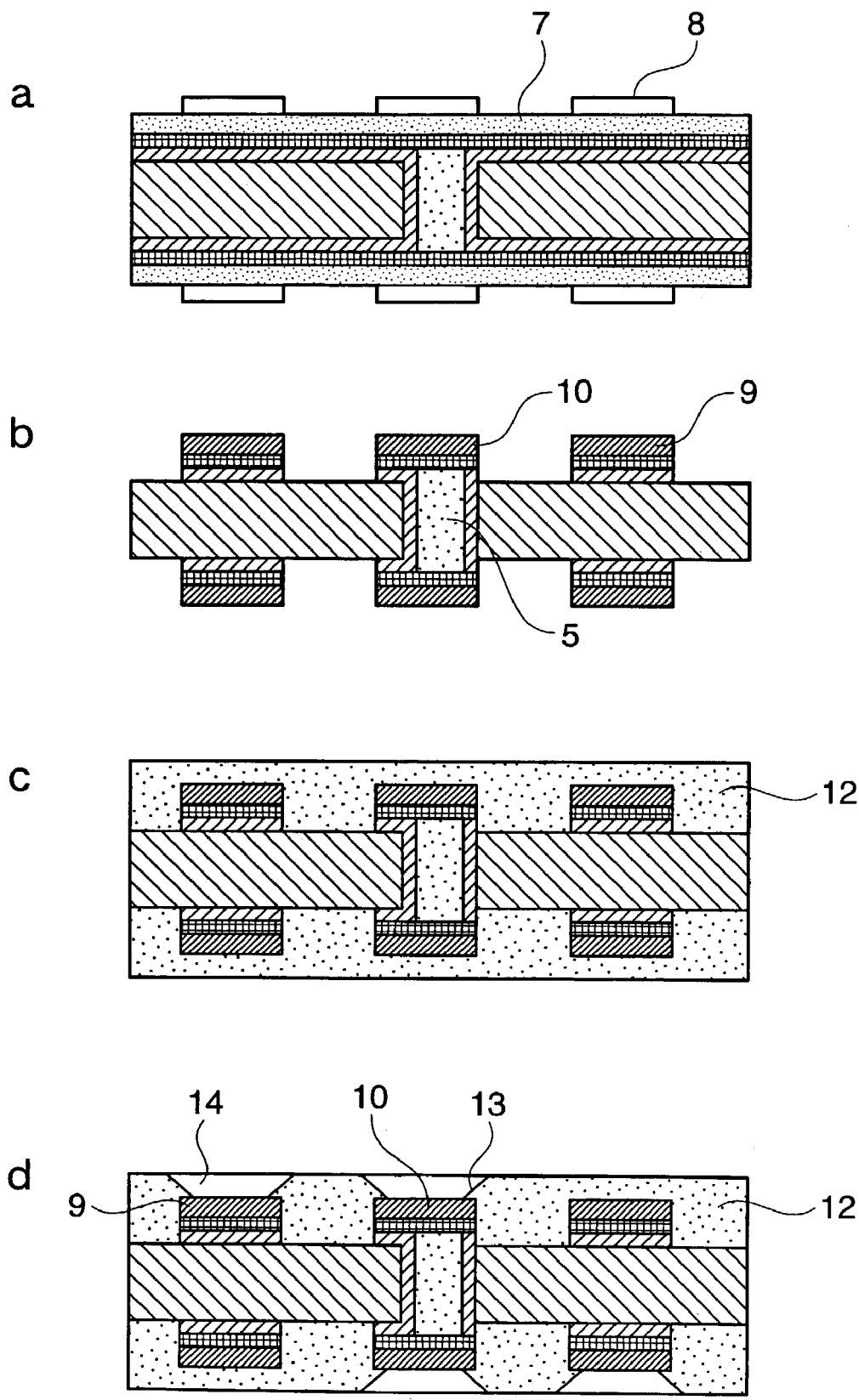
Figure 5:
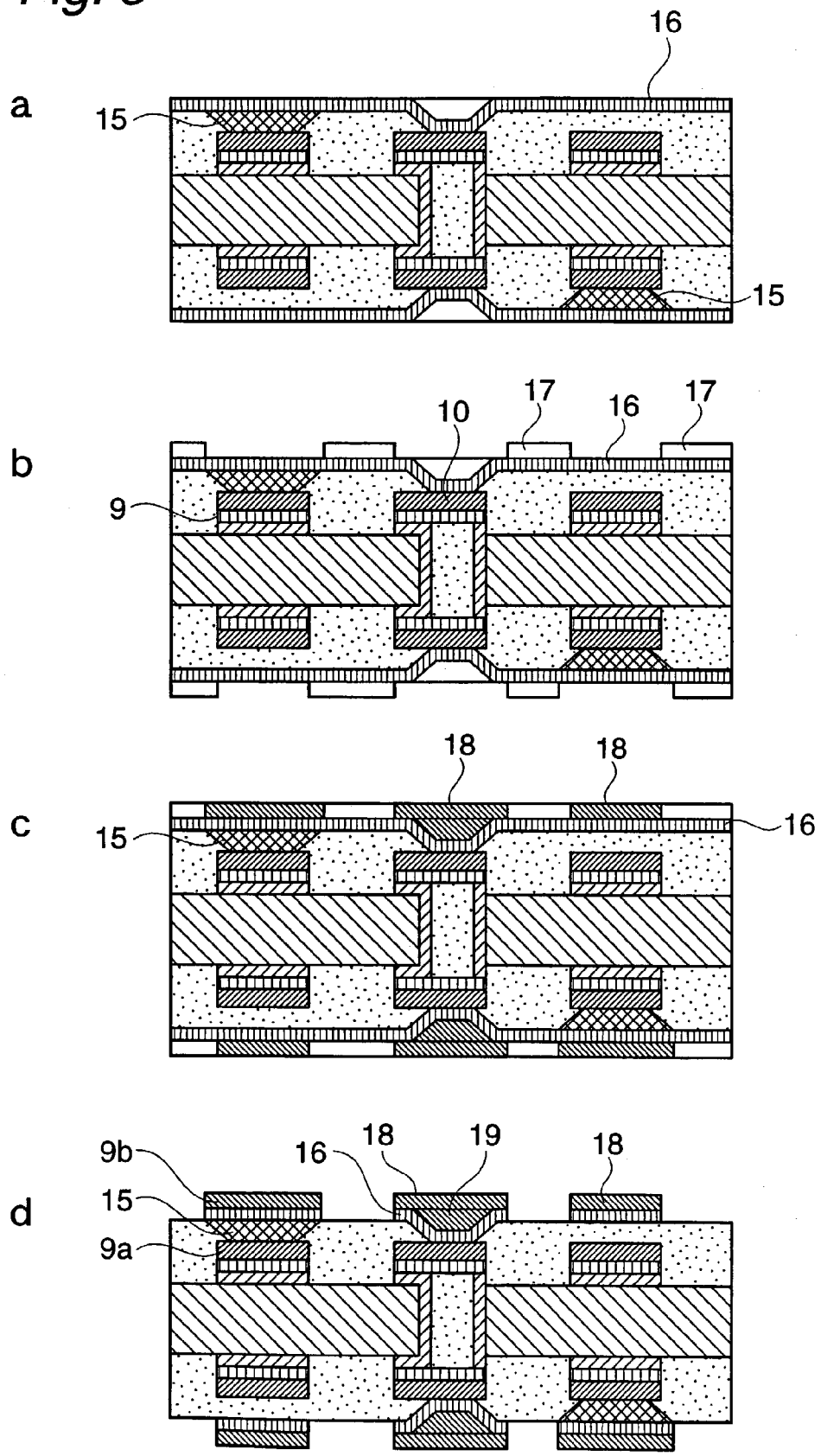

Furthermore, the symbols in FIGS. 3 to 5 denote the following items.

Figure 6:
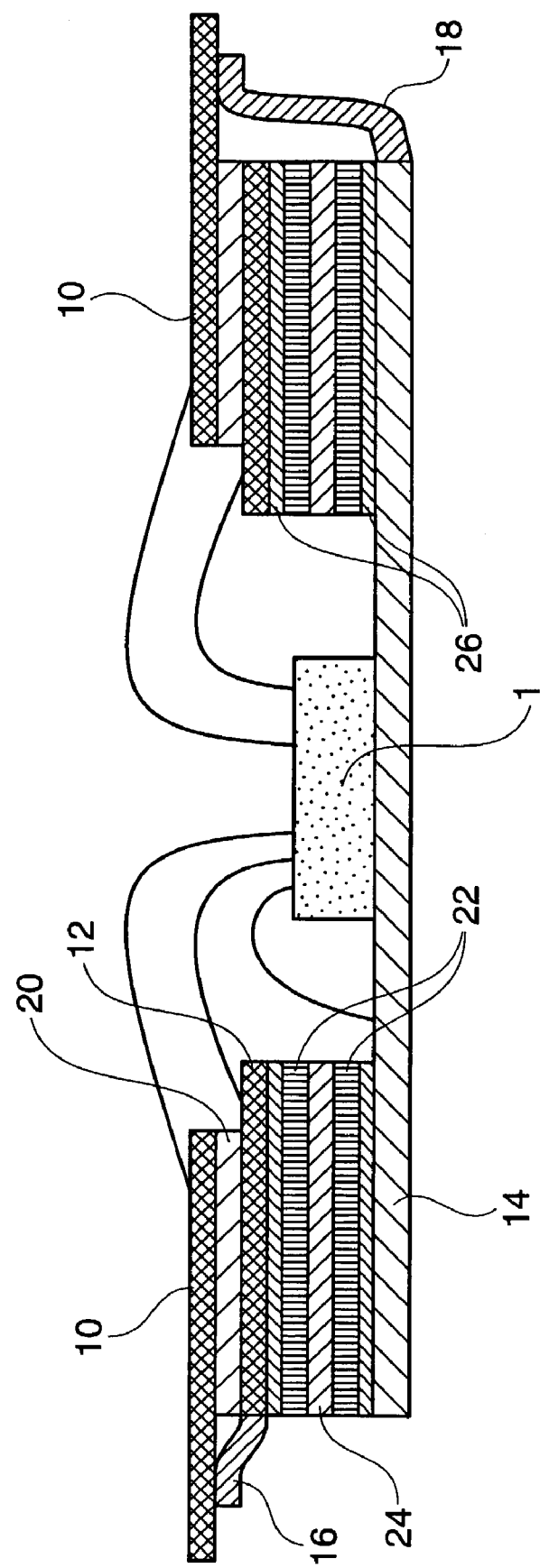

1 substrate
2 copper foil
3 through hole
4 roughened layer
5 conductive paste
6 nonelectrolytic copper plated film 7 electrolytic copper plating
8 etching resist
9 conductor circuit
10 conductor layer
12 interlayer resin insulation layer
13 opening for formation of a via hole
14 opening for formation of a dielectric layer
15 dielectric layer
16 copper sputtered layer
17 plating resist
18 electrolytic plated film
19 via hole FIG. 6 is an illustrative view showing an example of a configuration of a wiring board of the present invention.

Figure 7:
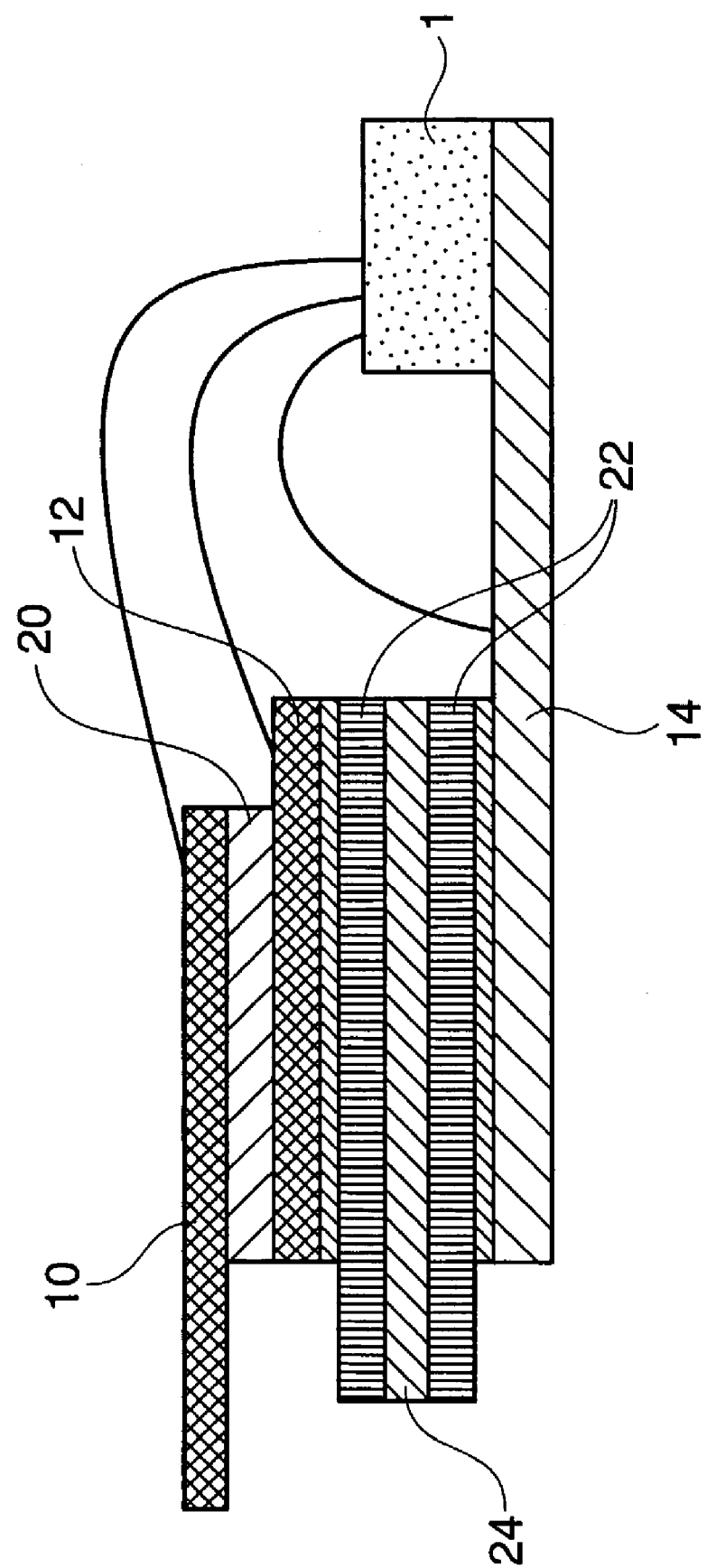

FIG. 7 is an illustrative view showing an example of a configuration of the wiring board of the present invention.

FIG. 8 is an illustrative view showing an example of a configuration of the wiring board of the present invention.

1 semiconductor
10 signal layer
12 power layer
14 grounding layer
16, 18 connection piece
20 electric insulation layer
22 conductor foil
24 dielectric
26 joint layer
30 conductive bonding

BEST MODE FOR CARRYING OUT THE INVENTION

Inventions 1 to 4 and 6 and 7 relate to a composition composed of specific dielectric-forming composite particles and a specific resin component, and the composition is specifically composed of:

(A) composite particles for dielectrics in which part or all of the surfaces of inorganic particles with permittivity of 30 or greater are coated with a conductive metal or a compound thereof, or a conductive organic compound or a conductive inorganic material; and (B) a resin component constituted of at least one of a polymerizable compound or a polymer.

In addition, the Inventions 5 to 7 relate to a composition composed of specific ultrafine particle-resin composite particles and dielectric forming composite particles, and the composition specifically contains ultrafine particle-resin composite particles composed of:

(J) inorganic ultrafine particles with the average particle size of 0.1 μm or smaller; and (B) a resin component, wherein part or all of the surfaces of the above described inorganic ultrafine particles (J) are coated with the above described resin component (B), and the above described inorganic ultrafine particles (J) are contained in the amount of 20% by weight or greater, and inorganic particles with the average particle size of 0.1 to 2 μm and the permittivity of 30 or greater, or inorganic composite particles (composite particles for dielectrics) in which a conductive metal or a compound thereof, or a conductive organic compound or a conductive inorganic material is deposited on part or all of the surfaces of the inorganic particles.

That is, the dielectric-forming composition according to Invention 1 is composed of (A) composite particles for dielectrics in which part or all of the surfaces of inorganic particles with permittivity of 30 or greater are coated with a conductive metal or a compound thereof, or a conductive organic compound or a conductive inorganic material, and (B) a resin component constituted of at least one of a polymerizable compound or a polymer. In addition, a dielectric with permittivity of 30 or greater and a dielectric loss tangent of 0.1 or smaller can be formed by being heated at 500° C. or lower.

The dielectric layer with a conductive foil capable of being laminated according to Invention 2, in which the dielectric-forming composition according to Invention 1 containing composite particles for dielectrics having specific particle sizes and so on is used, comprises (A) composite particles for dielectrics in which a conductive metal or a compound thereof, or a conductive organic compound or a conductive inorganic material is deposited on part of the surfaces of inorganic particles with the average particle size of 1 μm or smaller and permittivity of 100 or greater, and (B) a resin constituted of at least one of a polymerizable compound and a polymer, wherein a dielectric layer with thickness of 1 to 20 μm and permittivity of 30 or greater is provided on the conductive foil, with the dielectric layer formed of a dielectric-forming composition containing:

70% by weight or more of (A); and

30% by weight or less of (B), when the total amount of the above described (A) and (B) is 100% by weight.

Also, inorganic particles with the average particle size of 1 μm or smaller and permittivity of 100 or greater may be used in place of the above described composite particles for dielectrics.

The dielectric-forming composition according to Invention 3 is such that the resin component (B) constituted of at least one of a polymerizable compound and a polymer in the above described Invention 1 is composed of:

(C) an alkali soluble resin;

(D) a compound containing an ethylene based unsaturated group; and (E) a photopolymerization initiator (Invention 3-1).

In addition, another dielectric-forming composition according to Invention 3 is such that the average size of the composite particles for dielectrics (A) is 0.1 to 2 μm in the above described Invention 1, and the above described resin component (B) constituted of at least one of a polymerizable compound (hereinafter, resin component (B)) and a polymer is composed of:

(F) a resin capable of undergoing alkali development; and (G) a photosensitive acid producing compound (Invention 3-2).

In addition, another dielectric-forming composition according to Invention 3 is such that the resin component (B) in the above described Invention 1 is composed of:

(H) at least one compound selected from the group consisting of hydrolyzable silane compounds expressed by the general formula [1] described below, hydrolysates thereof and condensates thereof.

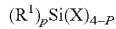  [1]

(In the above general formula [1], $R^1$ represents a non-hydrolyzable organic group having 1 to 12 carbon atoms. In addition, X represents a hydrolyzable group, and p is an integer number of 0 to 3. Furthermore, if the coefficient [p] of the $R^1$ and the coefficient [4−p] of X described above are each equal to or greater than 2, the groups represented by $R^1$ and the groups represented by X, respectively, may or may not be the same.).

In addition, another dielectric-forming composition according to Invention 3 is such that the resin component (B) in the above described Invention 1 is composed of:

(H) at least one compound selected from the group consisting of hydrolyzable silane compounds expressed by the general formula [1] described below, hydrolysates thereof and condensates thereof; and (I) a photo acid generator.

$$(R^1)_p Si(X)_{4-p} \quad [1]$$

(In the above general formula [1], $R^1$ represents a non-hydrolyzable organic group having 1 to 12 carbon atoms. In addition, X represents a hydrolyzable group, and p is an integer number of 0 to 3. Furthermore, if the coefficient [p] of the $R^1$ and the coefficient [4−p] of X described above are each equal to or greater than 2, the groups represented by $R^1$ and the groups represented by X, respectively, may or may not be the same.) (Invention 3-3).

The photosensitive transfer film according to Invention 4 is composed of a substrate film and a photosensitive transfer layer formed on the substrate film, wherein the photosensitive transfer layer is constituted of the above described dielectric-forming composition and have a thickness of 5 to 100 μm.

The dielectric-forming composition according to Invention 5 contains ultrafine particle-resin composite particles composed of:

(J) inorganic ultrafine particles with the average particle size of 0.1 μm or smaller; and (B) a resin component constituted of at least one of a polymerizable compound and a polymer, wherein part or all of the surfaces of the above described inorganic ultrafine particles (J) are coated with the above described resin component (B), and the above described inorganic ultrafine particles (J) are contained in the amount of 20% by weight or greater, and inorganic particles with the average particle size of 0.1 to 2 μm and the permittivity of 30 or greater, or inorganic composite particles in which a conductive metal or a compound thereof, or a conductive organic compound or a conductive inorganic material is deposited on part or all of the surfaces of the inorganic particles.

The multilayer circuit board according to Invention 6 is such that in a buildup multilayer circuit board in which conductor layers and interlayer resin insulation layers are deposited alternatingly on an insulation substrate, and the conductor layers are connected to each other by a via hole, the dielectric layer formed using the dielectric-forming composition according to the above described Invention I or II is provided between the two conductor layers neighboring in the vertical direction.

The wiring board according to Invention 7 is such that in a wiring board having at least a signal layer, a power layer, a grounding layer and an insulation layer, the above described dielectric layer formed using the dielectric-forming composition of the present invention is provided between the above described power layer and the above described grounding layer.

Invention I (Inventions 1 to 4 and 6 and 7) and Invention II (Inventions 5 to 7) will be described in detail separately below.

Invention I

Composite Particles for Dielectrics (A)

Inorganic Particles

Inorganic particles for use in Inventions 1 to 4 and 6 and 7 have permittivity of 30 or greater, preferably 50 or greater, further preferably 70 or greater. Even greater permittivity is acceptable, and the upper limit thereof is not specified, and for example, permittivity of about 30000 may be accepted.

If the permittivity of the above described "inorganic particles" is lower than 30, the permittivity of the formed dielectric may unpreferably decrease. Also, greater permittivity is acceptable and the upper limit thereof is not specified, and if the permittivity is about 30000, the permittivity of the formed dielectric can be increased, which is preferable.

Furthermore, in the case of inorganic particles for use in forming the dielectric layer with a conductive foil capable of being laminated according to the above described Invention 2, the permittivity is 100 or greater, preferably 1000 or greater, further preferably 2000 or greater. Even greater permittivity is acceptable and the upper limit thereof is not specified, and permittivity of about 30000 may be accepted.

For these inorganic particles, those constituted of metal oxides are preferably used, and especially titanium based metal oxides are preferable. Here, the "titanium based metal oxide" means a compound containing titanium and oxygen as essential elements. For these titanium based metal oxides, titanium based single metal oxides containing titanium in a single form as a metal element constituting a crystal structure, and titanium based multiple oxides containing titanium and other metal elements as metal elements may be preferably used.

The above described titanium based single metal oxides include, for example, titanium dioxide based metal oxides. Such titanium dioxide based metal oxides include titanium dioxide based metal oxides of anatase or rutile structure.

The above described titanium based multiple oxides include, for example, barium titanate based, lead titanate based, strontium titanate based, bismuth titanate based, magnesium titanate based, neodium titanate based, and calcium titanate based metal oxides.

Furthermore, the above described "titanium dioxide based metal oxide" means a system containing only titanium dioxide or a system containing a small amount of additives in addition to titanium dioxide, which retains the crystal structure of titanium dioxide as a main component, and the same goes for metal oxides of other systems.

Also, the above described "titanium based multiple oxide" means an oxide produced from a combination of a titanium based single metal oxide and a metal oxide composed of at least one type of other metal elements, in which no oxoacid ion exists as a unit of structure.

In the present invention, for these titanium based metal oxides constituting inorganic particles, titanium dioxide based metal oxides of rutile structure are preferable in the case of titanium based single metal oxides, and barium titanate based metal oxides may be preferably used in the case of titanium based multiple oxides.

Of these, barium titanate based metal oxides may be particularly preferably used.

Also, for improving dispersibility in the aqueous medium, particles with the surfaces of the above described inorganic particles modified with silica, alumina or the like may be suitably used.

The average particle size of these inorganic particles is preferably 10 μm or smaller, more preferably 0.1 to 5.0 μm, further preferably 0.1 to 3.0 μm, further more preferably 0.1 to 2.0 μm, particularly preferably 0.1 to 1.0 μm in the case of Inventions 1, 2, 3 and 4. If the average particle size is larger than 10 μm, the composition of the dielectric layer may tend to lack in uniformity when the thickness is reduced. If the average particle size is smaller than 0.1 μm, cohesion among particles may become so strong that coarse particles are produced.

In Invention 3, in the case where the above described resin component (B) constituted of at least a polymerizable component and a polymer is composed of (F) resin capable of undergoing alkali development and (G) photosensitive acid producing compound, the average particle size of inorganic particles is preferably 0.1 to 2 μm, more preferably 0.1 to 1.0 μm.

The shapes of inorganic particles of the present invention are not particularly limited, but they include spheroidal shape, granular shape, tabular shape, flake shape, whisker shape, rod shape and filament shape. And of these shapes, speroidal shape, rod shape and filament shape are preferable. Inorganic particles of these shapes may be used alone or in combination of two or more types.

Furthermore, in the above described Invention 2, if inorganic particles are used with the above described resin component (B) constituted of at least one of a polymerizable compound and a polymer, these inorganic particles are desirably added to the dielectric-forming composition so that when the total amount of the inorganic particles and the resin component is 100% by weight, the content of the inorganic particles is preferably 70% by weight or larger, more preferably 75 to 95% by weight. If the content of the inorganic particles is smaller than 70% by weight in the dielectric-forming composition, the permittivity of the dielectric-forming composition may be significantly reduced due to relative relationship with the resin component (B), and if the content is larger than 95% by weight, the strength of the formed dielectric layer may be reduced.

Composite Particles for Dielectrics (A)

The composite particles for dielectrics for use in the present invention are such that part or all of the surfaces of the above described inorganic particles are coated with a conductive material. Such a conductive material is a conductive metal or a compound thereof, or a conductive organic compound or a conductive inorganic material. This conductive material can be used alone or in combination of two or more types thereof.

For the above described conductive metal, for example, at least one type of metal selected from gold, silver, copper, tin, platinum, palladium, ruthenium, Fe, Ni, Co, Ge, Si, Zn, Ti, Mg and Al may be used. For the metal, an alloy of these metals may be used.

For the above compound of the conductive metal, nitrides of the above described conductive metals may be used. Of these, titanium nitride may be particularly suitably used.

For the above conductive organic compound, at least one type of compound selected from TCNQ (7,7,8,8-tetracyanoquinodimethane), polypyrrole, polyaniline polythiophene and the like may be used.

For the above conductive inorganic material, at least one type of material selected from carbon, graphite and the like may be used.

The content of the above inorganic particles contained in the composite particles for dielectrics for use in the present invention is preferably 60 to 99% by weight, further preferably 65 to 95% by weight, particularly preferably 70 to 90% by weight, with respect to the total amount of the composite particles for dielectrics. Also, the content of the conductive metal or compound thereof, or the conductive organic compound or the conductive inorganic material, namely the amount of deposition of conductive material is preferably 1 to 40% by weight, further preferably 5 to 35% by weight, and particularly preferably 10 to 30% by weight.

If the content of inorganic particle component is larger than 99% by weight, it could be impossible to obtain high permittivity when a dielectric is produced from the particles. Also, if the content of inorganic particle component is smaller than 60% by weight, the insulation quality of the dielectric may be degraded.

For the average particle size of composite particles for dielectrics for use in the present invention, the upper limit is preferably 10 μm or smaller and the lower limit is preferably 0.02 μm or larger, further preferably 0.1 to 5.0 μm, more preferably 0.1 to 3.0 μm, further more preferably 0.1 to 2.0 μm, particularly preferably 0.1 to 1.0 μm, particularly more preferably 0.7 μm or smaller.

If the average particle size exceeds this range, the composition of the dielectric layer may tend to lack in uniformity when the thickness is reduced. Furthermore, the average particle size of composite particles for dielectrics is in particularly preferably 2 μm or smaller so that the composition of the dielectric layer is uniform even when the thickness is reduced.

Furthermore, in the above described Invention 3, if the above described resin component (B) constituted of at least one of a polymerizable compound and a polymer is composed of (F) resin capable of undergoing alkali development and (G) photosensitive acid producing compound (Invention 3-2), the average particle size of composite particles for dielectrics is preferably 0.1 to 2 μm, more preferably 0.1 to 1.0 μm.

The specific surface area of composite particles for dielectrics for use in the present invention is preferably 1 to 20 $m^2/g$, further preferably 1.2 to 15 $m^2/g$, more preferably 1.5 to 10 $m^2/g$, particularly preferably 1.5 to 8 $m^2/g$. If the specific surface area is within the above described range, a dielectric having high permittivity and low dielectric loss tangent can be obtained.

Such composite particles for dielectrics for use in the present invention can be prepared using a known method, and are not limited.

Such composite particles for dielectrics for use in the present invention can be prepared using a known method, and are not limited.

For example, in the case where the surfaces of inorganic particles are coated with a conductive metal by plating and the like, nonelectrolytic plating such as chemical plating may be applied.

Also, for example, the surfaces of inorganic particles may be coated with a conductive metal and organic compound in the alloy or composite form, by a known method such as the gas atomize method. In addition, for composite particles for dielectrics prepared by the gas atomize method, the concentration of the above described conductive component near the surfaces of particles can be increased to curb oxidation of the surfaces of particles using, for example, a known method of producing alloys.

Specifically, for example, composite particles for dielectrics composed of inorganic particles coated with 1 to 40% by weight of metal component (e.g. copper) are treated by a classifier to collect powders with the average grain size of 0.1 to 10 μm, and ultrasonic dispersion is carried out with the powders in purified water to make their surfaces hydrophilic sufficiently, followed by eluting only the Cu component on the surfaces in a bath containing 1 to 10% by volume of sulfuric acid, whereby composite particles for dielectrics can be obtained.

Also, for example, as a method for obtaining composite particles for dielectrics having the average particle size described above, specifically, powders with the average size of 0.1 to 10 μm are collected by a classifier from composite particles for dielectrics composed of inorganic particles with 1 to 40% by weight of metal component (e.g. silver) deposited thereon by nonelectrolytic plating or the like, and the powders are ultrasonic-dispersed and sufficiently dispersed in purified water, followed by eluting only the silver component on the surfaces in a bath containing 1 to 10% by volume of sulfuric acid, whereby composite particles for dielectrics with such an average particle size can be obtained.

Also, for example, even if the particles are fine or have flake shapes, composite particles containing a large amount of conductive component near the surfaces of composite particles for dielectrics can be produced.

For such composite particles for dielectrics, 3 to 50% by weight of carbon can be added with respect to inorganic particles and pulverized to mechanically adhere carbon to magnetic powders (mechanochemical method).

In addition, by melting the above described conductive metal and inorganic particles in a plasma gas at high temperature, and rapidly cooling and solidifying them, the concentration of the conductive component near the surfaces of composite particles for dielectrics can be increased to above the average concentration.

In the case where fine composite particles for dielectrics with the average particle size of about 0.1 to 10 μm are obtained, fine inorganic particles are subjected to fluid jet mill treatment in the inert atmosphere and dispersed into primary particles, and the obtained inorganic primary particles are heated under reduced pressure in the inert atmosphere, and the inorganic particles subjected to the heat treatment is placed in a rotating container with a conductive component contained therein as a sputtering source, and the container is rotated in a fixed direction to form fluidized bed of inorganic particles, and the conductive component is sputtered with the container being rotated to coat the coating material to the fluidized inorganic particles, and the coated fine particles are taken out from the above described rotating container on the principle of a vacuum cleaner by conducting introduction of inert gas and vacuum pumping in combination, whereby composite particles for dielectrics in which the surfaces of inorganic particles are strongly and uniformly coated with a conductive component can be obtained within the above described average particle size.

(A-1) Inorganic Ultrafine Particles

In Invention I, inorganic ultrafine particles (A-1) can be used together with the above described composite particles for dielectrics (A).

Particularly, in the above described Invention 3, in the case where a component containing (F) resin capable of undergoing alkali development and (G) photosensitive acid producing compound is used as the resin component (B) constituted of at least one of a polymerizable compound and a polymer (Invention 3-2), the inorganic ultrafine particles (A-1) are preferably used in conjunction with the component.

The average particle size of these inorganic ultrafine particles (A-1) is 0.1 μm or smaller, preferably 0.08 μm or smaller, further preferably 0.05 μm or smaller. If the average particle size is larger than 0.1 μm, dispersibility may be reduced to make it difficult to obtain a sufficient effect by adding them. Also, the lower limit is not specified for the average particle size, but it is preferably 0.001 μm or larger, further preferably 0.005 μm or larger because the reduced particle size tends to cause agglomeration of particles.

The permittivity of inorganic ultrafine particles capable of being used in the present invention is preferably 10 or greater, more preferably 20 or greater, further preferably 30 or greater. Even higher permittivity is acceptable and the upper limit thereof is not specified, and for example permittivity of about 30000 can be accepted.

For these inorganic ultrafine particles, those composed of metal oxides are preferably used, and titanium based metal oxides are more preferable. For these titanium based metal oxides, titanium based single metal oxides and titanium based multiple oxides both described above may be preferably used.

The above described titanium based single metal oxides include, for example, titanium dioxide based metal oxides. These titanium dioxide based metal oxides include titanium oxide based metal oxides of anatase or rutile structure.

The above described titanium based multiple oxides include, for example, barium titanate based, lead titanate based, strontium titanate based, bismuth titanate based, magnesium titanate based, neodium titanate based, and calcium titanate based metal oxides.

Also, for improving dispersibility in the dispersion medium such as an alcohol medium, particles with the surfaces of the above described inorganic ultrafine particles modified with silica, alumina or the like may be suitably used.

The shapes of inorganic ultrafine particles of the present invention are not particularly limited, but they include spheroidal shape, granular shape, tabular shape, flake shape, whisker shape, rod shape and filament shape. And of these shapes, speroidal shape, granular shape, rod shape and filament shape are preferable. Inorganic particles of these shapes may be used alone or in combination of two or more types thereof.

Inorganic ultrafine particles for use in the present invention can be synthesized by, for example, the gas phase method and sol gel method. For dispersing inorganic ultrafine particles synthesized by the gas phase method in a solvent, they can be dispersed into primary particles using a dispersant in conjunction by a known dispersion method, a bead mill, a mixing method, a high-pressure homogenizer.

The content of inorganic ultrafine particles (A-1) in the dielectric-forming composition is preferably 1 to 30 parts by weight, more preferably 5 to 20 parts by weight with respect to 100 parts by weight of composite particles for dielectrics (A).

Dielectric-forming Composition

The dielectric-forming composition according to Invention I (Inventions 1 to 4) is composed of the above described composite particles for dielectrics (A) and a resin component constituted of at least one of a polymerizable compound and a polymer (B). This dielectric-forming composition is a composition allowing a dielectric with permittivity of 30 or greater and dielectric loss tangent of 0.1 or smaller to be formed by heating the composition at a temperature of 500° C. or lower.

Furthermore, in this specification, the permittivity and dielectric loss tangent represent values measured by methods described in JIS K 6911 (frequency 1 MHz).

Also, the above described dielectric-forming composition can further contain a solvent and other components such as a bulking agent as necessary.

In Invention I, the volume ratio of the above described composite particles for dielectrics to the above described resin component constituted of at least one of a polymerizable compound and a polymer (volume of the composite particles for dielectrics/volume of the resin component constituted of at least one of a polymerizable compound and a polymer) is preferably 5/95 to 80/20, further preferably 10/90 to 60/40. If the content of composite particles for dielectrics is smaller than 5% by volume, it may be difficult to obtain a dielectric of high permittivity. Also, if the content of composite particles for dielectrics is larger than 80% by volume, the deposit ion property of the film may be deteriorated when the dielectric is a film type dielectric.

Also, in the present invention, the weight ratio of the above described composite particles for dielectrics to the above described resin component constituted of at least one of a polymerizable compound and a polymer (weight of the composite particles for dielectrics/weight of the resin component constituted of at least one of a polymerizable compound and a polymer) is preferably 60/40 to 95/5, further preferably 70/30 to 90/10. If the content of the composite particles for dielectrics is smaller than 60% by weight, it may be difficult to obtain a dielectric of high permittivity. Also, if the content of composite particles for dielectrics is larger than 95% by weight, the deposition property of the film may be deteriorated when the dielectric is a film type dielectric.

In addition, in the case where the composite particles for dielectrics are used in the dielectric layer with a conductive foil capable of being laminated according to Invention 2, these composite particles for dielectrics are desirably added to the dielectric-forming composition so that the content of the composite particles for dielectrics is preferably 70% by weight or larger, more preferably 75 to 95% by weight when the total amount of the composite particles for dielectrics and the resin component is 100% by weight. If the content of the composite particles for dielectrics is smaller than 70% by weight in the dielectric-forming composition, the permittivity of the dielectric-forming composition may be significantly reduced due to relative relationship with the resin component (B), and if the content is larger than 95% by weight, the strength of the formed dielectric layer may be reduced.

Also, in Invention 3, in the case where the resin component (B) is composed of (C) alkali soluble resin, (D) a compound containing an ethylene based unsaturated group and (E) photopolymerization initiator (Invention 3-1), the average particle size of composite particles for dielectrics (A) is 0.1 to 2 μm, and in the case where the above described resin component (B) constituted of at least one of a polymerizable compound and a polymer is composed of (F) resin capable of undergoing alkali development and (G) photosensitive acid producing compound (Invention 3-2), the content of alkali soluble resin (C) or resin capable of undergoing alkali development (F) in the respective dielectric-forming composition is usually 1 to 500 parts by weight, preferably 10 to 500 parts by weight, more preferably 10 to 200 parts by weight with respect to 100 parts by weight of composite particles for dielectrics (A). Furthermore, the dielectric-forming composition may contain a resin other than the alkali soluble resin such as polyimide resin, bismaleimide resin and epoxy resin, for example.

The resin component (B) capable of being used in Invention I is constituted of at least one of a polymerizable compound and a polymer. Here, "polymerizable compound" means a compound having a polymerizable group, and refers to a compound including a precursory polymer before being fully cured, a polymerizable oligomer, a monomer or the like. Also, "polymer" means a compound of which polymerization reaction is substantially completed. However, this polymer can be cross-linked by means of heating, humidity and the like after formation of the dielectric layer. Resin components, etc., compositions and production methods, etc. for use in inventions 1 and 2 and Inventions 3 and 4 in Invention I will be described below, respectively.

Dielectric-forming Composition of Inventions 1 and 2

<Resin Component (B) for Use in Inventions 1 and 2, Filler, Other Additives>

Resin Component (B)

In Inventions 1 and 2 of the above described Invention I, preferred resin components vary depending on whether the dielectric-forming composition is used as a (1) dielectric paste or (2) aqueous dispersions for electrodeposition described later, and separately detailed description thereof will be presented below.

(1) Resin Component for Dielectric Paste (Resin Component (1))

The dielectric paste of the present invention contains a dielectric-forming composition, and may contain an organic solvent as necessary. Specifically, the dielectric-forming composition may be used directly as a dielectric paste if the dielectric-forming composition is pasty, and it also may be formed into a paste by dissolving the constituent resin component in the organic solvent and dispersing the composite particles for dielectrics therein and used. The resin component when this dielectric-forming composition of the present invention is used as a dielectric paste is not particularly limited as long as bonding of the dielectric paste to the printed-wiring board of semiconductor or the like is not hindered.

For such resin components, resin components of thermoset type (B1) that are used with the resin component cured by heating after printing the paste on a target substrate or the like, and resin components of thermoplastic type (B2) with the resin component capable of being baked by heating may preferably be used.

They may be used alone or in combination. Also, in the case where both the polymerizable compound and polymer are used as the resin component, it is preferable that the polymerizable compound is a thermoset resin, and the polymer is a thermoplastic resin. If the resin is used in such a combination, slight shrinkage of the resin component associated with heating can be reduced to obtain a film of excellent positional accuracy when the dielectric layer is formed on the circuit board as a film or the like. These resin components will be described further in detail below.

(B1) Resin Component (Thermoset Type)

The resin component of thermoset type preferably comprises (B1-a) epoxy resin with the weight average molecular weight (polystyrene equivalent weight average molecular weight by the gel permeation method) in the range of from 300 to 5,000 and/or (B1-b) epoxy group-containing polymer having a constitutional unit originated from a compound having a ethylene based double bond and an epoxy group (hereinafter also referred to as "Compound (P)") in a molecule and having a weight average molecular weight in the range of from 10,000 to 500,000.

Of these, the resin component of thermoset type preferably comprises both the above described epoxy resin (B1-a) and epoxy group-containing copolymer (B1-b).

(B1-a) Epoxy Resin

The above described epoxy resin (B1-a), which preferably has two or more epoxy groups in a molecule, includes, for example, phenol novolac type epoxy resin, cresol novolac type epoxy resin, bisphenol A type epoxy resin, bisphenol F type epoxy resin, bisphenol AD type epoxy resin and alicyclic epoxy resin.

Of these epoxy resins, those that are cured by heating for 1 minute to 24 hours at a temperature in the range of from a room temperature (25° C.) to 200° C. are preferable, and those that are cured by heating for 10 minutes to 12 hours at a temperature in the range of from 100° C. to 180° C. are more preferable. By heating and curing the resin under these conditions, productivity is improved and influence of heating on the printed wiring circuit board and the like is reduced.

The weight average molecular weight of the above described epoxy resin (B1-a) is preferably in the range of from 300 to 5,000, more preferably 400 to 2,000. If the weight average molecular weight is in this range, the balance between the mechanical strength in the dielectric-forming composition after thermal curing and productivity can be further improved. If the weight average molecular weight of the above described epoxy resin is smaller than 300, the mechanical strength after thermal curing may be reduced. Also, if the weight average molecular weight is larger than 5,000, it may take much time to achieve uniform dissolution when the dielectric-forming composition is prepared, thus reducing productivity.

The amount of the above described epoxy resin (B1-a) to be added is preferably in the range of from 1 to 20 parts by weight, more preferably 5 to 15 parts by weight, with respect to 100 parts by weight of composite particles for dielectrics.

If the amount of the above described epoxy resin (B1-a) to be added is smaller than one part by weight, the mechanical strength of the dielectric-forming composition after thermal curing may be insufficient, and if the amount of the above described epoxy resin (B1-a) to be added is larger than 20 parts by weight, (the permittivity of the dielectric-forming composition may be significantly reduced).

(B1-b) Epoxy Group-Containing Polymer

The type of the above described epoxy group-containing polymer (B1-b) is not particularly limited as long as it is a polymer with a specific weight average molecular weight having a unit originated from Compound (P) having an ethylene based double bond and an epoxy group in a molecule.

Such an epoxy group-containing polymer (B1-b) is preferably a homopolymer of Compound (P), or a copolymer of Compound (P) and a monomer other than Compound (P).

The above described Compound (P) includes, for example, epoxy group-containing (meta) acrylates and epoxy group-containing vinyl compounds.

Epoxy group-containing (meta) acrylates include, for example, (meta) glycidyl acrylate, α-ethyl (meta) glycidyl acrylate, α-n-propyl (meta) glycidyl acrylate, α-n-butyl (meta) glycidyl acrylate, 3,4-epoxybutyl (meta) acrylate, 3,4-epoxyheptyl (meta) acrylate and α-ethyl-6,7-epoxyheptyl (meta) acrylate.

Epoxy group-containing vinyl compounds include, for example, allyl glycidyl ether, vinyl glycidyl ether, o-vinyl benzyl glycidyl ether, m-vinyl benzyl glycidyl ether, p-vinyl benzyl glycidyl ether and 3-vinyl cyclohexene oxide.

They may be used alone or in combination of two or more types.

Of these epoxy group-containing monomers, in particular, (meta) glycidyl acrylate and α-ethyl (meta) glycidyl acrylate are preferably.

The constitutional unit originated from Compound (P) as described above exists desirably in the epoxy group-containing polymer (B1-b) in the amount of preferably 10 to 100% by weight, further preferably 20 to 100% by weight.

If the content of this constitutional unit originated from Compound (P) is smaller than 10% by weight, reactivity with a thermoplastic resin may be significantly reduced.

Also, for the above described epoxy group-containing polymer (B1-b), homopolymers of Compound (P), and monomers such as vinyl group-containing compounds containing no epoxy groups other than Compound (P), (meta) acrylamide compounds and (meta) acrylates, or copolymers of two or more types of monomers may also be used.

These vinyl group-containing compounds containing no epoxy groups include, for example, hydroxystyrene, isopropenyl phenol, styrene, α-methyl styrene, p-methyl styrene, chlorostyrene, p-methoxystyrene, vinyl pyrrolidone, vinyl caprolactam, acrylonitrile and methacrylonitrile.

(Meta) acrylamide compounds include, for example, acrylamide, methacrylamide and N, N-dimethyl acrylamide.

In addition, (meta) acrylates include, for example, methyl (meta) acrylate, ethyl (meta) acrylate, butyl (meta) acrylate, 2-ethylhexyl (meta) acrylate, hydroxyethyl (meta) acrylate, phenyl (meta) acrylate, benzil (meta) acrylate, phenoxyethyl (meta) acrylate, cyclohexyl (meta) acrylate, isoboronyl (meta) acrylate and tricyclodecanyl (meta) acrylate.

Of these, in particular, styrene, acrylonitrile, hydroxystyrene, methyl (meta) acrylate and 2-ethylhexyl (meta) acrylate are preferable.

The weight average molecular weight of the above described epoxy group-containing polymer (B1-b) is preferably in the range of from 10,000 to 500,000, further preferably from 20,000 to 400,000, particularly preferably 30,000 to 300,000. If the weight average molecular weight of the epoxy group-containing polymer (B1-b) is in this range, the balance between the antisagging property during heating in the dielectric-forming composition and the coating property is further improved.

If the weight average molecular weight of the epoxy group-containing polymer (B1-b) is smaller than 10,000, the viscosity during thermal curing may rapidly drop to make it impossible to obtain a sufficient antisagging property, and the adhesive strength after curing may be poor. On the other hand, if the weight average molecular weight is larger than 500,000, the viscosity of the dielectric-forming composition increases extremely to deteriorate the coating property.

The method of producing the above described epoxy group-containing polymer (B1-b) is not particularly limited, but the polymer can be obtained by, for example, adding a radical generator to radical-polymerize the above described Compound (P) and the above described other monomer as required.

For this radical generator, for example, diacylperoxides, ketone peroxides, hydro peroxides, dialkyl peroxides, peroxyesters, azo based compounds, and persulfates maybe used alone or in combination of two or more types. More specifically, they include, for example, benzoil peroxide, lauryl peroxide, 2,2'-azobisisobutyronitrilo and 4,4'-azobis(4-cyanovaleric acid)

Also, it is also preferable that inorganic reducers such as sodium bisulfite and sodium pyrosulfite, and organic reducers such as cobalt naphthenate and dimethyl aniline are used in conjunction with the radical generator. By using them in combination in this way, the radical reaction can be conducted in shorter time.

In addition, an iodine-containing fluorine compound may be used alone or in conjunction with the above described organic peroxide, azo based compound or persulfate.

Furthermore, the amount of radical generator to be added is preferably in the range of from 0.1 to 10 parts by weight with respect to 100 parts by weight of monomer including Compound (P), for example.

Also, it is also preferable that a chain transfer agent is added when the above described epoxy group-containing polymer (B1-b) is produced. By using the chain transfer agent, the weight average molecular weight of the above described epoxy group-containing polymer (B1-b) is more easily adjusted.

Such chain transfer agents include, for example, halogenated hydrocarbons such as carbon tetrachloride, chloroform and carbon tetrabromide, mercaptans such as n-hexylmercaptan, n-octylmercaptan, n-dodecylmercaptan, t-dodecylmercaptan, thioglycols and thiopropionic acid, xanthongens such as dimethyl xanthongen disulfide and diisopropyle xanthongen disulfide, terpinogen and α-methyl styrene dimer.

Also, when the above described radical polymerization is carried out, it is desirably carried out in aprotic polar solvents such as dioxane and THF, and solvents of esters such as ethyl acetate and ketones such as methyl ethyl ketone.

The amount of the above described epoxy group-containing polymer (B1-b) to be added is preferably in the range of from 1 to 15 parts by weight, further preferably 2 to 10 parts by weight, with respect to 100 parts by weight of composite particles for dielectrics. If the amount of the polymer to be added is in this range, the balance between the antisagging property during thermal curing in the dielectric-forming composition and the permittivity can be further improved.

If the amount of the above described epoxy group-containing polymer (B1-b) to be added is smaller than one part by weight, the antisagging effect during thermal curing in the dielectric-forming composition may be insufficiently exerted. Also, if the amount of the above described epoxy group-containing polymer (B1-b) to be added is larger than 15 parts by weight, the content of the added composite particles for dielectrics may be relatively decreased to reduce the permittivity of the resulting dielectric.

(B2) Resin Component (Thermoplastic Type)

The resin components of thermoplastic type (A2) include, for example, (meta) acryl based resin, hydroxystyrene resin, novolac resin and polyester resin. Of these, acryl resins such as copolymers of the following Monomer (M1) and Monomer (M2) may preferably be used.

The above described Monomer (M1) may include, for example, carboxyl group-containing monomers such as acrylic acid, methacrylic acid, maleic acid, fumaric acid, succinic acid, crotonic acid, itaconic acid, citraconic acid, mesaconic acid and cinnamic acid;

hydroxyl group-containing monomers such as (meta) acrylic acid 2-hydroxyethyl, (meta) acrylic acid 2-hydroxypropyl and (meta) acrylic acid 3-hydroxypropyl; and monomers represented by phenolic hydroxyl group-containing monomers such as o-hydroxystyrene, m-hydroxystyrene and p-hydroxystyrene, and the like.

The above described monomer (M2) may include, for example, (meta) acrylates other than Monomer (M1) such as (meta) methyl acrylate, (meta) ethyl acrylate, (meta) butyl acrylate, (meta) benzyl acrylate, glycidyl (meta) acrylate and dicyclopentanyl (meta) acrylate;

aromatic vinyl based monomers such as styrene and α-methyl styrene; and monomers capable of being copolymerized with Monomer (M1) represented by conjugated dienes such as butadiene and isoprene.

The weight average molecular weight of the resin component (B2) is preferably in the range of from 10,000 to 1,000,000, further preferably from 20,000 to 500,000, particularly preferably from 30,000 to 300,000. If the weight average molecular weight is in this range, the balance between the antisagging property after printing of the dielectric paste and the coating property can be further improved when the dielectric-forming composition of the present invention is used as a paste, for example.

If the weight average molecular weight of the resin component (B2) is smaller than 10,000, it may be impossible to obtain a sufficient antisagging property after printing of the dielectric paste. On the other hand, if the weight average molecular weight is larger than 1,000,000, the viscosity of the dielectric-forming composition may be excessively increased to compromise the coating property.

The method of producing the above described resin component (B2) is not particularly limited, but a radical generator and chain transfer agent similar to the above described epoxy group-containing polymer (B1-b) may be used to polymerize the above described monomer for obtaining the resin component.

The amount of the above described resin component (B2) to be added is preferably in the range of from 1 to 30 parts by weight, further preferably from 2 to 15 parts by weight, with respect to 100 parts by weight to composite particles for dielectrics, for example. If the amount of the resin component to be added is in this range, for example, the balance between the printability of the dielectric paste and the permittivity can be further improved.

If the amount of the above described resin component (B2) to be added is smaller than one part by weight, for example, it may be impossible to coat the dielectric paste uniformly. On the other hand, if the amount of the above described resin component (B2) to be added is larger than 30 parts by weight, residues of organic material may occur when heating and baking the resin component, thus compromising the dielectric property.

Furthermore, in the case where both the polymerizable compound and polymer are used in combination as the resin component (B) in the dielectric layer with a conductive foil capable of being laminated of the above described Invention 2, it is preferable that the polymerizable compound is a thermoset resin and the polymer is a thermoplastic resin. If the resin is used in such a combination, slight shrinkage of the resin component suffered from heating can be reduced to obtain a dielectric layer of excellent positional accuracy on the circuit board.

The thermoset resin includes, for example, the aforementioned resin components of thermoset type (b1) (b2), and the thermoplastic resin includes, for example, acryl based resins. In the case where the thermoset resin and the thermoplastic resin are used in combination, the thermoplastic resin is desirably added so that its content is preferably 10 to 200 parts by weight, more preferably 50 to 150 parts by weight, with respect to 100 parts by weight of the thermoset resin. If the amount of the thermoplastic resin to be added is smaller than 10 parts by weight, it may be difficult to obtain its addition effect, and if the amount is larger than 200 parts by weight, the mechanical strength of the dielectric-forming composition after thermal curing may be insufficient.

(2) Resin Component for Use in Aqueous Dispersions for Electrodeposition (Resin Component (2))

In the case where the dielectric-forming composition according to Invention 1 is contained in aqueous dispersions for electrodeposition and used, the resin component (2) preferably consists of one or more types of resins selected from polyimide based resin, epoxy based resin, acryl based resin, polyester based resin, fluorine based resin and silicon based resin. In addition to these resins, other components may be further contained. In addition, these resins may be chemically bonded to each other or to other components.

These resins are preferably particulate organic particles in the case where they are used in aqueous dispersions for electrodeposition.

The organic particles that are the resin component constituted of at least one of a polymerizable compound and a polymer preferably have on the surfaces electric charges for enabling electrodeposition, and the electric charges may be of anion type or cation type, but are preferably of cation type for preventing oxidation of electrodes during electrodeposition.

Of these, in Inventions 1 and 2, organic particles having a polyimide based resin as a principal constituent is particularly preferably used because they make it possible to form by electrodeposition a film of high permittivity having excellent mechanical, chemical and electrical properties. Furthermore, "polyimide based resin" means inclusion of, for example, precursory polymers capable of being cured by heating after electrodeposition and the like (e.g. polyamic acid, etc.), monomers for use in formation of polyimide based resins, oligomers, copolymer resins of monomers for use in formation of polyimide resins and other monomers, or their precursory polymers, and reactants of polyimide resins or their precursory polymers and other compounds, as described previously.

The weight average molecular weight of the resin component (2) is preferably in the range of from 10,000 to 1,000,000, further preferably from 20,000 to 500,000, particularly preferably from 30,000 to 300,000. If the weight average molecular weight is in this range, for example, electrodeposition can effectively be carried out when the dielectric-forming composition of Invention I is contained in aqueous dispersions for electrodeposition and used.

If the weight average molecular weight of the resin component (2) is smaller than 10,000, it may be impossible to achieve uniform electrodeposition. On the other hand, if the weight average molecular weight is larger than 1,000,000, the viscosity of the dielectric-forming composition may be extremely increased to compromise the coating property.

The amount of the above described resin component (2) to be added is preferably in the range of from 1 to 30 parts by weight, further preferably from 5 to 25 parts by weight, with respect to 100 parts by weight of the composite particles for dielectrics, for example. If the amount of the resin component to be added is in this range, the balance between the thickness uniformity of coatings in the dielectric-forming composition and the dielectric property can be further improved.

Filler

The dielectric-forming composition of Invention 1 may further contain a filler in addition to the composite particles for dielectrics and resin component. Additives for improving permittivity as such a filler include carbon powders such as acetylene black and Ketjenblack, conductive fine particles such as graphite powders, and semiconductor based fine particles such as silicon carbide powders. In the case where these fillers for improving permittivity are added, their content is preferably 0 to 10% by weight, further preferably 0.1 to 10% by weight, more preferably 0.5 to 10% by weight and particularly preferably 1 to 5% by weight, with respect to the composite particles for dielectrics.

Other Additives

The dielectric-forming composition according to Invention 1 may further contain as compounds other than those described above a curing agent, glass powders, a coupling agent, a polymeric additive, a reactive diluent, a polymerization inhibitor, a polymerization initiation aid, a leveling agent, a wettability improver, a surfactant, a plasticizer, an ultraviolet absorbent, an antioxidant, an antistatic agent, an inorganic bulking agent, a mildewproofing agent, a humidity conditioning agent, a dye dissolving agent, a buffer solution, a chelating agent, a fire retardant and the like. These additives may be used alone or in combination of two or more types thereof.

(1) Curing Agent

It is preferable that a curing agent is added when the resin component (A1) is cured. The type of the curing agent is not particularly limited, but for example, curing agents for epoxy resins include amines, dicyandiamide, dibasic dihydrazid and imidazoles.

By adding such a curing agent, the epoxy resin can be thermally cured effectively.

Also, the amount of curing agent to be added is not particularly limited, but the amount of curing agent to be added is preferably in the range of from 1 to 30 parts by weight with respect to 100 parts by weight of the resin component (A1), for example.

If the amount of curing agent to be used is smaller than 1 part by weight, for example, hardenability for the epoxy resin may be significantly reduced. On the other hand, if the amount of curing agent to be used is larger than 30 parts by weight, it becomes difficult to control reactivity, thus raising a possibility that preservation stability in the epoxy resin is compromised.

When the above described resin component of thermoset type (A1) is used, an accelerator may also be used as necessary. The type of such an accelerator is not particularly limited, but includes, for example, organic boron, tertiary amines, imidazole and salts thereof. These substances are preferable particularly as an accelerator for the epoxy resin.

If the accelerator as described above is used, the amount of the accelerator to be used is preferably is in the range of from 0.1 to 10 parts by weight, further preferably from 0.5 to 5 parts by weight with respect to 100 parts by weight of the resin component.

(2) Coupling Agent

In the dielectric-forming composition of Invention 1 and 2 a coupling agent may be added. By adding the coupling agent, the coating property to the substrate of the printed-wiring board and the like is improved, and humidity resistance is considerably enhanced, thus making it possible to maintain excellent adhesion and the like over a long period of time.

The coupling agent like this may be at least one coupling agent selected from silane based coupling agents, aluminum based coupling agents, titanate based coupling agents and zirconate based coupling agents. Of these coupling agents, the silane based coupling agent is preferably added because adding the agent in a relatively small amount results in an excellent effect of improving humidity resistance and the like.

Also, the type of the silane based coupling agent is not particularly limited, but includes, for example, y-aminoproplyltrimethoxysilane, y-aminopropyltriethoxysilane, y-aminopropylmethyldimethoxysilane, y-aminopropyldimethylmethoxysilane, y-glycidoxypropyltrimethoxysilane, y-glycidoxypropyltriethoxysilane, n-decyltrimethoxysilane They may be used alone or in combination of two or more types.

The amount of coupling agent to be added is preferably in the range of from 0.1 to 10 parts by weight, further preferably from 0.5 to 5 parts by weight with respect to 100 parts by weight of the resin component (A).

If the amount of coupling agent to be added is smaller than 0.1 parts by weight, its addition effect may be insufficiently exerted. On the other hand, if the amount is larger than 10 parts by weight, the coupling agent may be self-condensed to compromise preservation stability of the dielectric-forming composition.

Dielectric Paste According to Inventions 1 and 2

The dielectric paste of the present invention contains the dielectric-forming composition according to Invention 1 or 2, and may contain an organic solvent as necessary. Specifically, the dielectric paste containing the dielectric-forming composition of Invention 1 may be used directly when the dielectric-forming composition 1 is a paste. Also, it is possible that the resin component contained in the dielectric-forming composition is dissolved in an organic solvent or the like, and composite particles for dielectrics are dispersed therein and used.

In the case where the dielectric-forming composition of Inventions 1 or 2 is used as a dielectric paste, it is preferable that the above described resin component (1) is used.

For the solvent, well known solvents may be used, the type of the solvents are not particularly limited, but include, for example, ethylene glycol monoalkyl ether acetates such as ethylene glycol monomethyl ether acetate and ethylene glycol monoethyl ether acetate;

propylene glycol monoalkyl ethers such as propylene glycol monomethyl ether, propylene glycol monoethyl ether, propylene glycol monopropyl ether and propylene glycol monobutyl ether;

propylene glycol dialkyl ethers such as propylene glycol dimethyl ether, propylene glycol diethyl ether, propylene glycol dipropyl ether and propylene glycol dibutyl ether;

propylene glycol monoalkyl ether acetates such as propylene glycol monomethyl ether acetate, propylene glycol monoethyl ether acetate, propylene glycol monopropyl ether acetate and propylene glycol monobutyl ether acetate;

cellosolves such as ethyl cellosolve and butyl cellosolve;

carbitols such as ethyl carbitol and butyl carbitol;

carbitol acetates such as ethyl carbitol acetate and butyl carbitol acetate;

lactates such as methyl lactate, ethyl lactate, lactate n-propyl and isopropyl lactate;

aliphatic carboxylates such as ethyl acetate, acetate n-propyl, isopropyl acetate, acetate n-butyl, isobutyl acetate, acetate n-amyl, isoamyl acetate, isopropyl propionate, propionate n-butyl and isobutyl propionate;

other esters such as 3-methoxy methyl propionate, 3-methoxy ethyl propionate, 3-ethoxy methyl propionate, 3-ethoxyethylpropionate, methyl pyruvate and ethyl pyruvate;

aromatic hydrocarbons such as toluene and xylene;

ketones such as 2-heptanone, 3-heptanone, 4-heptanone and cyclohexanone;

amides such as N-dimethyl formamide, N-methyl acetoamide, N,N-dimethyl acetoamide and N-methyl pyrolidone; and lactones such as y-butyrolactone.

For these solvents, one type of solvent is preferably used, but alternatively, a mixture of two or more types of solvents is also preferably used.

The amount of the organic solvent to be used may be determined as appropriate depending on the type of the organic solvent and the like so that the viscosity of the obtained dielectric paste falls within the range described later, and is not particularly limited, but it is preferably 1 to 50 parts by weight, further preferably 3 to 30 parts by weight with respect to the dielectric-forming composition.

This dielectric paste can be prepared by mixing uniformly composite particles for dielectrics and the resin component, and a bulking agent, additives and an organic solvent as required using a mixer or the like.

The mixer that is used for such mixing is a boll mill, a propeller mixer, a high share mixer, a mixing deaerator, a triple roll, a V bender, a kneader and a micro fluidizer or the like.

Also, the temperature inside the mixer may rise when materials constituting the dielectric paste is mixed. In this case, it is preferable that a cooling apparatus or the like is used to keep the temperature at 60° C. or lower. If the temperature inside the mixture exceeds 60° C., part of resin component may be reacted and cured.

Also, the viscosity of the dielectric paste obtained by mixing and preparing this composition is preferably adjusted to a value in the range of from 1,000 to 1,000,000 mPa·s (measured at 25° C., and the same temperature condition shall apply hereinafter). If the viscosity of the dielectric paste is smaller than 1,000 mPa·s, the composite particles for dielectrics maybe precipitated, and sagging may tend to occur when the paste is coated. On the other hand, if the viscosity is larger than 1,000,000 mPa·s, it may become difficult to coat the paste uniformly.

The viscosity of the dielectric paste is further preferably in the range of from 10,000 to 600,000 mPa·s, particularly preferably from 30,000 to 400,000 mPa·s. If the viscosity is in this range, the coating property of the dielectric paste and dispersibility of the composite particles for dielectrics are further improved.

<Method of Forming Dielectric Layer Using Dielectric Paste>

For forming the dielectric layer with a conductive foil capable of being laminated according to the above described Invention 2 using the above described dielectric paste, for example, the dielectric paste is printed on the printed wiring board or the like by a printing method such as screen printing, and the dielectric-forming composition is cured or baked by heating the same using an oven or the like, thus making it possible to obtain a dielectric layer with a bump and circuit board pattern formed thereon.

Specifically, the dielectric-forming composition according to the above described Invention 1 or 2 is coated on the conductive foil and dried, and thereafter is heated at a temperature of 300° C. or lower, whereby the dielectric layer can be obtained, and the heating temperature is preferably 100 to 300° C., further preferably 150 to 280° C. The heating time is preferably in the range of from one minute to 24 hours, further preferably from 10 minutes to 12 hours.

In the case where the dielectric-forming composition of Invention 1 or 2 is cured or baked by heating the same, it may be heated by, for example, an oven, an infrared lamp, a hot plate or the like, for the heating method.

Aqueous Dispersions for Electrodeposition of Inventions 1 and 2

Aqueous Emulsion

The aqueous dispersions for electrodeposition for use in Inventions 1 and 2 consist of the above described dielectric-forming composition and an aqueous medium. These aqueous dispersions for electrodeposition are usually obtained by preparing an aqueous emulsion with the above described organic particles of the above described resin component (2) dispersed in an aqueous medium, and mixing this emulsion with the above described composite particles for dielectrics. First, the aqueous emulsion will be described. Furthermore, in this specification, "aqueous medium" means a medium containing water, and the content of water in this aqueous medium is usually 1% by weight or larger, preferably 5% by weight or larger.

The aqueous emulsion may contain other media together with water as necessary. Other media that are used together with water as necessary include, for example, the above described polyamic acid, aprotic polar solvents for use in production of polyimide, esters, ketones, phenols and alcohols.

Methods of producing aqueous emulsions of organic particles constituted mainly by polyimide based resins (hereinafter referred to as "polyimide based resin emulsions"), aqueous emulsions of organic particles constituted mainly by epoxy based resins (hereinafter referred to as "epoxy based resin emulsions"), aqueous emulsions of organic particles constituted mainly by acryl based resins (hereinafter referred to as "acryl based resin emulsions"), aqueous emulsions of organic particles constituted mainly by polyester based resins (hereinafter referred to as "polyester based resin emulsions"), aqueous emulsions of organic particles constituted mainly by fluorine based resins (hereinafter referred to as "fluorine based resin emulsions"), and aqueous emulsions of organic particles constituted mainly by silicon based resins (hereinafter referred to as "silicon based resin emulsions") will be described below.

(i) Methods of Producing Polyimide Based Resin Emulsions

In the case where the above described organic particles for use in the present invention are constituted of the polyimide based resin, a polyimide based high permittivity film having excellent mechanical, chemical and electric properties can be formed. For the method of producing this polyimide based film by electrodeposition, two types methods described below may be preferably used.

<<1>> A method in which a polyimide based resin emulsion containing organic particles constituted of organic solvent-soluble polyimide and a hydrophilic polymer is used as an electrodeposition liquid to electro-deposit the organic particles.

<<2>> A method in which a polyimide based resin emulsion containing organic particles constituted of polyamic acid and a hydrophobic compound is used as an electrodeposition liquid to electro-deposit the organic particles, and the electro-deposited polyamic acid is made to undergo dehydration ring-closing by heating.

For the method of producing the polyimide based resin emulsion for use in these methods, the method described in Japanese Patent Laid-Open No. 11-49951 may be used for the above described method <<1>>, and the method described in Japanese Patent Laid-Open No. 11-60947 may be used for the above described method <<2>>.

The method of producing the polyimide based resin emulsion for use in the above described method <<1>> will be described further in detail.

The method of synthesizing the above described "organic solvent-soluble polyimide" is not particularly limited, but for example, the polyimide can be synthesized by mixing tetracarboxylic dianhydride and a diamine compound and polycondensating the same in an organic polar solvent to obtain polyamic acid, followed by making the polyamic acid undergo a dehydration ring-closure reaction by the heat imidization method or the chemical imidization. Also, polyimide having a bloc structure can also be synthesized by carrying out polycondensation of the tetracarboxylic dianhydride and diamine compound in multiple stages.

This organic solvent-soluble polyimide preferably has one or more type of reactive group (a) such as a carboxyl group, an amino group, a hydroxyl group, a sulfonic group, an amide group, an epoxy group and an isocyanate group, for example. Methods of synthesizing polyimide having the reactive group (a) may include, for example, a method in which a compound having the reactive group (a) is used as a reacting raw material used for synthesizing a polyamic acid such as carboxylic dianhydride, the diamine compound, carboxylic monoanhydride and the monoamin compound, and the reactive group (a) is made to remain after the dehydration ring-closure reaction.

The above described "hydrophilic polymer" has one or more type of group such as an amino group, a carboxyl group, a hydroxyl group, a sulfonic group and amide group, for example, as a hydrophilic group, and is constituted of a hydrophilic polymer of which solubility in water at 20° C. is usually 0.01 g/100 g or larger, preferably 0.05 g/100 g or larger. The hydrophilic polymer preferably has one or more type of reactive group (b) that may react with the reactive group (a) in the above described (B) component, in addition to the above described hydrophilic group. This reactive group (b) may be, for example, a group similar to the above described hydrophilic group or the like, in addition to an epoxy group, an isocyanate group and a carboxyl group. This hydrophilic polymer can be obtained by homopolymerizing or copolymerizing monovinyl monomers having the hydrophilic group and/or the reactive group (b), or copolymerizing these monovinyl monomers with other monomers.

This organic solvent-soluble polyimide and hydrophilic polymer are selected so that a combination of the reactive group (a) and the reactive group (b) in the hydrophilic polymer has appropriate reactivity, and the polyimide and the hydrophilic polymer are mixed together and reacted with each other in the form of solution in, for example, an organic solvent while they are heated as necessary, followed by mixing this reaction solution and the aqueous medium, and removing at least part of the organic solvent in some cases. Thereby, a polyimide based resin emulsion composed of organic particles with the polyimide and the hydrophilic polymer bonded together and contained in the same particle can be obtained.

The method of producing the polyimide based resin emulsion for use in the above described method <<2>> will now be described further in detail.

The method of synthesizing "polyamic acid" being a precursor of polyimide is not particularly limited, but for example, polyamic acid can be obtained by the polycondensation reaction of tetracarboxylic dianhydride and a diamine compound in an organic polar solvent. Also, by carrying out the polycondensation reaction of tetracarboxylic dianhydride and the diamine compound in a multiple stages, polyamic acid having a block structure can be synthesized. Furthermore, polyamic acid partially imidized by making the polyamic acid undergo dehydration ring-closing can also be used.

On the other hand, "hydrophobic compound" is a compound having a group that may react with at least an amic acid group in the above described polyamic acid (hereinafter referred to as "reactive group"). This reactive group may be, for example, an epoxy group, an isocyanato group, a carbodiimide group, a hydroxyl group, a mercapto group, a halogen group, an alkylsulfonyl group, an arylsulfonyl group, a ziazo group and a carbonyl group. These reactive groups may exist in the hydrophobic compound in one or more type. Furthermore, the "hydrophobic" means that solubility in water at 20° C. is usually smaller than 0.05 g/100 g, preferably smaller than 0.01 g/100 g, further preferably smaller than 0.005 g/100 g.

For this hydrophobic compound, one or more type of compound selected from, for example, epoxydized polybutadiene, bisphenol A type epoxy resin, naphthalene based epoxy resin, fluorene based epoxy resin, biphenyl type epoxy resin, glycidyl ester type epoxy resin, allyl glycidyl ether, glycidyl (meta) acrylate, 1,3,5,6-tetraglycidyl-2,4-hexanediol, N,N,N',N',-tetraglycidyl-m-xylenediamine, trylene diisocyanate, dicyclohexyl carbodiimide, polycarbodiimide, cholesterol, benzyl alcohol p-toluene sulfonate, ethyl chloroacetate, triazine trithiol, diazomethane and diacetone (meta) acrylamide may be used.

This polyamic acid and the hydrophobic compound are mixed together and reacted with each other in the form of solution in, for example, an organic solvent, followed by mixing this reaction solution with the aqueous medium, and removing at least part of the organic solvent in some cases, whereby a polyimide based resin emulsion composed of organic particles with the polyamic acid and the hydrophobic compound contained in the same particle can be obtained.

Furthermore, tetracarboxylic dianhydrides for use in the above described methods <<1>> and <<2>> are not particularly limited, and may include, for example, aliphatic tetracarboxylic dianhydrides or alicyclic tetracarboxylic dianhydrides such as butane tetracarboxylic dianhydride, 1,2,3,4-cyclobutane tetracarboxylic dianhydride, 3,3',4,4'-dicyclohexyl tetracarboxylic dianhydride, 2,3,5-tricarboxycyclopentyl acetic dianhydride and 1,3,3a,4,5,9A-hexahydro-5-(tetrahydro-2,5-dioxo-3-furanyl)-naphto [1,2-c]-furan-1,3-dion; and aromatic tetracarboxylic dianhydrides such as pyromelitic dianhydride, 3,3',4,4'-benzophenon tetracarboxylic dianhydride and 3,3',4,4'-biphenylsulfone tetracarboxylic dianhydride. These tetracarboxylic dianhydrides may be used alone or with two or more type thereof mixed together.

Also, diamine compounds for use in the above described methods <<1>> and <<2>> are not particularly limited, and may include, for example, Aromatic diamines such as p-phenylenediamine, 4,4'-diaminodiphenylmethane and 2,2-bis [4-(4-aminophenoxy) phenyl] propane;

aliphatic diamines or alicyclic diamines such as 1,1-methaxylylenediamine, 1,3-propaneziamine, tetramethylenediamine and 4,4'-methylenebis (cyclohexylamine);

diamines having per molecule two primary amino groups and nitrogen atoms other than the primary amino groups such as 2,3-diaminopyridine, 2,4-diamino-6-dimethylamino-1,3,5-triazine, 2,4-diamino-5-phenylthiazole and bis (4-aminophenyl) phenylamine;

mono-substituted phenylene diamines; and diaminoorgano siloxane. These diamine compounds may be used alone or with two or more types thereof mixed together.

(ii) Methods of Producing Epoxy Based Resin Emulsions

The method of producing epoxy based resin emulsions is not particularly limited, and they can be produced by known methods, for example the methods described in Japanese Patent Laid-Open No. 9-235495 and No. 9-208865.

(iii) Methods of Producing Acryl Based Resin Emulsions

The method of producing acryl based resin emulsions is not particularly limited, and they can be produced by normal emulsion polymerization. As for monomers, one or more type of monomer selected from general acryl based and/or methacryl based monomers. At this time, for enabling electrodeposition of organic particles, it is preferable that monomers having cationic groups such as an amino group, an amide group and a phosphono group, or monomers having anionic groups such as a carboxyl group and a sulfonic group are copolymerized, and the amount of copolymerized monomers is 5 to 80% by weight, more preferably 10 to 50% by weight with respect to the total amount of monomers to be used. For specific examples of the above described monomers having amino groups, dimethylaminoethyl acrylate, dimethylaminopropyl acrylamide and the like may be preferably used.

(iv) Methods of Producing Polyester Based Resin Emulsions

The method of producing polyester based resin emulsions is not particularly limited, and they may be produced in accordance with well known conventional methods, for examples the methods described in Japanese Patent Laid-Open No. 57-10663, No. 57-70153 and No. 58-174421.

(v) Methods of Producing Fluorine Based Resin Emulsions

The method of producing fluorine based resin emulsions is not particularly limited, and they may be produced in accordance with well known conventional methods, for examples the methods described in Japanese Patent Laid-Open No. 7-268163.

(vi) Methods of Producing Silicon Based Resin Emulsions

The method of producing silicon based resin emulsions is not particularly limited, and they may be produced in accordance with well known conventional methods, for examples the methods described in Japanese Patent Laid-Open No. 10-60280.

Aqueous Dispersions for Electrodeposition

The aqueous dispersions for electrodeposition of Invention 1 are such that the dielectric-forming composition of the above described Invention 1 is dispersed in an aqueous medium as described previously, and electrodeposition is enabled by the organic particles of the above described resin component contained in the above described dielectric-forming composition. Furthermore, the meaning of the aqueous medium is similar to that described above. That is, it is preferable that organic particles enabling electrodeposition are used.

The volume ratio of the composite particles for dielectrics contained in the aqueous dispersions for electrodeposition to the organic particles is preferably in the range of from 5/95 to 80/20, more preferably from 10/90 to 60/40. If the content of the composite particles for dielectrics is smaller than 5% by volume, it is difficult to obtain a dielectric layer (film) of high permittivity. On the other hand, if the content of the inorganic particles is larger than 80% by volume, it is not preferable because the film deposition property is compromised.

The pH of the aqueous dispersions for electrodeposition is preferably 2 to 10, more preferably 3 to 9, the solid content of the aqueous dispersions for electrodeposition is preferably 1 to 50% by weight, more preferably 5 to 20% by weight, and the viscosity of the aqueous dispersions for electrodeposition at 20° C. is preferably 1 to 100 mPa·s. If the pH, solid content or viscosity deviates from the above described range, dispersibility and the like of the composite particles for dielectrics or organic particles may be reduced resulting in insufficient preservation stability or reduced workability at the time when they are handled and used.

These aqueous dispersions for electrodeposition can be prepared by methods such as the method <<1>> in which the water dispersions for the above described composite particles for dielectrics are mixed with the water dispersions for the above described organic particles and the method <<2>> in which the above described composite particles for dielectrics are added in and mixed with the water dispersions of the above described organic particles. Of these, the method <<1>> is preferably used.

Also, usually in Invention 1, it is preferable that the pH of the water dispersions of the above described composite particles for dielectrics before being mixed with the water dispersions of the above described organic particles is adjusted using nitric acid, sulfuric acid, potassium hydroxide and the like so that the pH is in the range of from 2 to 10 in order to improve stability of these particles when they are mixed.

Also, in the case where the dielectric layer with a conductive foil capable of being laminated according to Invention 2 is formed, it is preferable that the pH of the water soluble solvent based dispersions of the above described inorganic particles or composite particles for dielectrics (A) before being mixed with the aqueous emulsion of the above described organic particles is adjusted using an organic acid (acetic acid, itaconic acid, fumaric acid, etc.), an organic alkaline compound (diethylaminoethyl alcohol, tetramethyl ammonium hydroxide, monoethylamine etc.) and the like so that the pH is in the range of from 2 to 10 in order to improve stability of these particles when they are mixed.

The aqueous dispersions for electrodeposition for use in Invention 1 may have preservation stability such that the period over which they can be preserved without causing interlayer separation, significant changes in viscosity and the like is 5 days or longer, more preferably 7 days or longer, further preferably 10 days or longer, particularly preferably 14 days or longer at 20° C.

Furthermore, the aqueous dispersions for electrodeposition of the present invention may contain, in addition to the above described organic particles and the above described composite particles for dielectrics, at least one type of compound selected from organosilanes expressed by the following general formula (1):

$$(R^1)_n Si(OR^2)_{4-n} \tag{1}$$

(In the above formula, $R^1$ represents a hydrogen atom or a monovalent organic group having 1 to 8 carbon atoms, $R^2$ represents an alkyl group having 1 to 5 carbon atoms, or an acyl group or phenyl group having 1 to 6 carbon atoms, and n represents an integer number of 1 or 2. $R^1$ and $R^2$ may be the same or different.), hydrolyzed compounds such that part or all of hydrolyzable groups of the organosilane are hydrolyzed, and partially condensed compounds such that the hydrolyzed compound is partially dehydration-condensed (hereinafter referred to as "organosilane condensate, etc.") For the film formed from aqueous dispersions for electrodeposition containing this organosilane condensate or the like, especially when it is thermally cured after electrodeposition, the organosilane condensate, etc. is crosslinked in the film, whereby the resulting film may have excellent mechanical, chemical and electric properties.

In the above described general formula (1), the organic group having 1 to 8 carbon atoms, which is represented by $R^1$, may include an alkyl group having a linear chain or branch, a halogen substituted alkyl group, a vinyl group, a phenyl group and a 3,4-epoxycyclohexylethyl group. Furthermore, $R^1$ may have a carbonyl group. Furthermore, $R^1$ is preferably an alkyl group or phenyl group having 1 to 4 carbon atoms.

In the above described general formula (1), the alkyl group having 1 to 5 carbon atoms or an acyl group having 1 to 6 carbon atoms, which is represented by $R^2$, includes a methyl group, an ethyl group, a n-propyl group, an isopropyl group, a n-butyl group, an isobutyl group, a sec-butyl group, a tert-butyl group, a n-pentyl group, an acetyl group, a propionyl group and a butyryl group. Furthermore, $R^2$ is preferably an alkyl group having 1 to 4 alkyl groups.

Examples of organosilanes that are preferably used include dimethyl methoxysilane, dimethyl diethoxysilane, isobutyl trimethoxysilane and phenyl triethoxysilane. For these organosilanes, only one type may be used, or two or more types may be used in combination.

Preferably, the above described "organosilane condensate, etc." forms complex particles with the above described organic particles in the aqueous dispersions for electrodeposition of the present invention. The "complex particles" are particles in which the compound constituting the above described organic particles and the organosilane condensate, etc. are chemically bonded together, or particles in which the organosilane condensate, etc. is adsorbed on the surfaces of or inside the above described organic particles.

The amount of this organosilane condensate, etc. to be used is preferably 0.1 to 500 parts by weight, further preferably 0.5 to 250 parts by weight with respect to 100 parts by weight of the above described organic particles. If the amount of organosilane condensate, etc. to be used is smaller than 0.1 parts by weight, it may be impossible to obtain a desired effect, and on the other hand, if the amount is larger than 500 parts by weight, adhesion of the film may be reduced.

These complex particles can be produced by the following method <<1>> or <<2>>, or the like. Furthermore, these methods may be used in combination.

<<1>> The above described organosilane is added to the emulsion of the above described organic particles to have at least part of the organosilane absorbed in the above described organic particles, followed by making hydrolysis and condensation reactions of this organosilane progress.

<<2>> A reaction is carried out to generate the above described organic particles in the presence of the above described organosilane condensate, etc. dispersed in the aqueous medium.

In order to have organosilane absorbed in organic particles in the above described method <<1>>, this may be done in accordance with a method in which organosilane is added in the emulsion, and is sufficiently stirred, and so on. At this time, preferably, 10% by weight or more (more preferably, 30% by weight or more) of added organosilane is absorbed in the particles. For avoiding the situation in which the hydrolysis/condensation reaction of organosilane proceeds when organosilane is not sufficiently absorbed yet, the pH of the reaction system may be controlled at 4 to 10, preferably 5 to 10, further preferably 6 to 8. The process temperature at which organosilane is absorbed in the organic particles is preferably 70° C. or lower, more preferably 50° C. or lower, further preferably 0 to 30° C. Process time is usually 5 to 180 minutes, preferably about 20 to 60 minutes.

The temperature at which absorbed organosilane is hydrolyzed/condensed is normally 30° C. or higher, preferably 50 to 100° C., more preferably 70 to 90° C., and polymerization time is preferably 0.3 to 15 hours, more preferably 1 to 8 hours.

Also, in the above described method <<2>>, the above described organosilane is mixed in the aqueous solution of strong acid emulsion such as alkyl benzenesulfonic acid using a homomixer, a supersonic mixer or the like to hydrolyze/condense the organosilane, whereby the organosilane condensate, etc. dispersed in a aqueous medium is obtained. The above described organic particles may be produced in the presence of this organosilane condensate, etc., preferably by emulsion polymerization.

Dielectric, Film of High Permittivity of Invention 1

The dielectric-forming composition according to Invention 1 may be used in production of dielectrics of high permittivity that are obtained by heating the dielectric-forming composition at a certain temperature or lower, directly or with additives added thereto as necessary. Also, the dielectric-forming composition may be used in production of dielectrics of high permittivity that are obtained by heating the dielectric-forming composition at a certain temperature or lower, in the form of the above described dielectric paste or as the above described aqueous dispersions for electrodeposition, with well known conventional additives blended therein as necessary. Also, the shape of the dielectric varies depending on the field in which they are used, and are not particularly limited, but the dielectric-forming composition according to the present invention is preferably used as a thin film of high permittivity.

Methods of Producing Dielectric or Film of High Permittivity

The dielectric of the present invention can be obtained by heating the dielectric-forming composition of Invention 1 at a temperature of 500° C. or lower, the heating temperature being preferably 100 to 500° C., further preferably 150 to 300° C. The method of producing a film of high permittivity will be described further in detail below.

(1) Case Where Film of High Permittivity Is Formed Using Dielectric Paste

For forming a film of high permittivity using a dielectric paste, for example, the dielectric paste is printed on a printed-wiring board or the like by a printing method such as screen printing, and the dielectric-forming composition is cured or baked by heating the same using an oven or the like, thus making it possible to obtain a film with a bump and circuit board pattern formed thereon.

In the case where the dielectric-forming composition is to be thermally cured, this can be done using the above described resin component of thermoset type (B1). In the case where the dielectric-forming composition is baked by heating, the above described resin component (B2) is preferably used. The heating temperature in this case can be 500° C. or lower, and is preferably 100 to 500° C., further preferably 150 to 300° C. The heating time is preferably in the range of from 1 minute to 24 hours, further preferably from 10 minutes to 12 hours.

In the case where the dielectric-forming composition is heated to be cured or baked, for the heating method, it can be heated by, for example, an oven, an infrared lamp, a hotplate or the like.

(2) Case Where Film of High Permittivity Is Formed Using Aqueous Dispersions for Electrodeposition The aqueous dispersions for electrodeposition of the present invention may be used in formation of a film of high permittivity, directly or in the diluted or concentrated form, and with well known conventional additives added thereto as appropriate. By a normal electrodeposition method using the aqueous dispersions for electrodeposition, composite particles for dielectrics and organic particles in the aqueous dispersions for electrodeposition can be electro-deposited on the surfaces of electrodes and the like to produce a film of high permittivity.

For producing the film of high permittivity of the present invention, it is desirable that the resin component of electro-deposited particles is further thermally cured. For conditions of the thermal curing, thermal curing is carried out at a temperature of 500° C. or lower, preferably 100 to 500° C., more preferably 150 to 300° C. The heating time is preferably in the range of from 5 minutes to 24 hours, further preferably from 10 minutes to 12 hours.

Properties of Dielectric or Film of High Permittivity

For the dielectric or film of high permittivity obtained from the dielectric-forming composition of Invention 1, it is desirable that the permittivity is 30 or greater, preferably 100 or greater, further preferably 150 or greater, particularly preferably 200 or greater, and the dielectric loss tangent is 0.1 or smaller, preferably 0.08 or smaller, further preferably 0.06 or smaller. Furthermore, the lower limit for the dielectric loss tangent is not specified.

Also, the volume resistivity of the dielectric or film of high permittivity may be preferably $10^{11}$ Ωcm or greater, more preferably $10^{12}$ Ωcm or greater. Also, the leakage current of this dielectric or film of high permittivity may be preferably $10^{-9}$ A/c m$^2$ or smaller, more preferably $10^{-10}$ A/cm$^2$ or smaller, further preferably $10^{-11}$ A/cm$^2$ or smaller.

Furthermore, the thickness of this film of high permittivity is preferably 50 µm or smaller, more preferably 30 µm or smaller. The lower limit for the film thickness is not specified, but is usually 1 µm or larger.

Methods of Forming Dielectric Layer with Conductive Foil According to Invention 1

The dielectric layer with a conductive foil of Invention 1 is such that a dielectric layer formed from the above described dielectric-forming composition of Invention 1 is provided on a conductive foil.

The conductive foil is not particularly limited as long as it has electrical conductivity, and may include foils made of copper, gold, silver, platinum, nickel, stainless, aluminum, iron and various kinds of alloys. Of these foils, foils made of copper, gold, silver, platinum, nickel and aluminum are particularly preferable in terms of oxidation resistance, electrical conductivity and flexibility. Also, a laminate of two or more conductive foils, or a board with foils laminated on a resin substrate or non-woven fabric resin impregnated substrate may be used as necessary. The thickness of these conductive foils is not particularly limited, but is usually in the range of from 5 to 75 μm, preferably from 8 to 50 μm, particularly preferably from 10 to 25 μm.

This dielectric layer with a conductive foil can be obtained by coating or electro-depositing the dielectric-forming composition on the conductive foil and drying, followed by coating an adhesive layer thereto and drying as necessary, and then heating at a temperature of 300° C. or lower, and the heating temperature is preferably 100 to 300° C., further preferably 150 to 280° C.

As described below, for the method of forming the dielectric layer with a conductive foil, there is the case where the aforementioned dielectric paste is used as the dielectric-forming composition and the case where the aforementioned aqueous dispersions for electrodeposition are used.

(1) Case Where Dielectric Layer Is Formed Using Dielectric Paste

<Preparation of Dielectric Paste>

The dielectric paste is prepared by a method similar to that described previously.

<Methods of Forming Dielectric Layer Using Dielectric Paste>

For forming a dielectric layer using the above described dielectric paste, for example, the dielectric paste is printed on a printed-wiring board or the like by a printing method such as screen printing, and the dielectric-forming composition is cured or baked by heating the same using an oven or the like, thus making it possible to obtain a dielectric layer with a bump and circuit board pattern formed thereon.

Specifically, the above described dielectric-forming composition of the above described Invention 1 is applied on the conductive foil and dried, and is thereafter heated at a temperature of 300° C. or lower, whereby a dielectric layer can be obtained, and the heating temperature is preferably 100 to 300° C., further preferably 150 to 280° C. The heating time is preferably in the range of from 1 minute to 24 hours, further preferably from 10 minutes to 12 hours.

In the case where the dielectric-forming composition is heated to be cured or baked, for the heating method, it can be heated by, for example, an oven, an infrared lamp, a hot plate or the like.

(2) Case Where Dielectric Layer Is Formed Using Aqueous Dispersions for Electrodeposition <Preparation of Aqueous Dispersions for Electrodeposition>

The aqueous dispersions for electrodeposition are prepared by a method similar to that described previously.

<Methods of Forming Dielectric Layer Using Aqueous Dispersions for Electrodeposition>

The above described aqueous dispersions for electrodeposition may be used in formation of the dielectric layer, directly or in the diluted or concentrated form. By a normal electrodeposition method using the aqueous dispersions for electrodeposition, inorganic particles or composite particles for dielectrics (A) and organic particles in the aqueous dispersions for electrodeposition can be electro-deposited on the surfaces of electrodes and the like to form a dielectric layer.

For forming the dielectric layer of the present invention, it is desirable that the resin component of electro-deposited particles be further thermally cured. For conditions of the thermal curing, thermal curing is carried out at a temperature of 300° C. or lower, preferably 100 to 300° C., more preferably 150 to 280° C. The heating time is preferably in the range of from 5 minutes to 24 hours, further preferably from 10 minutes to 12 hours.

(3) Coating of Adhesive Layer

In Invention 1, for improving adhesive strength when the dielectric layer with a conductive foil is laminated to a conductive substrate, this dielectric layer with a conductive foil can be coated with an adhesive layer after the dielectric layer with a conductive foil is formed. For the adhesive layer for use in the present invention, well known adhesive layers may be used, and the above described "resin (B) constituted of at least one of a polymerizable compound and a polymer" may be used. Also, for giving electrical conductivity to the adhesive layer as necessary, conductive metal flakes and carbon can be added. For the coating method, the above described printing method and the dip coat method may be used. The thickness of the adhesive layer is preferably 10 μm or smaller, further preferably 5 μm or smaller, particularly preferably 1 μm or smaller. In case where the thickness of the adhesive layer is larger than 10 μm, the permittivity may be reduced. Also, for improving adhesion at the time of lamination, it is preferable that the adhesive layer is coated when the dielectric layer is in an uncured state, and the dielectric layer is cured at the time of lamination.

Dielectric Layer with Conductive Foil Capable of Being Laminated (Invention 2)

The above described dielectric layer with a conductive foil may be a dielectric layer with a conductive foil capable of being laminated, comprising:

inorganic particles with the average particle size of 1 μm or smaller and permittivity of 100 or greater, or (A) composite particles for dielectrics with a conductive metal or a compound thereof, or a conductive organic compound or a conductive inorganic material deposited on part of the surfaces of the inorganic particles; and (B) a resin constituted of at least one of a polymerizable compound and a polymer, wherein a dielectric layer with thickness of 1 to 20 μm and permittivity of 30 or greater is provided on the conductive foil, with the dielectric layer formed of a dielectric-forming composition containing:

70% by weight or more of inorganic particles or (A); and

30% by weight or less of (B), when the total amount of the above described inorganic particles or (A) and (B) is 100% by weight.

Condenser Comprising Dielectric layer with Conductive Foil and Method of Forming The Same The condenser according to Invention 1 is characterized by comprising the above described dielectric layer with a conductive foil.

Specific aspects of the condenser according to the present invention and the method of forming the same will be described below based on the drawings. A specific dielectric layer 2 is provided on a conductive foil 1 (e.g. copper foil) by, for example, electrodeposition to form a dielectric layer of a conductive foil 3 of the present invention (FIG. 1A), and this dielectric layer with a conductive foil 3 and a conductive substrate 5 (e.g. CCL board (copper-clad laminate)) having conductive layers 4a and 4b are laminated together while heating the conductive substrate 5 in such a manner that the dielectric layer 2 contacts the conductive substrate 5 when the dielectric layer 2 is in an uncured state, and the dielectric layer 2 is cured (FIG. 1B), whereby the condenser according to the present invention can be formed. It is preferable that the lamination is carried out under reduced pressure as necessary. Also, in the case where the capacity of the condenser is changed to obtain a required capacitance on the circuit board, an upper conductive foil 1 is masked with a resist (e.g. DFR (dry film photoresist)) after the above described lamination, and is subjected to chemical etching, followed by patterning the conductive foil 1 by peeling off the resist (FIG. 1C), and then etching the same with a solvent dissolving the resin of the opened dielectric layer 2 (FIG. 1D), and subjecting the upper conductive layer 4a of the opened conductive substrate 5 to chemical etching (FIG. 1E), whereby the condenser according to the present invention can be formed.

In addition, the patterned dielectric layer with a conductive foil can be used to form the condenser, and in this case, a resist layer 7 is formed on a substrate 6, followed by patterning the same, and forming a conductive foil 8 in the opening of the resist by plating, for example (FIG. 2A). Then, a dielectric layer 9 is formed on the conductive foil 8 by, for example, electrodeposition to provide a patterned dielectric layer with a conductive foil (FIG. 2B). Thereafter, the above described patterned dielectric layer with a conductive foil is laminated to a conductive substrate 11 having conductive layers 10a and 10b (FIG. 2C), and is transferred to the conductive substrate 11 by peeling off the substrate 6 (FIG. 2D), and the upper conductive layer 10a of the opened conductive substrate 11 is subjected to chemical etching (FIG. 2E), thus making it possible to form the condenser.

The electrostatic capacity of the formed condenser can be 10 to 10000 pF/mm$^2$, preferably 20 to 5000 pF/mm$^2$, further preferably 30 to 3000 pF/mm$^2$. Also, the leakage current of the condenser is 10$^{-9}$ A/cm$^2$ or smaller, preferably 10$^{-10}$ A/cm$^2$ or smaller, further preferably 10$^{-11}$ A/cm$^2$ or smaller.

Compositions, etc. According to Inventions 3 and 4

<Resin Components (B), etc. for Use in Inventions 3 and 4>

(Resin Component According to Invention 3-1)

In the present invention (Invention 3-1), the resin component (B) is constituted of (C) alkali soluble resin, (D) ethylene based unsaturated group containing compound and (E) photopolymerization initiator. Furthermore, the dielectric-forming composition according to Inventions 3-1 and 3-2 is a photosensitive, which is hereinafter sometimes referred to as a photosensitive dielectric-forming composition.

(C) Alkali Soluble Resins

For the alkali soluble resin for use in the dielectric-forming composition according to Invention 3-1, a variety of resins may be used. Here, "alkali soluble" refers to the property of being dissolved by an alkaline developer, and specifically solubility enabling desired development processing to be carried out is acceptable.

Specific examples of the alkali soluble resin may include, for example, (meta) acryl based resins, hydroxystyrene resins, novolac resins and polyester resins.

Of these alkali soluble resins, (meta) acryl based resins are preferable, and those particularly preferable may include, for example, copolymers of carboxyl group-containing monomers (a) (hereinafter referred to also as "Monomer (a)") and other monomer (c) copolymerizable with the monomer (a) (hereinafter also referred to as "Monomer (c)"), or (meta) acryl resins such as copolymers of Monomer (a) and OH group-containing monomers (b) (hereinafter referred to also as "Monomer (b)") and Monomer (c).

The above Monomer (a) (carboxyl group-containing monomers) includes, for example, acrylic acid, methacrylic acid, maleic acid, fumaric acid, crotonic acid, itaconic acid, citraconic acid, mesaconic acid, cinnamic acid, mono (2-(meta) acryloiroxyethyl) succinate and ω-carboxy-polycaprolactone mono (meta) acrylate.

The above Monomer (b) (OH group-containing monomers) includes, for example, hydroxyl group-containing monomers such as 2-hydroxyethyl (meta) acrylate, 2-hydroxypropyl (meta) acrylate and 3-hydroxypropyl (meta) acrylate; and phenolic hydroxyl group-containing monomers such as o-hydroxystyrene, m-hydroxystyrene and p-hydroxystyrene.

The above Monomer (c) representing other monomer to copolymerizable monomers (a) includes, for example, (meta) acrylates other than Monomer (a) (Monomers (a) and (b) if Monomer (b) is included) such as methyl (meta) acrylate, ethyl (meta) acrylate, n-butyl (meta) acrylate, n-lauryl (meta) acrylate, benzyl (meta) acrylate, glycidyl (meta) acrylate and dicyclopentanyl (meta) acrylate;

aromatic vinyl based monomers such as styrene and α-methylstyrene;

conjugated dienes such as butadiene and isoprene; and macromonomers having polymerizable unsaturated groups such as a (meta) acryloyl group on one end of the polymer chain, such as polystyrene, methyl poly (meta) acrylate, ethyl poly (meta) acrylate and benzyl poly (meta) acrylate.

Copolymers of the above Monomer (a) and monomer (c), and copolymers of Monomer (a) and Monomer (b) and Monomer (c) have alkali solubility due to the presence of copolymerizing components originated from carboxyl group or phenolic hydroxyl group in Monomer (a) and/or Monomer (b). Above all, copolymers of Monomer (a) and Monomer (b) and Monomer (c) are particularly preferable in terms of dispersion stability of composite particles for dielectrics (A) and solubility in alkali developers described later. The content of copolymerizing component units originated from Monomer (a) in this copolymer is preferably 1 to 50% by weight, particularly preferably 5 to 30% by weight, the content of copolymerizing component units originated from Monomer (b) is preferably 1 to 50% by weight, particularly preferably 5 to 30% by weight, and the content of copolymerizing component units originated from Monomer (c) is preferably 1 to 98% by weight, particularly preferably 40 to 90% by weight. Also, Monomer (b) components are preferably hydroxyl group-containing monomers such as 2-hydroxyethyl (meta) acrylate, 2-hydroxypropyl (meta) acrylate and 3-hydroxypropyl (meta) acrylate.

The molecular weight of alkali soluble resin (C) constituting the dielectric-forming composition is preferably 5,000 to 5,000,000, further preferably 10,000 to 300,000 as polystyrene equivalent weight average molecular weight by GPC (hereinafter also referred to simply as "weight average molecular weight (Mw)").

The content of alkali soluble resin (C) in the dielectric-forming composition is usually 1 to 500 parts by weight, preferably 5 to 500 parts by weight, further preferably 10 to 500 parts by weight, more preferably 10 to 200 parts by weight, with respect to 100 parts by weight of composite particles for dielectrics (A). Furthermore, resins other than alkali soluble resins, such as polyimide resin, bismaleimide resin and epoxy resin may be contained in the dielectric-forming composition.

(D) Ethylene Based Unsaturated Group-Containing Compounds

The ethylene based unsaturated group-containing compound (D) constituting the dielectric-forming composition according to Invention 3-1 is not particularly limited as long as it is a compound that contains an ethylene based unsaturated group and can undergo a radical polymerization reaction by a photopolymerization initiator (E) described later, but a (meta) acrylate compound is usually used as such a compound.

Specific examples of such (meta) acrylate compounds may include:

di (meta) acrylates of alkylene glycol such as ethylene glycol and propylene glycol; and di (meta) acrylates of polyalkylene glycol such as polyethylene glycol and polypropylene glycol, di (meta) acrylates of double end hydroxylated polymers such as double end hydroxy polybutadiene, double end hydroxy polyisoprene and double end hydroxy polycaprolactone;

poly (meta) acrylates of polyvalent alcohols having three or more valences such as glycerin, 1,2,4-butanetriol, trimethylol alkane, tetramethylol alkane, pentaerythrytol and dipentaerythrytol; poly (meta) acrylates of polyalkylene glycol adducts of polyvalent alcohols having three or more valences; and poly (meta) acrylates of cyclic polyols such as 1,4-cyclohexanediols and 1,4-benzenediols; and oligo (meta) acrylates such as polyester (meta) acrylate, epoxy (meta) acrylate, urethane (meta) acrylate, alkyd resin (meta) acrylate, silicone resin (meta) acrylate and spirane resin (meta) acrylate. Furthermore, for (meta) acrylate compounds, compounds represented by Monomers (a), (b) and (c) constituting the aforementioned alkali soluble resin (B) may be used, in addition to the compounds described above.

The ethylene based unsaturated group-containing compound (D) including these (meta) acrylate compounds may be used alone or in combination of two or more types, and is usually used in the amount of 20 to 500 parts by weight, preferably 20 to 480 parts by weight, more preferably 40 to 250 parts by weight, particularly preferably 40 to 200 parts by weight, with respect to 100 parts by weight of the alkali soluble resin (C) described previously.

(E) Photopolymerization Initiators

The photopolymerization initiator (E) constituting the dielectric-forming composition according to Invention 3-1 is not particularly limited as long as it is a compound that generates radicals in the exposure step described later, and initiates the polymerization reaction of the ethylene based unsaturated group-containing compound (D) described previously.

Specific examples of the photopolymerization initiator may include:

carbonyl compounds such as benzyl, benzoin, benzophenon, Michler's ketone, 4,4'-bisdiethyl aminobenzophenon, camphaquinone, 2-hydroxy-2-methyl-1-phenylpropane-1-on, 1-hydroxycyclohexylphenylketone, 2,2-dimethoxy-2-phenylacetophenon, 2-methyl-[4'-(methylthio) phenyl]-2-morpholino-1-propanone, 2-benzyl-2-dimethylamino-1-(4-morpholinophenyl)-butane-1-on, 2,4-diethylthioxanthone and isopropylthioxanthone;

phosphine oxide compounds such as bis (2,6-dimethoxybenzoyl)-2,4,4-trimethylpentyl phosphine oxide and bis (2,4,6-trimethylbenzoyl)-phenyl phosphine oxide;

azo compounds or azide compounds such as azoisobutylonitrile and 4-azidobenzaldehyde;

organosulfur compounds such as mercaptan disulfide;

organic peroxides such as benzoyl peroxide, di-tert-butyl peroxide, tert-butyl hydroperoxide, cumene hydroperoxide and paramethane hydroperoxide;

trihalomethanes such as 2,4-bis (trichloromethyl)-6-(2'-chlorophenyl)-1,3,5-triazine and 2-[2-(2-furanyl) ethylenyl]-4,6-bis (trichloromethyl)-1,3,5-triazine; and imidazole dimers such as 2,2'-bis (2-chlorophenyl)-4,5,4',5'-tetraphenyl-1,2-biimidazole, and they may be used alone or in combination of two or more types. Also, a sensitizer, a sensitizing aid, a hydrogen donator, a chain transfer agent and the like may be used along with the photopolymerization initiator (E).

The content of photopolymerization initiator (E) is usually 0.1 to 100 parts by weight, preferably 1 to 50 parts by weight with respect to 100 parts by weight of the total amount of the above described alkali soluble resin (C) and ethylene based unsaturated group-containing compound (D).

(Resin Component, etc. According to Invention 3-2)

(F) Resins Capable of undergoing Alkali Development

For the resin capable of undergoing alkali development (F) for use in the dielectric-forming composition of Invention 3-2, a variety of resins may be used. Here, "capable of undergoing alkali development" refers to the property of being dissolved by an alkaline developer, and specifically solubility enabling desired development processing to be carried out is acceptable.

Specific examples the alkali soluble resin may include for example, (meta) acryl based resins, hydroxy styrene resins, novolac resins, polyester resins, polyimide resins, nylon resins and polyetherimide resins.

Of these alkali soluble resins, (meta) acryl based resins are preferable, and those particularly preferable may include, for example, copolymers of carboxyl group-containing monomers (a) (hereinafter referred to also as "Monomer (a)") and other monomer (c) copolymerizable to the monomers (a) (hereinafter also referred to as "Monomer (c)"), or (meta) acryl resins such as copolymers of Monomer (a) and epoxy group-containing monomers (b) (hereinafter referred to also as "Monomer (b)") and Monomer (c).

The above Monomer (a) (carboxyl group-containing monomers) includes, for example, acrylic acid, methacrylic acid, maleic acid, fumaric acid, crotonic acid, itaconic acid, citraconic acid, mesaconic acid, cinnamic acid, mono (2-(meta) acryloiroxyethyl) succinate and ω-carboxy-polycaprolactone mono (meta) acrylate.

The above Monomer (b) (epoxy group-containing monomers) includes, for example, glycidyl acrylate, glycidyl methacrylate, glycidyl α-ethylacrylate, glycidyl α-n-propylacrylate, glycidyl α-n-butylacrylate, acrylic acid-3,4-epoxybutyl, methacrylic acid-3,4-epoxybutyl, acrylic acid-6,7-epoxyheptyl, methacrylic acid-6,7-epoxyheptyl, α-ethyl acrylate-6,7-epoxyheptyl, N-[4-(2,3-epoxypropoxy)-3,5- dimethylbenzyl] acrylamide, and N-[4-(2,3-epoxypropoxy)-3,5-dimethylphenylpropyl] acrylamide.

The above Monomer (c) representing other monomer copolymerizable to monomers (a) includes, for example, monomers such as methyl (meta) acrylate, ethyl (meta) acrylate, n-butyl (meta) acrylate, n-lauryl (meta) acrylate, benzyl (meta) acrylate and dicyclopentanyl (meta) acrylate, and (meta) acrylates other than Monomer (a) and (b), in case where Monomer (b) is included;

aromatic vinyl based monomers such as styrene and α-methylstyrene;

conjugated dienes such as butadiene and isoprene; and macromonomers having polymerizable unsaturated groups such as a (meta) acryloyl group on one end of the polymer chain, such as polystyrene, methyl poly (meta) acrylate, ethyl poly (meta) acrylate and benzyl poly (meta) acrylate.

Copolymers of the above Monomer (a) and monomer (c), and copolymers of Monomer (a) and Monomer (b) and Monomer (c) have alkali solubility due to the presence of copolymerizing components originated from carboxyl group or phenolic hydroxyl group-containing monomers of Monomer (a) and/or Monomer (b). Above all, copolymers of Monomer (a) and Monomer (b) and Monomer (c) are particularly preferable in terms of dispersion stability of composite particles for dielectrics (A) and solubility in alkali developers described later. The content of copolymerizing component units originated from Monomer (a) in this copolymer is preferably 1 to 50% by weight, particularly preferably 5 to 30% by weight, the content of copolymerizing component units originated from Monomer (b) is preferably 10 to 70% by weight, particularly preferably 20 to 50% by weight, and the content of copolymerizing component units originated from Monomer (c) is preferably 1 to 98% by weight, particularly preferably 40 to 90% by weight.

The molecular weight of resin capable of undergoing alkali development (F) constituting the photosensitive dielectric-forming composition is preferably 5,000 to 5,000, 000, further preferably 10,000 to 300,000 as polystyrene equivalent weight average molecular weight by GPC (hereinafter also referred to simply as "weight average molecular weight (Mw)").

The content of resin capable of undergoing alkali development (F) in the photosensitive dielectric-forming composition is usually 1 to 500 parts by weight, preferably 10 to 500 parts by weight, preferably 10 to 200 parts by weight, with respect to 100 parts by weight of composite particles for dielectrics (A). Furthermore, resins other than resin capable of undergoing alkali developments, such as bismaleimide resin and epoxy resin may be contained in the photosensitive dielectric-forming composition.

(G) Photosensitive Acid Producing Compounds

The photosensitive acid producing compound (G) for use in Invention 3-2 is a compound producing an acid by exposure to a radiation. The compound may include, for example, 1,2-benzoquinonediazide sulfonate, 1,2-naphthoquinonediazide sulfonate, 1,2-benzoquinonediazide sulfonic acid amide and 1,2-naphthoquinonediazide sulfonic acid amide. Specifically, the compound may include 1,2-quinonediazide compounds described in "Light-sensitive Systems" by J. Kosar, 339–352 (1965), John Wiley & Sons Co., Ltd. (New York) and "Photoresist" by W. S. De Forest, 50 (1975), McGraw-Hill, Inc. (New York).

Of these compounds, particularly preferable may be compounds having good transparency in the visible light range of 400 to 800 nm after exposure to a radiation, for example 1,2-benzoquinonediazide-4-sulfonate such as 2,3,4-trihydroxybenzophenon, 2,3,4,4'-tetrahydroxybenzophenon, 3'-methoxy-2,3,4,4'-tetrahydroxybenzophenon, 3'-methyl-2',4,4'-trihydroxytriphenylmethane, 4,4'-[1-[4-(1-(4-hydroxyphenyl)-1-methylethyl) phenyl] ethylidene] diphenol and 2,4,4-trimethyl-2',4',7-trihydroxy-2-phenylflavane, 1,2-naphtoquinonediazide-4-sulfonate or 1,2-naphtoquinonediazide-5-sulfonate.

The amount of photosensitive acid producing compound to be added is preferably 5 to 100 parts by weight, particularly preferably 10 to 50 parts by weight with respect to 100 parts by weight of resin capable of undergoing alkali development (F). If the amount is smaller than 5 parts by weight, the amount of acid produced by absorption of the radiation is reduced, thus raising a possibility that the solubility in the alkali aqueous solution cannot be varied before and after exposure to the radiation, and therefore it is difficult to conduct patterning, causing deterioration in heat resistance of the pattern obtained from the composition. Also, if the amount is larger than 100 parts by weight, the effect of insolubilization in the alkali aqueous solution may be so strong that it is difficult to carry out development because most of the added photosensitive acid producing compound still remains in its original form in the case of short-time exposure to the radiation.

(H) Hydrolyzable Silane Compounds

In the dielectric-forming composition of Invention 3-3, or the photosensitive dielectric-forming composition with which the photo acid generator (I) is used in combination, "(H) at least one compound selected from the group consisting of hydrolyzable silane compounds, hydrolysates thereof and condensates thereof" is used as the resin compound (B). Such a compound (H) is at least one compound selected from the group consisting of hydrolyzable silane compounds expressed by the following general formula [1], hydrolysates thereof and condensates thereof.

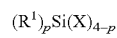

$$(R^1)_p Si(X)_{4-p} \quad [1]$$

(In the general formula [1], $R^1$ represents a non-hydrolyzable organic group having 1 to 12 carbon atoms. In addition, X represents a hydrolyzable group, and p is an integer number of 0 to 3. Furthermore, if the coefficient [p] of the $R^1$ and the coefficient [4−p] of X described above are each equal to or greater than 2, the groups represented by $R^1$ and the groups represented by X, respectively, may or may not be the same.).

p in the above general formula [1] represents an in integer number of 0 to 3, preferably an integer number of 0 to 2, more preferably 1.

$R^1$ in the above general formula [1] represents a non-hydrolyzable monovalent organic group having 1 to 12 carbon atoms. Here, "non-hydrolyzable" means the property of existing with stability under the condition in which the above "hydrolyzable group X" in the above general formula [1] is hydrolyzed. As this non-hydrolyzable organic group, a non-polymerizable organic group and/or polymerizable organic group may be selected. Furthermore, this organic group may contain other atoms such as a hetero atom as long as the group has 1 to 12 carbon atoms.

The above non-polymerizable organic group includes alkyl groups, aryl groups and aralkyl groups. They may be strait-chain, branched or cyclic groups or combinations thereof. Also, the above non-polymerizable organic group having other atoms such as a hetero atom includes, for example, groups containing ether, ester, sulfide and the like as structural units, and in addition thereto, nonafluorobutylethyl groups. In case where the organic group contains a hetero atom, however, it is preferably a nonbasic group because the nonbasic group does not hinder the photo curability of the composition.

Also, the above polymerizable organic group is preferably an organic group having per molecule a radical polymerizable functional group and/or cation polymerizable functional group such as a vinyl group, an oxetane group and an epoxy group. Introduction of such a functional group in a group represented by $R^1$ is preferable because it enables the dielectric-forming composition and photosensitive dielectric-forming composition to be cured more speedily using radical polymerization and cation polymerization in combination. In particular, introduction of a cation polymerizable functional group such as an oxetane group and an epoxy group in a group represented by $R^1$ is preferable because it enables the curing reactions of these groups to occur concurrently, and as a result, the dielectric-forming composition and photosensitive dielectric-forming composition can be cured more speedily. Here, in the above general formula [1], if the number of groups represented by $R^1$ described above is two to three, the groups represented by $R^1$ may be or may not be the same.

In the above general formula [1], the "hydrolyzable group X" described above refers to a group capable of being hydrolyzed to produce a silanol group or to produce siloxane condensate, by heating usually at a temperature in the range of from room temperature (25° C.) to 100° C., in the presence of excessive amount of water under non-catalytic conditions. The "hydrolyzable group X" described above includes, for example, a hydrogen atom, and organic groups such as alkoxyl groups having 1 to 12 carbon atoms (methoxy group, ethoxy group, etc.), halogen atoms (fluorine, chlorine, bromine, iodine, etc.), amino groups (amino group, dimethylamino group, etc.) and carboxyl groups (acetoxy group, butyloyloxy group, etc.). Here, in the above general formula [1], if the number of groups represented by the "hydrolyzable group X" described above is two to four, the groups represented by the "hydrolyzable group X" may or may not be the same. Also, as the "hydrolyzable group X", a non-polymerizable organic group and/or polymerizable organic group may be selected.

Specific examples of hydrolyzable silane compounds represented by the above general formula [1] may include those described below.

The hydrolyzable silane compound substituted with four hydrolyzable groups X includes tetrachloro silane, tetraamino silane, tetraacetoxy silane, tetramethoxy silane, tetraethoxy silane, tetrabutoxy silane, tetraphenoxy silane, tetrabenzyloxy silane, trimethoxy silane and triethoxy silane.

Also, the hydrolyzable silane compound having a non-polymerizable organic group $R^1$ may include (1) silane compounds each substituted with three hydrolyzable groups such as methyltrichloro silane, methyltrimethoxy silane, methyltriethoxy silane, methyltributoxy silane, ethyltrimethoxy silane, ethyltriisopropoxy silane, ethyltributoxy silane, butyltrimethoxy silane, pentafluorophenyltrimethoxy silane, phenyltrimethoxy silane, d3-methyltrimethoxy silane, nonafluorobutylethyltrimethoxy silane and trifluoromethyltrimethoxy silane, (2) silane compounds each substituted with two hydrolyzable groups such as dimethyldichloro silane, dimethyldiamino silane, dimethyldiacetoxy silane, dimethyldimethoxy silane, diphenyldimethoxy silane and dibutyldimethoxy silane, and (3) silane compounds each substituted with one hydrolyzable group such as trimethylchloro silane, hexamethyldisilazan, trimethyl silane, tributyl silane, trimethyl ethoxy silane and tributylethoxy silane.

On the other hand, examples of the hydrolyzable silane compound having the polymerizable organic group $R^1$ may include (meta) acryloxypropyltrimethoxy silane, vinyltrimethoxy silane, glycidyloxytrimethoxy silane, 3-(3-methyl-3-oxetanemethoxy) propyltrimethoxy silane and oxacyclohexyltrimethoxy silane.

Also, examples of the silane compound having the hydrolyzable group X having polymerizability may include tetra (meta) acryloxy silane, tetracys [2-(meta) acryloxyethoxy] silane, tetraglycidyloxy silane, tetracys (2-vinyloxyethoxy) silane, tetracys (2-vinyloxybutoxy) silane, tetracys (3-methyl-3-oxetanemethoxy) silane, methyltri (meta) acryloxy silane, methyl [2-(meta) acryloxyethoxy] silane, methyltriglycidyloxy silane and methyltris (3-methyl-3-oxetane methox) silane. They may be used alone or in combination of two or more types.

In addition, the "hydrolyzable silane compound" described above does not necessarily need to be hydrolyzed at the time when the dielectric-forming composition and photosensitive dielectric-forming composition according to Invention 3-3 are blended, and it is only necessary that at least part of hydrolyzable groups should be hydrolyzed at the time of exposure to light. That is, in the case where a photo-curing composition is prepared without hydrolyzing in advance the "hydrolyzable silane compound" described above, water is added in advance and the hydrolyzable group is hydrolyzed to produce a silanol group, thereby making it possible to photo-cure this photo-curing composition to form a nonconductive pattern.

Also, the above "hydrolysate of hydrolyzable silane compound and condensate thereof" is a compound in which the "hydrolyzable group X" described above is changed to a silanol group by a hydrolysis reaction, and a condensate thereof. In this case, part of the "hydrolyzable group X" described above remains without being hydrolyzed, and in that case, a mixture of the hydrolyzable silane compound and a hydrolysate is provided. In addition, a partial condensate with some of silanol groups condensed together may be contained.

Also, the molecular weight of the above "hydrolysate of hydrolyzable silane compound and condensate thereof" may be measured as polystyrene equivalent weight average molecular weight using gel permeation chromatography (hereinafter referred to as "GPC" in abbreviated form) with tetrahydrofuran used for the mobile phase. This weight average molecular weight is preferably in the range of from 500 to 10000, more preferably from 1000 to 5000. This range of weight average molecular weight is preferable because the weight average molecular weight of 500 or greater in the hydrolysate enables the deposition property of the dielectric layer to be improved, and the weight average molecular weight of 10000 or smaller enables the curability to be improved.

(I) Photo Acid Generator

The above "(I) photo acid generator" of the photosensitive dielectric-forming composition of Invention 3-3 is a compound capable of emitting an acidic active substance that can photo-cure (crosslink) "(H) at least one compound selected from the group consisting of hydrolyzable silane compounds expressed by the general formula [1], hydrolysates thereof and condensates thereof" described above. Light energy rays that are applied for decomposing this photo acid generator to generate cations may include visible light, ultraviolet light, infrared rays, X rays, α rays, β rays and γ rays. Of these, ultraviolet light is preferable because the exposure equipment is relatively simple and photosensitivity is high.

The above "photo acid generator" may include, for example, onium salts having the structure expressed by the general formula [2] (hereinafter referred to as "first group compounds") and sulfonic acid derivatives having the structure expressed by the general formula [3] (hereinafter referred to as "second group compounds").

$$[R^2_a R^3_b R^4_c R^5_d W]^{+m}[MZ_{m+n}]^{+m} \quad [2]$$

$$Q_s\text{—}[S(\!=\!O)_2\text{—}R^6]t \quad [3]$$

In the above general formula [2], cations are onium ions. Also, $R^2$, $R^3$, $R^4$ and $R^5$ are the same or different organic groups, and specifically include, for example, alkyl groups, aryl groups and aralkyl groups. In addition, W represents S, Se, Te, P, As, Sb, Bi, O, I, Br, Cl or —N≡N. Also, a, b, c and d represent an integer number of 0 to 3, respectively, and (a+b+c+d) equals the valent number of W. Also, M represents a metal or metalloid constituting a central element of the complex $[MZ_{m+n}]$, which is, for example, B, P, As, Sb, Fe, Sn, Bi, Al, Ca, In, Ti, Zn, Sc, V, Cr, Mn or Co. Z represents a halogen atom such as F, Cl and Br, for example, or an aryl group, m represents the net electric charge of the $[MZ_{m+n}]$ complex ion, and n represents the valence of M.

Onium salts of the above first group compounds are compounds capable of emitting an acidic active substance by receiving a light. Of these first group compounds, more effective onium salts are aromatic onium salts, and more preferable are diaryl iodonium salts expressed by the general formula [4] described below.

$$[R^7\text{—}Ar^1\text{—}I^+\text{—}Ar^2\text{—}R^8][Y^-] \quad [4]$$

In the above general formula [4], $R^7$ and $R^8$ represent same or different monovalent organic groups, and at least one of $R^7$ and $R^8$ has an alkyl group having four or more carbon atoms. Also, $Ar^1$ and $Ar^2$ represent same or different aromatic groups. In addition, $Y^-$ represents a monovalent anion, and is selected from fluoride an ions of III and V groups, $ClO^{4-}$, $CF^{3-}$ and $SO^{3-}$.

In the above general formula [3], Q represents a monovalent or bivalent organic group, and $R^6$ represents a monovalent organic group having 1 to 12 carbon atoms. In addition, s represents an integer number of 0 or 1, and t represents an integer number of 1 or 2. Sulfonic acid derivatives expressed by the above general formula [3] include disulfones, disulfonyl diazomethanes, disulfonylmethanes, sulfonyl benzoylmethanes, imide sulfonates, benzoyl sulfonates, sulfonates of 1-oxy-2-hydroxy-3-propyl alcohol, pyrogallol trisulfonates and benzyl sulfonates. Of these, imide sulfonates are preferable, and of imide sulfonates, trifluoromethyl sulfonate derivatives are particularly preferably used.

The added amount (content) of "(I) photo acid generator" described above is not particularly limited, but it is usually preferably in the range of from 0.1 to 15 parts by weight, more preferably from 1 to 10 parts by weight with respect to 100 parts by weight of "(H) at least one compound selected from the group consisting of hydrolyzable silane compounds expressed by the general formula [1], hydrolysates thereof and condensates thereof" described above. If the added amount of "(I) photo acid generator" described above is 0.1 parts by weight or larger, reduction in photo-curing can be prevented to ensure a sufficient curing speed, which is preferable. Also, if the added amount of "(I) photo acid generator" described above is 15 parts by weight or smaller, reduction in weather resistance and heat resistance of the resulting cured material can be prevented, which is preferable.

(K) Solvents

Solvents (K) are contained as necessary in the dielectric-forming composition or photosensitive dielectric-forming composition according to Inventions 3-1, 3-2 and 3-3. The above solvents (K) are preferably solvents that have good affinity with the composite particles for dielectrics (A) and good solubility with the alkali soluble resin (C), the ethylene based unsaturated group-containing compound (D), the photopolymerization initiator (E) or the resin capable of undergoing alkali development (F), the photosensitive acid producing compound (G), the compound (H), the photo acid generator (I) and various kinds of additives (L) added as necessary as described later, can provide the photosensitive dielectric-forming composition with appropriate viscosity, and can easily be evaporated by drying.

Examples of such solvents may include:

ketones such as diethyl ketone, methyl butyl ketone, dipropyl ketone and cyclohexanone;

alcohols such as n-pentanol, 4-methyl-2-pentanol, cyclohexanol and siacetone alcohol;

ether based alcohols such as ethylene glycol monomethylether, ethylene glycol monoethylether, ethylene glycol monobutylether, propylene glycol monomethylether and propylene glycol monoethylether;

saturated aliphatic mono carboxylic acid alkyl esters such as acetic acid-n-butyl and amyl acetate;

lactates such as ethyl lactate and lactic acid-n-butyl; and ether based esters such as methyl Cellosolve acetate, ethyl cellosolve acetate, propylene glycol monomethylether acetate and ethyl-3-ethoxypropionate, and they may be used alone or in combination of two or more types.

The content of solvent (K) in the dielectric-forming composition may be selected as appropriate so that desired flowability can be obtained, but the content is usually 1 to 10,000 parts by weight, preferably 10 to 1,000 parts by weight with respect to 100 parts by weight of composite particles for dielectrics (A).

(L) Various Kinds of Additives

The dielectric-forming composition according to Invention 3 may contain, in addition to the above components, a various kinds of additives as optional components such as a plasticizer, a bonding aid, a dispersant, a bulking agent, a preservation stabilizing agent, an antifoaming agent, an antioxidant, an ultraviolet absorber, a leveling agent and a development promoter.

<<1>> Bonding Aids

For the bonding aid, silane coupling agents [saturated alkyl group containing (alkyl) alkoxysilane] such as compounds expressed by the formula (1) described below are suitably used.

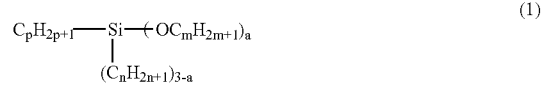

(In the above formula, p represents an integer number of 3 to 20, m represents an integer number of 1 to 3, n represents an integer number of 1 to 3, and a represents an integer number of 1 to 3.)

In the above formula (1), p indicating the number of carbons of the saturated alkyl group is an integer number of 3 to 20, preferably an integer number of 4 to 16.

Specific examples of silane coupling agents expressed, by the above formula (1) may include saturated alkyl dimethylmethoxy silanes (a=1, m=1, n=1) such as n-propyl dimethylmethoxy silane, n-butyl dimethylmethoxy silane, n-decyl dimethylmethoxy silane, n-hexadecyl dimethylmethoxy silane and n-icosane dimethylmethoxy silane;

saturated alkyl diethylmethoxy silanes (a=1, m=1, n=2) such as n-propyl diethylmethoxy silane, n-butyl diethylmethoxy silane, n-decyl diethylmethoxy silane, n-hexadecyl diethylmethoxy silane and n-icosane diethylmethoxy silane;

saturated alkyl dipropylmethoxy silanes (a=1, m=1, n=3) such as n-butyl dipropylmethoxy silane, n-decyl dipropylmethoxy silane, n-hexadecyl dipropylmethoxy silane and n-icosane dipropylmethoxy silane;

saturated alkyl dimethylethoxy silanes (a=1, m=2, n=1) such as n-propyl dimethylethoxy silane, n-butyl dimethylethoxy silane, n-decyl dimethylethoxy silane, n-hexadecyl dimethylethoxy silane and n-icosane dimethylethoxy silane;

saturated alkyl diethylethoxy silanes (a=1, m=2, n=2) such as n-propyl diethylethoxy silane, n-butyl diethylethoxy silane, n-decyl diethylethoxy silane, n-hexadecyl diethylethoxy silane and n-icosane diethylethoxy silane;

saturated alkyl dipropylethoxy silanes (a=1, m=2, n=3) such as n-butyl dipropylethoxy silane, n-decyl dipropylethoxy silane, n-hexadecyl dipropylethoxy silane and n-icosane dipropylethoxy silane;

saturated alkyl dimethylpropoxy silanes (a=1, m=3, n=1) such as n-propyl dimethylpropoxy silane, n-butyl dimethylpropoxy silane, n-decyl dimethylpropoxy silane, n-hexadecyl dimethylpropoxy silane and n-icosane dimethylpropoxy silane;

saturated alkyl diethylpropoxy silanes (a=1, m=3, n=2) such as n-propyl diethylpropoxy silane, n-butyl diethylpropoxy silane, n-decyl diethylpropoxy silane, n-hexadecyl diethylpropoxy silane and n-icosane diethylpropoxy silane;

saturated alkyl dipropylpropoxy silanes (a=1, m=3, n=3) such as n-butyl dipropylpropoxy silane, n-decyl dipropylpropoxy silane, n-hexadecyl dipropylpropoxy silane and n-icosane dipropylpropoxy silane;

saturated alkyl methyldimethoxy silanes (a=2, m=1, n=1) such as n-propyl methyldimethoxy silane, n-butyl methyldimethoxy silane, n-decyl methyldimethoxy silane, n-hexadecyl methyldimethoxy silane and n-icosane methyldimethoxy silane;

saturated alkyl ethyldimethoxy silanes (a=2, m=1, n=2) such as n-propyl ethyldimethoxy silane, n-butyl ethyldimethoxy silane, n-decyl ethyldimethoxy silane, n-hexadecyl ethyldimethoxy silane and n-icosane ethyldimethoxy silane;

saturated alkyl propyldimethoxy silanes (a=2, m=1, n=3) such as n-butyl propyldimethoxy silane, n-decyl propyldimethoxy silane, n-hexadecyl propyldimethoxy silane and n-icosane propyldimethoxy silane;

saturated alkyl methyldiethoxy silanes (a=2, m=2, n=1) such as n-propyl methyldiethoxy silane, n-butyl methyldiethoxy silane, n-decyl methyldiethoxy silane, n-hexadecyl methyldiethoxy silane and n-icosane methyldiethoxy silane;

saturated alkyl ethyldiethoxy silanes (a=2, m=2, n=2) such as n-propyl ethyldiethoxy silane, n-butyl ethyldiethoxy silane, n-decyl ethyldiethoxy silane, n-hexadecyl ethyldiethoxy silane and n-icosane ethyldiethoxy silane;

saturated alkyl propyldiethoxy silanes (a=2, m=2, n=3) such as n-butyl propyldiethoxy silane, n-decyl propyldiethoxy silane, n-hexadecyl propyldiethoxy silane and n-icosane propyldiethoxy silane;

saturated alkyl methyldipropoxy silanes (a=2, m=3, n=1) such as n-propyl methyldipropoxy silane, n-butyl methyldipropoxy silane, n-decyl methyldipropoxy silane, n-hexadecyl methyldipropoxy silane and n-icosane methyldipropoxy silane;

saturated alkyl ethyldipropoxy silanes (a=2, m=3, n=2) such as n-propyl ethyldipropoxy silane, n-butyl ethyldipropoxy silane, n-decyl ethyldipropoxy silane, n-hexadecyl ethyldipropoxy silane and n-icosane ethyldipropoxy silane;

saturated alkyl propyldipropoxy silanes (a=2, m=3, n=3) such as n-butyl propyldipropoxy silane, n-decyl propyldipropoxy silane, n-hexadecyl propyldipropoxy silane and n-icosane propyldipropoxy silane;

saturated alkyl trimethoxy silanes (a=3, m=1) such as n-propyl trimethoxy silane, n-butyl trimethoxy silane, n-decyl trimethoxy silane, n-hexadecyl trimethoxy silane and n-icosane trimethoxy silane;

saturated alkyl triethoxy silanes (a=3, m=2) such as n-propyl triethoxy silane, n-butyl triethoxy silane, n-decyl triethoxy silane, n-hexadecyl triethoxy silane and n-icosane triethoxy silane; and saturated alkyl tripropoxy silanes (a=3, m=3) such as n-propyl tripropoxy silane, n-butyl tripropoxy silane, n-decyl tripropoxy silane, n-hexadecyl tripropoxy silane and n-icosane tripropoxy silane, and they may be used alone or in combination of two or more types.

Of these particularly preferable are n-butyl trimethoxy silane, n-decyl trimethoxy silane, n-hexadecyl trimethoxy silane, n-decyl dimethylmethoxy silane, n-hexadecyl dimethylmethoxy silane, n-butyl triethoxy silane, n-decyl triethoxy silane, n-hexadecyl triethoxy silane, n-decylethyl diethoxy silane, n-hexadecyl ethyldiethoxy silane, n-butyl tripropoxy silane, n-decyl tripropoxy silane, n-hexadecyl tripropoxy silane and the like.

The content of bonding aid in the dielectric-forming composition is 0.001 to 10 parts by weight, further preferably 0.001 to 5 parts by weight with respect to 100 parts by weight of composite particles for dielectrics (A).

<<2>> Dispersants

For the dispersant for composite particles for dielectrics (A), fatty acids are preferably used, and in particular, fatty acids having 3 to 30 carbon atoms, preferably 4 to 30 carbon atoms, further preferably 4 to 20 carbon atoms are used. Preferred specific examples of the above fatty acids may include:

saturated fatty acids such as malonic acid, octanoic acid, undecylic acid, lauric acid, myristic acid, palmitic acid, pentadecanoic acid, stearic acid and arachic acid;

unsaturated fatty acids such as fumaric acid, itaconic acid, citraconic acid, elaidic acid, oleic acid, linoleic acid, linolenic acid and arachidonic acid; and aromatic fatty acids such as phthalic acid, and they may be used alone or in combination of two or more types.

The content of dispersant in the dielectric-forming composition is preferably 0.001 to 10 parts by weight, preferably 0.01 to 5 parts by weight with respect to 100 parts by weight of composite particles for dielectrics (A).

<<3>> Bulking Agents

The dielectric-forming composition of Invention 3 may further contain a bulking agent in addition to the above described components. Additives for improving permittivity as such a bulking agent include carbon powders (examples: acetylene black, Ketjenblack, etc.), conductive fine particles such as graphite powders, and semiconductor based fine particles such as silicon carbide powders. In the case where bulking agents for improving permittivity are added, their content is preferably 0 to 10% by weight, further preferably 0.5 to 10% by weight, particularly preferably 1 to 5% by weight in Inventions 3-1 and 3-3, and preferably 0 to 10% by weight, further preferably 0.05 to 3% by weight, particularly preferably 0.1 to 1% by weight in Invention 3-2.

<<4>> Plasticizers

The plasticizer is added to allow the formed photosensitive transfer layer to have satisfactory plasticity. Therefore, the plasticizer is preferably used when the dielectric-forming composition of Invention 3 is used in the photosensitive transfer film of Invention 4.

For the plasticizer, specifically, compounds expressed by the following formula (1) or (2) is preferably used because they are easily decomposed away by heat, and do not advertently affect the performance of the obtained pattern.

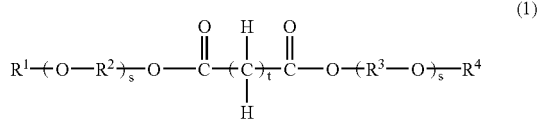
(1)

(In this formula, $R^1$ and $R^4$ each represent identical or different alkyl groups having 1 to 30 carbon atoms, $R^2$ and $R^3$ each represent identical or different methylene groups or alkylene groups having 2 to 30 carbon atoms, s represents an integer number of 0 to 5, and t represents an integer number of 1 to 10.)

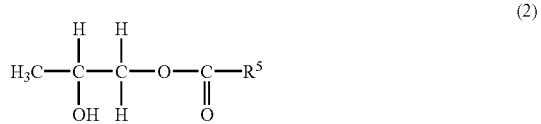
(2)

(In this formula, $R^5$ represents a hydrocarbon group having 1 to 30 carbon atoms.)

In the above formula (1), the alkyl group represented by $R^1$ or $R^4$ and the alkylene group represented by $R^2$ or $R^3$ may be straight-chain or branched groups, and may be saturated or unsaturated groups. The number of carbon atoms of the alkyl group represented by $R^1$ and $R^4$ is 1 to 30, preferably 2 to 20, further preferably 4 to 10. The number of carbon atoms of the alkylene group represented by $R^2$ and $R^3$ is 2 to 30, preferably 2 to 20, further preferably 4 to 10. If the number of carbon atoms of the alkyl group and alkylene group is larger than 30, solubility of the plasticizer in the solvent may be reduced, thus making it impossible to obtain good plasticity of the transfer film.

Specific examples of compounds expressed by the above formula (1) include dibutyl adipate, diisobutyl adipate, di-2-ethylhexyl adipate, di-2-ethylhexyl azelate, dibutyl sebacate and dibutyl diglycol adipate. Preferable are compounds in which t represents an integer number of 2 to 6.

In the above formula (2), the hydrocarbon group represented by $R^5$ may be a straight-chain or branched group, and may be a saturated or unsaturated group. The hydrocarbon group represented by $R^5$ has 1 to 30, preferably 2 to 20, further preferably 10 to 18 carbon atoms, and is preferably an alkyl group or alkenyl group, in particular.

Specific examples of compounds expressed by the above formula (2) include propylene glycol monolaurate and propylene glycol monooleate.

The content of the plasticizer in the dielectric-forming composition according to Invention 3 is 0.1 to 20 parts by weight, preferably 0.5 to 10 parts by weight with respect to 100 parts by weight of composite particles for dielectrics (A). <<5>> In addition, for the composition according to Invention 3-3, other additives include, for example, a radical generator, a dehydrating agent, a photosensitizer, an organic solvent, a polymerization inhibitor, a polymerization initiating aid, a leveling agent, a wettability improver, a surfactant, a plasticizer, a bonding aid, a dispersant, an ultraviolet absorber, an antioxidant, an antistatic agent, a silane coupling agent, an inorganic bulking agent, a pigment and a dye.

For the radical generator described above, general radical polymerization initiators and the like may be used. The radical being a neutral active substance does not promote the condensation reaction of silanol groups, but can promote polymerization of functional groups if radical polymerizable functional groups are contained in the component of the above composite particles for dielectrics (A). Therefore, the dielectric-forming composition and photosensitive dielectric-forming composition can be cured more effectively, which is preferable.

The dehydrating agent described above may be added as appropriate in order to improve the preservation stability and photo curability of the photosensitive dielectric-forming composition. The type of the dehydrating agent described above is not particularly limited, but as organic compounds at least one compound selected from the group consisting of carboxylates, acetals (including ketals) and carboxylic anhydride is preferable, and as inorganic compounds, ceramic powders having dehydration capability are preferably used. These dehydrating agents exhibit excellent dehydration effects, and can effectively exert their capability as dehydrating agents even if only a small amount thereof is added.

The carboxylate described above is selected from orthocarboxylates and sylylcarboxylates. Here, preferred carboxylic orthoesters include methyl orthoformate, ethyl orthoformate, propyl orthoformate, butyl orthoformate, methyl orthoacetate, ethyl orthoacetate, propyl orthoacetate, butyl orthoacetate, methyl orthopropionate and ethyl orthopropionate. Also, of these orthocarboxylates, orthoformates are particularly preferable in the respect that they exhibit a more excellent dehydration effect and can improve the preservation stability and photo curability more significantly. Also, preferred sylylcarboxylates include trimethyl acetate sylyl, tributyl acetate sylyl, trimethyl formate sylyl and trimethyl oxalate sylyl.

Also, preferred acetals may include, for example, acetone dimethyl acetal, acetone diethyl acetal, methyl ethyl ketone dimethyl acetal, methyl ethyl ketone dimethyl acetal, cyclohexanone dimethyl acetal and cyclohexanone diethyl acetal. These acetals particularly exhibit an excellent dehydration effect and can improve the preservation stability and photo curability of photo-curable composition more significantly. In addition, preferred carboxylic anhydrides include, for example, formic anhydride, acetic anhydride, succinic anhydride, maleic anhydride, phthalic anhydride, benzoic anhydride and acetic benzoic anhydride. In particular, acetic anhydride and succinic anhydride are particularly excellent in dehydration effect, and are thus preferable.

Also, preferred ceramic powders having dehydration capability include silica gel particles, alumina particles, silica alumina particles, activated clay, zeolite and talc. These ceramic powders have strong affinity with water, and can exhibit an excellent dehydration effect. Furthermore, alumina particles, silica alumina particles and the like not only exert dehydration capability but also serve to improve the electrical and mechanical properties of the resulting circuit board.

The amount of the above dehydrating agent to be added is not particularly limited, but is normally 0.1 to 100 parts by weight, preferably 0.5 to 50 parts by weight, further preferably 1 to 10 parts by weight with respect to 100 parts by weight of "(C) photo acid generator" described above. If the amount of dehydrating agent to be added is smaller than. 0.1 parts by weight, only a poor effect may result from addition of the agent, and the effect of improving the preservation stability and photo curability may be lowered. On the other hand, if the amount is larger than 100 parts by weight, the effect of improving the preservation stability and photo curability reaches a saturation level.

Photosensitive Transfer Film

The photosensitive transfer film according to Invention 4 can be obtained by applying the dielectric-forming composition according to Invention 3 described above to provide a photosensitive transfer layer on the substrate film, and a protective film may be provided on the surface of this photosensitive transfer layer.

<Substrate Film and Protective Film>

The substrate film constituting the photosensitive transfer film of the present invention is preferably a resin film or conductive foil having heat resistance and solvent resistance and having plasticity. The substrate film has plasticity, whereby a photosensitive transfer layer can be formed by coating the substrate film with a pasty composition by a roll coater, and the photosensitive transfer film can be preserved and supplied with the photosensitive transfer layer rolled into a roll shape. In the case where the substrate film is a conductive foil, the dielectric layer is laminated to another substrate, and thereafter the conductive foil is patterned using another dry film photoresist (DFR), and thereafter the patterned conductive foil is used as an exposure mask to subject the dielectric layer to exposure development, and thereafter the resultant can be used as the upper electrode of the dielectric layer.

Resins for use in the substrate film may include, for example, polyethylene terephthalate, polyester, polyethylene, polypropylene, polystyrene, polyimide, polyvinyl alcohol, fluorine-containing resins (e.g. polyfluoroethylene), nylon and cellulose. The thickness of the substrate film is, for example, 20 to 100 µm, preferably 15 to 50 µm in terms of strength and the like. It is preferable that a treatment for releasability has been applied to the surface of the substrate film made of resin. This is because if the treatment for releasability has been applied, the substrate film can easily be peeled off in the step of forming a pattern described later. For the treatment for releasability, silicon based release agents, fluorine based release agents and silicon-fluorine based release agents are suitably coated.

Conductive foils for use in the substrate film may include foils constituted of, for example, copper, gold, silver, platinum, nickel, stainless, aluminum, iron and various kinds of alloys. Of these foils, copper, gold, silver, platinum, nickel and aluminum are particularly preferable in terms of oxidation resistance, conductivity and flexibility. Also, a laminate of two or more conductive foils, and a board with foils laminated on a resin substrate or non-woven fabric resin impregnated substrate may be used as necessary. The thickness of these conductive foils is not particularly limited, but is usually in the range of from 5 to 75 µm, preferably from 8 to 50 µm, particularly preferably from 10 to 25 µm.

Furthermore, for the protective film, materials similar to those for the substrate film can be used. Also, a treatment for releasability is usually applied to the surface of the protective film, and the peel strength between the protective film and the photosensitive transfer layer should be inferior to the peel strength between the substrate film and the photosensitive transfer layer.

<Photosensitive Transfer Layer>

The photosensitive transfer layer constituting the photosensitive transfer film of Invention 4 can be formed by coating the substrate film with the photosensitive dielectric-forming composition described above, and then drying the coating to remove part or all of solvent therefrom.

The method of coating the substrate film with the dielectric-forming composition of Invention 3 to obtain a photosensitive transfer layer is preferably a method by which a thick coating film (e.g. 1 µm or larger) having excellent in uniformity of thickness can be formed efficiently, and may specifically include a method of application by a roll coater, a method of application by a blade coater, a method of application by a slit coater, a method of application by a curtain coater and a method of application by a wire coater, as preferred methods.

The conditions for drying the coating are such that the coating is dried at 50 to 150° C., for about 0.5 to 30 minutes, and the content of remaining solvent (in the photosensitive transfer film) after drying is usually 2% by weight or smaller, preferably 1% by weight or smaller.

The thickness of the photosensitive transfer layer formed on at least one side of the substrate film as described above is 1 to 100 µm, preferably 3 to 70 µm, further preferably 5 to 50 µm.

Also, the content of composite particles for dielectrics (A) in the photosensitive transfer layer is 30 to 90% by weight, preferably 40 to 80% by weight with respect to the total amount of photosensitive transfer layer in the transfer film. By providing such a photosensitive transfer layer, a photosensitive transfer film allowing patterns having excellent adhesiveness to the substrate and high dimensional accuracy to be formed can be obtained.

Dielectrics

By using the dielectric-forming composition and photosensitive transfer film of Invention 3, a dielectric with permittivity of 30 or greater and dielectric loss tangent of 0.1 or smaller can be formed by heating them at 500° C. or lower. The method of forming the dielectric of the present invention and the properties of the dielectric will be described in detail below.

<Method of Forming Dielectric Layer Patterns>

The method of forming dielectric layer patterns using the dielectric-forming composition of Invention 3 comprises the steps of [1-1] applying a dielectric-forming composition or [1-2] transferring a photosensitive transfer layer, [2] exposing a dielectric layer, [3] developing a dielectric layer and [4] curing dielectric layer patterns.

[1-1] Step of Applying Dielectric-forming Composition

In the application step, using a coater or the like, the dielectric-forming composition of the present invention is applied on a substrate to form a dielectric layer. Here, preferred coaters include a screen printer, a gravure coater, a roll coater, a bar coater and a die coater. The materials for the above substrate are not particularly limited, but include plane members including, for example, a printed-wiring board, a copper-clad laminate (CCL), SUS board, a polyimide board with a copper foil, a ceramic board, silicon wafer and an alumina board.

Specifically, for example, the dielectric-forming composition of Invention 3 is printed on a printed-wiring board or the like by a screen printer or the like, and the dielectric-forming composition is dried using an oven or the like, whereby a dielectric layer can be formed.

[1-2] Step of Transferring Photosensitive Transfer Layer

In the transfer step, the photosensitive transfer film of Invention 4 is used to transfer on a substrate the photosensitive transfer layer constituting the photosensitive transfer film.

For the substrate material, plane members including, for example, a printed-wiring board, a copper-clad laminate (CCL), SUS board, a polyimide board with a copper foil, a ceramic board, silicon wafer and an alumina board are used. A material with desired patterns formed on the surface of the plane member in advance may be used. If required, pretreatments such as chemical treatment with a silane coupling agents or the like; plasma treatment; treatment for formation of thin films by the ion plating method, the sputtering method, the gas phase reaction method, the vapor deposition method and the like may be applied to the surface of the substrate as appropriate.

One example of the transfer step is as follows. The protective film of the photosensitive transfer film used as necessary is peeled off, and thereafter the photosensitive transfer film is superimposed on the substrate so that the surface of the photosensitive transfer layer is abutted by the substrate, and this photosensitive transfer film is thermo-compression-bonded by a heat roller or the like. Thereby, the photosensitive transfer layer is transferred onto the substrate and bonded thereto. For transfer conditions, conditions may be presented such that the surface temperature of the heat roller is 20 to 140° C., the roll pressure by the heat roller is 1 to 5 kg/cm$^2$, and the speed at which the heat roller moves is 0.1 to 10.0 m/minute. Also, the substrate may be preheated, and the preheating temperature may be, for example, 40 to 100° C.

[2] Step of Exposing Dielectric Layer

In the exposure step, the surface of the dielectric layer formed as described above is selectively irradiated (exposed to) with a radiation via a mask for exposure to form a latent image of patterns on the dielectric layer.

Also, a conductive foil with a dry film resist is further laminated in the above [1-1], or a conductive foil is used for the substrate film to form a dielectric layer with a conductive foil in the above [1-2], followed by patterning and then chemical-etching the same, thereby making it possible to use the conductive foil as a mask for exposure.

In the exposure step, radiations for use in selective irradiation (exposure) include, for example, visible light, ultraviolet light, far ultraviolet light, electron beams and X-rays, and preferably visible light, ultraviolet light and far ultraviolet light are used, and further preferably ultraviolet light is used.

The exposure pattern of the mask for exposure varies depending on purposes, but for example, dot patterns with the dot size of 10 to 1000 micrometers square are used.

Radiation exposure apparatuses include, for example, ultraviolet exposure apparatuses that are used in the photolithography method and exposure apparatuses that are used in production of semiconductors and liquid crystal display devices. But are not limited thereto.

[3] Step of Developing Dielectric Layer

In the development step, the exposed dielectric layer is subjected to development processing, whereby the pattern (latent image) of the dielectric layer is actualized.

For the developer for use in the step of developing the dielectric layer, an alkali developer may be used. Thereby, the alkali soluble resin (resin capable of undergoing alkali development (B)) contained in the dielectric layer can easily be dissolved away.

Furthermore, the composite particles for dielectrics (A) contained in the dielectric layer and/or the inorganic ultrafine particles (A-1) that may be used in Invention 3-2 are uniformly dispersed by the alkali soluble resin. Therefore, by dissolving the alkali soluble resin serving as a binder and washing the same, the composite particles for dielectrics (A-1) and/or inorganic ultrafine particles (A-2) dispersed in the dissolved alkali soluble resin are also removed at the same time.

Active ingredients of this alkali developer may include, for example, inorganic alkaline compounds such as lithium hydroxide, sodium hydroxide, potassium hydroxide, sodium hydrogen phosphate, diammonium hydrogen phosphate, dipotassium hydrogen phosphate, disodium hydrogen phosphate, ammonium dihydrogen phosphate, potassium dihydrogen phosphate, sodium dihydrogen phosphate, lithium silicate, sodium silicate, potassium silicate, lithium carbonate, sodium carbonate, potassium carbonate, lithium borate, sodium borate, potassium borate and ammonia; and organic alkaline compounds such as tetramethyl ammonium hydroxide, trimethyl hydroxyethyl ammonium hydroxide, monomethylamine, dimethylamine, trimethylamine, monoethylamine, diethylamine, triethylamine, monoisopropylamine, diisopropylamine and ethanolamine.

The alkali developer for use in the step of developing the dielectric layer can be prepared by dissolving one or more types of the above described alkaline compounds in a solvent such as water. The concentration of alkaline compound in the alkali developer is usually 0.001 to 10% by weight, preferably 0.01 to 5% by weight. Additives such as a nonionic surfactant or organic solvents may be contained in the alkali developer.

Furthermore, after development processing by the alkali developer is conducted, rinsing is usually carried out. Also, the development treatment may be followed by the step of scrubbing away undesired residues remaining on the side face of the photosensitive transfer layer pattern and the exposed portion of the substrate, as necessary.

For conditions for development treatment, the type/composition/concentration of the developer, development time, development temperature, the development method (e.g. dipping method, oscillation method, shower method, spray method and paddle method) and the developing apparatus may be selected as appropriate depending on the purpose.

By this development step, a dielectric layer pattern (pattern corresponding to the mask for exposure) constituted of the remaining portion of the dielectric layer and the removed portion of the dielectric layer is formed.

[4] Step of Curing Dielectric Layer Pattern

In the curing step, the dielectric layer pattern is thermally cured to form a pattern. This thermal curing can be carried out by heating at a temperature of 500° C. or lower, but the temperature is preferably 100 to 500° C., further preferably 150 to 300° C. The heating time is preferably in the range of from 1 minute to 24 hours, further preferably from 10 minutes to 24 hours.

The heating method that is used when the dielectric-forming composition is heated and cured is, for example, heating by an oven, an infrared lamp, a hot plate or the like.

<Properties of Dielectrics>

The dielectric obtained from the dielectric-forming composition or photosensitive transfer film according to invention 3 has permittivity of 30 or greater, preferably 100 or greater, further preferably 150 or greater, particularly preferably 200 or greater. The upper limit of the permittivity is not specified, and may be about 30000, for example. Also, the dielectric obtained from the photosensitive dielectric-forming composition or photosensitive transfer film according to the present invention has dielectric loss tangent of 0.1 or smaller, preferably 0.08 or smaller, further preferably 0.06 or smaller. The lower limit of the dielectric loss tangent is not specified, and may be about 0.001, for example.

Furthermore, in this specification, the permittivity and dielectric loss tangent represent values measured by methods described in JIS K 6911 (frequency 1 MHz).

Also, the leakage current when this dielectric is used as a condenser is $10^{-8}$ A/cm$^2$ or smaller, preferably $10^{-9}$ A/cm$^2$ or smaller, further preferably $10^{-10}$ A/cm$^2$ or smaller.

Furthermore, the thickness of this dielectric is preferably 100 μm or smaller, more preferably 30 μm or smaller. The lower limit of the film thickness is not specified, but the thickness is usually 1 μm or larger.

Electronic Parts

The film of high permittivity of Invention I can be obtained by heating and baking at a temperature of 500° C. or lower and has permittivity of 30 or greater and dielectric loss tangent of 0.1 or smaller. Therefore, by using the film, a condenser and the like which have reduced thickness and increased electrostatic capacitance can be formed. Also, the electronic part such as a print circuit board, a semiconductor package, a condenser and a high frequency antenna comprising the film of high permittivity may have a small size and high density.

[Invention II]

The Invention II (Invention 5 described below) relates to a composition composed of specific ultrafine particle-resin composite particles and dielectric forming composite particles, and the composition specifically contains ultrafine particle-resin composite particles composed of:

(J) inorganic ultrafine particles with the average particle size of 0.1 μm or smaller; and (B) a resin component constituted of at least one of a polymerizable compound and a polymer, wherein part or all of the surfaces of the above described inorganic ultrafine particles (J) are coated with the above described resin component (B), and the above described inorganic ultrafine particles (J) are contained in the amount of 20% by weight or greater in the ultrafine particle-resin composite particles, and inorganic particles with the average particle size of 0.1 to 2 μm and the permittivity of 30 or greater, or inorganic composite particles (composite particles for dielectrics) in which a conductive metal or a compound thereof, or a conductive organic compound or a conductive inorganic material is deposited on part or all of the surfaces of the inorganic particles.

The invention will be described specifically below.

Ultrafine Particle-resin Composite Particles

The ultrafine particle-resin composite particles according to Invention 5 have specific particle sizes, and are constituted of inorganic ultrafine particles (J) having specific particle sizes and a specific resin component (B).

Inorganic Ultrafine Particles (J)

The inorganic ultrafine particles (J) for use in Invention 5 have an average particle size of 0.1 μm or smaller, preferably 0.08 μm or smaller, further preferably 0.05 μm or smaller. If the average particle size is larger than 0.1 μm, dispersibility in the resin particles may be reduced to make it difficult to obtain a sufficient effect by adding them. Also, the lower limit is not specified for the average particle size, but it is preferably 0.001 μm or larger, further preferably 0.005 μm or larger because if the average particle size is reduced, the particles tend to coagulate without being dispersed when they are dispersed in the resin.

The permittivity of inorganic ultrafine particles of the present invention is preferably 10 or greater, preferably 20 or greater, further preferably 30 or greater.

For these inorganic particles, those constituted of metal oxides are preferably used, and titanium based metal oxides are more preferable. Here, the "titanium based metal oxide" means a compound containing titanium and oxygen as essential elements. For these titanium based metal oxides, titanium based single metal oxides containing titanium in a single form as a metal element constituting a crystal structure, and titanium based multiple oxides containing titanium and other metal elements as metal elements may be preferably used.

The above described titanium based single metal oxides include, for example, titanium dioxide based metal oxides. Such titanium dioxide based metal oxides include titanium dioxide based metal oxides of anatase or rutile structure.

The above described titanium based multiple oxides include, for example, barium titanate based, lead titanate based, strontium titanate based, bismuth titanate based, magnesium titanate based, neodium titanate based, and calcium titanate based metal oxides.

Also, for improving dispersibility in the dispersion medium such as an alcohol medium, particles with the surfaces of the above described inorganic particles modified with silica, alumina or the like may be suitably used.

The shapes of inorganic ultrafine particles of the present invention are not particularly limited, but they include spheroidal shape, granular shape, tabular shape, flake shape, whisker shape, rod shape and filament shape. And of these shapes, speroidal shape, granular shape, piece shape and flake shape are preferable. Inorganic particles of these shapes may be used alone or in combination of two or more types.

Inorganic ultrafine particles for use in Invention 5 can be synthesized by, for example, the gas phase method and sol gel method. For dispersing inorganic ultrafine particles synthesized by the gas phase method in a solvent, they can be dispersed into primary particles using a dispersant in conjunction by a known dispersion method, a bead mill, a mixing method, a high-pressure homogenizer.

Resin Component (B)

The resin component (B) for use in Invention 5 is constituted of at least one of a polymerizable compound and a polymer. Here, "polymerizable compound" means a compound having a polymerizable group, and refers to a compound including a precursory polymer before being fully cured, a polymerizable oligomer, a monomer or the like. Also, "polymer" means a compound of which polymerization reaction is substantially completed. However, this polymer may be cross-linked by means of heating, humidity and the like after formation of the dielectric layer.

Such a resin component preferably consists of one or more types of resins selected from polyimide based resin, epoxy based resin, acryl based resin, polyester based resin, fluorine based resin and silicon based resin. In addition to these resins, other components may be further contained. In addition, these resins may be chemically bonded to each other or to other components.

Ultrafine Particle-resin Composite Particles

The ultrafine particle-resin composite particles according to the present invention are constituted of inorganic ultrafine particles (J) and the resin component (B), as described above, but are preferably particles in which at least part of the surfaces of the inorganic ultrafine particles (J) is coated with the resin component (B), more preferably particles in which at all of the surfaces of the inorganic ultrafine particles (J) are coated with the resin component (B).

That is, in the ultrafine particle-resin composite particles, the inorganic ultrafine particles (J) may be included in the resin component (B), and part of inorganic ultrafine particles (J) may be exposed at the surfaces of the ultrafine particle-resin composite particles without being coated with the resin component (B).

Such ultrafine particle-resin composite particles contain preferably 20% by weight or more, more preferably 30 to 70% by weight, further more preferably 35 to 50% by weight of inorganic ultrafine particles (J), assuming that the total amount of the ultrafine particle-resin composite particles is 100% by weight. If the content of inorganic ultrafine particles is smaller than 20% by weigh in the ultrafine particle-resin composite particles, the permittivity may drop, and if the content is larger than 70% by weight, the mechanical strength of the dielectric may drop when the dielectric is formed.

The average particle size of these ultrafine particle-resin composite particles is preferably 0.1 to 5 µm, more preferably 0.1 to 1 µm, further more preferably 0.15 to 0.6 µm. If the average particle size is larger than 5 µm, the particles may be precipitated to reduce preservation stability. Also, if the average particle size is smaller than 0.1 µm, it maybe so difficult to compound inorganic ultrafine particles that uniformity of the dielectric layer is compromised.

The ultrafine particle-resin composite particles according to the present invention can be obtained mainly as an emulsion by the method described later.

These ultrafine particle-resin composite particles preferably have on the surfaces electrical charges for enabling electrodeposition, and the electrical charges on the surfaces may be of anion type or cation type, but are preferably of cation type for preventing oxidation of electrodes during electrodeposition.

In the present invention, a resin component having a polyimide based resin as a principal constituent is particularly preferably used because they make it possible to form by electrodeposition a dielectric of high permittivity having excellent mechanical, chemical and electrical properties. Furthermore, "polyimide based resin" means inclusion of, for example, precursory polymers capable of being cured by heating after electrodeposition and the like (e.g. polyamic acid, etc.), monomers for use in formation of polyimide based resins, oligomers, copolymer resins of monomers for use in formation of polyimide resins and other monomers, or their precursory polymers, and reactants of polyimide resins or their precursory polymers and other compounds, as described previously.

Inorganic Particles or Inorganic Composite Particles

The dielectric-forming composition according to the present invention contains ultrafine particle-resin composite particles as described above, together with inorganic particles or inorganic composite particles. The inorganic particles and inorganic composite particles will be described below.

Inorganic Particles

The inorganic particles for use in the present invention have permittivity of 30 or greater, preferably 50 or greater, further preferably 70 or greater. Even greater permittivity is acceptable, and the upper limit thereof is not specified, and for example, permittivity of about 30000 may be accepted.

For these inorganic particles, those constituted of metal oxides are preferably used, and especially titanium based metal oxides are preferable. Here, the "titanium based metal oxide" means a compound containing titanium and oxygen as essential elements. For these titanium based metal oxides, titanium based single metal oxides containing titanium in a single form as a metal element constituting a crystal structure, and titanium based multiple oxides containing titanium and other metal elements as metal elements may be preferably used.

The above described titanium based single metal oxides include, for example, titanium dioxide based metal oxides. Such titanium dioxide based metal oxides include titanium dioxide based metal oxides of anatase or rutile structure.

The above described titanium based multiple oxides include, for example, barium titanate based, lead titanate based, strontium titanate based, bismuth titanate based, magnesium titanate based, neodium titanate based, and calcium titanate based metal oxides.

Furthermore, the above described "titanium dioxide based metal oxide" means a system containing only titanium dioxide or a system containing a small amount of additives in addition to titanium dioxide, which retains the crystal structure of titanium dioxide as a main component, and the same goes for metal oxides of other systems.

Also, the above described "titanium based multiple oxide" means an oxide produced from a combination of a titanium based single metal oxide and a metal oxide composed of at least one type of other metal elements, in which no oxoacid ion exists as a unit of structure.

In the present invention, for these titanium based metal oxides constituting inorganic particles, titanium dioxide based metal oxides of rutile structure are preferable in the case of titanium based single metal oxides, and barium titanate based metal oxides may be preferably used in the case of titanium based multiple oxides.

In addition, of these, barium titanate based metal oxides may be particularly preferably used.

Also, for improving dispersibility in the aqueous medium, particles with the surfaces of the above described inorganic particles modified with silica, alumina or the like may be suitably used.

The average particle size of these inorganic particles is preferably 0.1 to 2 µm, more preferably 0.1 to 1 µm, further preferably 0.15 to 0.8 µm. If the average particle size is larger than 1 µm, the composition of the dielectric layer may tend to lack in uniformity when the thickness is reduced. If the average particle size is smaller than 0.1 μm, the permittivity of the dielectric layer may drop.

The shapes of inorganic particles of the present invention are not particularly limited, but they include spheroidal shape, granular shape, tabular shape, flake shape, whisker shape, rod shape and filament shape. And of these shapes, speroidal shape, granular shape, piece shape and flake shape are preferable. Inorganic particles of these shapes may be used alone or in combination of two or more types.

Inorganic Composite Particles

Inorganic composite particles for use in the present invention are particles in which part or all of the surfaces of the above inorganic particles are coated with a conductive metal or a compound thereof, or a conductive organic compound or a conductive inorganic material (hereinafter referred to also as conductive coating materials).

"Conductive Coating Materials"

Conductive coating materials with which the above described inorganic particles are to be coated include conductive metals or compounds thereof, or conductive organic compounds or conductive inorganic materials. For these conductive materials, one type of material or two or more type of materials may be deposited on part of the surfaces of the above described inorganic particles.

For the above described conductive metal, for example, at least one type of metal selected from gold, silver, copper, tin, platinum, palladium, ruthenium, Fe, Ni, Co, Ge, Si, Zn, Ti, Mg and Al may be used. For the metal, an alloy of these metals may be used.

For the above described compound of the conductive metal, nitrides of the above described conductive metals may be used. Of these, titanium nitride may be particularly suitably used.

For the above described conductive organic compound, at least one type of compound selected from TCNQ (7,7,8,8-tetracyanoquinodimethane), polypyrrole, polyaniline polythiophene and the like may be used.

For the above described conductive inorganic material, at least one type of material selected from carbon, graphite and the like may be used.

"Inorganic Composite Particles"

The content of the above described inorganic particles contained in the inorganic composite particles for use in the present invention is preferably 70 to 99% by weight, further preferably 85 to 95% by weight, particularly preferably 80 to 90% by weight, with respect to the total amount of the inorganic composite particles. Also, the content of the conductive metal or conductive organic compound is preferably 1 to 30% by weight, further preferably 5 to 15% by weight, and particularly preferably 10 to 20% by weight.

If the content of inorganic particle component is larger than 99% by weight, it could be impossible to obtain high permittivity when a dielectric is produced from the particles. Also, if the content of inorganic particle component is smaller than 70% by weight, the insulation quality of the dielectric may be degraded.

The average particle size of inorganic composite particles for use in the present invention is preferably 0.1 to 2 μm, more preferably 0.1 to 1 μm, further preferably 0.15 to 0.8 μm. If the average particle size is larger than 2 μm, the composition of the dielectric layer may tend to lack in uniformity when the thickness is reduced. If the average particle size is smaller than 0.1 μm, the permittivity of the dielectric layer may drop.

These inorganic composite particles can be prepared using a known method, and are not limited.

For example, in the case where the surfaces of inorganic particles are coated with a conductive metal by plating and the like, nonelectrolytic plating such as chemical plating may be applied.

Also, for example, the surfaces of inorganic particles may be coated with a conductive metal and organic compound in the alloy or composite form, by a known method such as the gas atomize method. In addition, for inorganic composite particles prepared by the gas atomize method, the concentration of the above described conductive component near the surfaces of particles can be increased to curb oxidation of the surfaces of particles using, for example, a known method of producing alloys.

Specifically, inorganic composite particles composed of inorganic particles coated with 1 to 40% by weight of metal component are treated by a classifier to collect powders with the average grain size of 0.1 to 2 μm, and ultrasonic dispersion treatment is carried out with the powders in purified water to immerse their surfaces in water sufficiently, followed by eluting only the Cu component on the surfaces in a bath containing 1 to 10% by volume of sulfuric acid, whereby inorganic composite particles can be obtained.

Also, for example, even if the particles are fine or have piece shapes, composite particles containing a large amount of conductive component near the surfaces of inorganic composite particles can be produced.

For such inorganic composite particles, 3 to 50% by weight of carbon can be added with respect to inorganic particles and pulverized to mechanically bond carbon to magnetic powders (mechanochemical method).

In addition, by melting the above described conductive metal and inorganic particles in a plasma gas at high temperature, and rapidly cooling and solidifying them, the concentration of the conductive component near the surfaces of inorganic composite particles can be increased to above the average concentration.

In the case where fine inorganic composite particles with the average particle size of about 0.1 to 2 μm are obtained, fine inorganic particulate powders are subjected to fluid jet mill treatment in the inert atmosphere and dispersed into primary particles, and the inorganic particles obtained by the dispersion treatment are heated under reduced pressure in the inert atmosphere, and the inorganic particles subjected to the heat treatment is placed in a rotating container with a conductive component contained therein as a sputtering source, and the container is rotated in a fixed direction to form fluidized bed of inorganic particles, and the conductive component is sputtered with the container being rotated to coat the coating material to the fluidized inorganic particles, and the coated fine powders are taken out from the above described rotating container on the principle of a vacuum cleaner by conducting introduction of inert gas and vacuum pumping in combination, whereby inorganic composite particles in which the surfaces of inorganic particles are strongly and uniformly coated with a conductive component can be obtained within the above described average particle size.

[Dielectric-forming Composition]

The dielectric-forming composition according to Invention 5 contains the above described ultrafine particle-resin composite particles, and inorganic particles or inorganic composite particles.

In Invention 5, the weight ratio of the above described ultrafine particle-resin composite particles to the inorganic particles or inorganic composite particles (inorganic particles or inorganic composite particles/ultrafine particle-resin composite particles) is preferably 30/70 to 95/5, further preferably 50/50 to 90/10. If the content of the inorganic particles or inorganic composite particles is smaller than 30% by weight, it may be difficult to obtain a dielectric of high permittivity. Also, if the content of the inorganic particles or inorganic composite particles is larger than 95% by weight, the deposition property of the dielectric may be compromised.

This dielectric-forming composition is a composition allowing a dielectric with permittivity of 30 or greater and dielectric loss tangent of 0.1 or smaller to be formed by heating the composition at a temperature of 500° C. or lower. Furthermore, in this specification, the permittivity and dielectric loss tangent represent values measured by methods described in JIS K 6911 (frequency 1 MHz).

Also, the above described dielectric-forming composition can further contain a solvent and other components such as a bulking agent as necessary.

Filler

The dielectric-forming composition of Invention 5 may further contain a bulking agent in addition to the ultrafine particle-resin composite particles, and the inorganic particles or inorganic composite particles. Fillers for improving permittivity include carbon powders such as acetylene black and Ketjenblack, conductive fine particles such as graphite powders, and semiconductor based fine particles such as silicon carbide powders. In the case where these bulking agents for improving permittivity are added, their content is preferably 0 to 10% by weight, further preferably 0.05 to 10% by weight and more preferably 0.1 to 5% by weight with respect to the inorganic particles or inorganic composite particles.

Other Additives

The dielectric-forming composition according to the present invention may further contain as compounds other than those described above a curing agent, glass powders, a coupling agent, a polymeric additive, a reactive diluent, a polymerization inhibitor, a polymerization initiator, a leveling agent, a wettability improver, a surfactant, a plasticizer, an ultraviolet absorbent, an antioxidant, an antistatic agent, an inorganic filler, a mildew proofing agent, a humidity conditioning agent, a dye dissolving agent, a buffer solution, a chelating agent, a fire retardant and the like. These additives may be used alone or in combination of two or more types thereof.

Furthermore, it is preferable that the dielectric-forming composition according to the present invention takes the form of electrodeposition liquid for formation of dielectrics as described later, but it may take the form of paste as necessary.

Electrodeposition Liquid for Formation of Dielectrics

The electrodeposition liquid for formation of dielectrics according to the present invention has the above described ultrafine particle-resin composite particles and the inorganic particles or inorganic composite particles dispersed in an aqueous dispersion medium. This electrodeposition liquid for formation of dielectrics is usually obtained by preparing an aqueous emulsion with the above described ultrafine particle-resin composite particles dispersed in an aqueous dispersion medium, and mixing this aqueous emulsion with the above described inorganic particles or inorganic composite particles. First, this aqueous emulsion will be described. Furthermore, in this specification, "aqueous dispersion medium" means a medium containing water, and the content of water in this aqueous dispersion medium is usually 1% by weight or larger, preferably 5% by weight or larger.

Aqueous Emulsion

Methods of producing aqueous emulsions of ultrafine particle-resin composite particles constituted mainly by inorganic ultrafine particles and polyimide based resins (hereinafter referred to as "ultrafine particle-compounded polyimide based resin emulsions"), aqueous emulsions of ultrafine particle-resin composite particles constituted mainly by inorganic ultrafine particles and epoxy based resins (hereinafter referred to as "ultrafine particle-compounded epoxy based resin emulsions"), aqueous emulsions of ultrafine particle-resin composite particles constituted mainly by inorganic ultrafine particles and acryl based resins (hereinafter referred to as "ultrafine particle-compounded acryl based resin emulsions"), aqueous emulsions of ultrafine particle-resin composite particles constituted mainly by inorganic ultrafine particles and polyester based resins (hereinafter referred to as "ultrafine particle-compounded polyester based resin emulsions"), aqueous emulsions of ultrafine particle-resin composite particles constituted mainly by inorganic ultrafine particles and fluorine based resins (hereinafter referred to as "ultrafine particle-compounded fluorine based resin emulsions"), and aqueous emulsions of ultrafine particle-resin composite particles constituted mainly by inorganic ultrafine particles and silicon based resins (hereinafter referred to as "ultrafine particle-compounded silicon based resin emulsions") will be described below. Furthermore, these aqueous emulsions may contain other media together with water as necessary. Other media that are used together with water as necessary include, for example, the above described polyamic acid, aprotic polar solvents for use in production of polyimide, esters, ketones, phenols and alcohols.

Also, in the aqueous emulsion, the resin component (B) is preferably granular organic particles.

(i) Methods of Producing Ultrafine Particle-Compounded Polyimide Based Resin Emulsions In the case where the resin component for use in the present invention is constituted of the polyimide based resin, a polyimide based high permittivity layer having excellent mechanical, chemical and electric properties can be formed. For the method of producing this dielectric layer by electrodeposition, two types methods described below may be preferably used.

<<1>> A method in which an ultrafine particle-compounded polyimide based resin emulsion containing the above described inorganic ultrafine particles and a resin component constituted of organic solvent-soluble polyimide and a hydrophilic polymer is used as an electrodeposition liquid to electro-deposit the ultrafine particle-resin composite particles.

<<2>> A method in which an ultrafine particle-compounded polyimide based resin emulsion containing the above described inorganic ultrafine particles and a resin component constituted of polyamic acid and a hydrophobic compound is used as an electrodeposition liquid to electro-deposit the ultrafine particle-resin composite particles, and the electro-deposited polyamic acid is made to undergo dehydration ring-closure by heating.

For the method of producing the polyimide based resin emulsion for use in these methods, the method described in Japanese Patent Laid-Open No. 11-49951 may be used for the above described method <<1>>, and the method described in Japanese Patent Laid-Open No. 11-60947 may be used for the above described method <<2>>.

The method of producing the polyimide based resin emulsion for use in the above described method <<1>> will be described further in detail.

The method of synthesizing the "organic solvent-soluble polyimide" is not particularly limited, but for example, the polyimide can be synthesized by mixing tetracarboxylic dianhydride and a diamine compound and polycondensating the same in an organic polar solvent to obtain polyamic acid, followed by making the polyamic acid undergo a dehydration ring-closure reaction by the heat imidization method or the chemical imidization method. Also, polyimide having a bloc structure can also be synthesized by carrying out polycondensation of the tetracarboxylic dianhydride and diamine compound in multiple stages.

This organic solvent-soluble polyimide preferably has one or more type of reactive group (a) such as a carboxyl group, an amino group, a hydroxyl group, a sulfonic group, an amide group, an epoxy group and an isocyanate group, for example. Methods of synthesizing polyimide having the reactive group (a) may include, for example, a method in which a compound having the reactive group (a) is used as a reacting raw material such as carboxylic dianhydride for use in synthesizing polyamic acid, the diamine compound, carboxylic monoanhydride and the monoamin compound, and the reactive group (a) is made to remain after the dehydration ring-closure reaction.

The "hydrophilic polymer" has one or more type of group such as an amino group, a carboxyl group, a hydroxyl group, a sulfonic group and amide group, for example, as a hydrophilic group, and is constituted of a hydrophilic polymer of which solubility in water at 20° C. is usually 0.01 g/100 g or larger, preferably 0.05 g/100 g or larger. The hydrophilic polymer preferably has one or more type of reactive group (b) that may react with the reactive group (a) in the above described organic solvent-soluble polyimide component, in addition to the above described hydrophilic group. This reactive group (b) maybe, for example, a group similar to the above described hydrophilic group or the like, in addition to an epoxy group, an isocyanate group and a carboxyl group. This hydrophilic polymer can be obtained by homopolymerizing or copolymerizing monovinyl monomers having the hydrophilic group and/or the reactive group (b), or copolymerizing these monovinyl monomers with other monomers.

This organic solvent-soluble polyimide and hydrophilic polymer are selected so that a combination of the reactive group (a) and the reactive group (b) in the hydrophilic polymer has appropriate reactivity, and the polyimide and the hydrophilic polymer are mixed together and reacted with each other in the form of solution in, for example, an organic solvent while they are heated as necessary, followed by mixing this reaction solution and the aqueous medium, and removing at least part of the organic solvent in some cases, whereby a polyimide based resin emulsion composed of organic particles with the polyimide and the hydrophilic polymer bonded together and contained in the same particle can be obtained.

The method of producing the polyimide based resin emulsion for use in the above described method <<2>> will now be described further in detail.

The method of synthesizing "polyamic acid" being a precursor of polyimide is not particularly limited, but for example, polyamic acid can be obtained by the polycondensation reaction of tetracarboxylic dianhydride and a diamine compound in an organic polar solvent. Also, by carrying out the polycondensation reaction of tetracarboxylic dianhydride and the diamine compound in a multiple stage, polyamic acid having a block structure can be synthesized. Furthermore, polyamic acid partially imidized by making the polyamic acid undergo dehydration ring-closure can also be used.

On the other hand, "hydrophobic compound" is a compound having a group that may react with at least an amid acid group in the above described polyamic acid (hereinafter referred to as "reactive group"). This reactive group may be, for example, an epoxy group, an isocyanato group, a carbodiimide group, a hydroxyl group, a mercapto group, a halogen group, an alkylsulfonyl group, an arylsulfonyl, a ziazo group and a carbonyl group. These reactive groups may exist in the hydrophobic compound in one or more type. Furthermore, the "hydrophobic" means that solubility in water at 20° C. is usually smaller than 0.05 g/100 g, preferably smaller than 0.01 g/100 g, further preferably smaller than 0.005 g/100 g.

For this hydrophobic compound, one or more type of compound selected from, for example, epoxydized polybutadiene, bisphenol A type epoxy resin, naphthalene based epoxy resin, fluorene based epoxy resin, biphenyl type epoxy resin, glycidyl ester type epoxy resin, allyl glycidyl ether, glycidyl (meta) acrylate, 1,3,5,6-tetraglycidyl-2,4-hexanediol, N,N,N',N',-tetraglycidyl-m-xylenediamine, trylene diisocyanate, dicyclohexyl carbodiimide, polycarbodiimide, cholesterol, benzyl alcohol p-toluene sulfonate, ethyl chloroacetate, triazine trithiol, diazomethane and diacetone (meta) acrylamide may be used.

This polyamic acid and the hydrophobic compound are mixed together and reacted with each other in the form of solution in, for example, an organic solvent, followed by mixing this reaction solution with the aqueous dispersion medium, and removing at least part of the organic solvent in some cases, whereby a polyimide based resin emulsion composed of organic particles with the polyamic acid and the hydrophobic compound contained in the same particle can be obtained.

Furthermore, tetracarboxylic dianhydrides for use in the above described methods <<1>> and <<2>> are not particularly limited, and may include, for example, aliphatic tetracarboxylic dianhydrides or alicyclic tetracarboxylic dianhydrides such as butane tetracarboxylic dianhydride, 1,2,3,4-cyclobutane tetracarboxylic dianhydride, 3,3',4,4'-dicyclohexyl tetracarboxylic dianhydride, 2,3,5-tricarboxycyclopentyl acetic dianhydride and 1,3,3a,4,5,9A-hexahydro-5-(tetrahydro-2,5-dioxo-3-furanyl)-naphto [1, 2-c]-furan-1,3-dion; and aromatic tetracarboxylic dianhydrides such as pyromellitic dianhydride, 3,3',4,4'-benzophenon tetracarboxylic dianhydride and 3,3',4,4'-biphenylsulfone tetracarboxylic dianhydride. These tetracarboxylic dianhydrides maybe used alone or with two or more type thereof mixed together.

Also, diamine compounds for use in the above described methods <<1>> and <<2>> are not particularly limited, and may include, for example, Aromatic diamines such as p-phenylenediamine, 4,4'-diaminodiphenylmethane and 2,2-bis [4-(4-aminophenoxy) phenyl] propane;

aliphatic diamines or alicyclic diamines such as 1,1-methaxylylenediamine, 1,3-propaneziamine, tetramethylenediamine and 4,4'-methylenebis (cyclohexylamine);

diamines having per molecule two primary amino groups and nitrogen atoms other than the primary amino groups such as 2,3-diaminopyridine, 2,4-diamino-6-dimethylamino-1,3,5-triazine, 2,4-diamino-5-phenylthiazole and bis (4-aminophenyl) phenylamine;

mono-substituted phenylene diamines; and diaminoorgano siloxane. These diamine compounds may be used alone or with two or more types thereof mixed together.

In the present invention, it is preferable that the above described organic particles and inorganic ultrafine particles form complex particles and exist as ultrafine particle-resin composite particles in the electrodeposition liquid. This "complex particles" are particles in which compound constituting the above described organic particles and the inorganic ultrafine particles are chemically bonded together, or particles in which the inorganic ultrafine particles are adsorbed on the surfaces of or inside the above described organic particles. That is, the inorganic ultrafine particles (J) may be included in the organic particles, or a part of the inorganic ultrafine particles (J) may be exposed at the surfaces of the organic particles.

The amount of these inorganic ultrafine particles (J) to be used is preferably 20 to 60 parts by weight, further preferably 30 to 50 parts by weight with respect to 100 parts by weight of the above described resin component.

These ultrafine particle-resin composite particles can be produced by emulsifying the above described resin component in the presence of inorganic ultrafine particles dispersed in a water soluble solvent based dispersion medium.

By dispersing the inorganic ultrafine particles in the water soluble solvent based dispersion medium using a homomixer, an ultrasonic mixer, a bead mill or the like before carrying out this method, inorganic ultrafine particle dispersions can be obtained.

(ii) Methods of Producing Ultrafine Particle-Compounded Epoxy Based Resin Emulsions The method of producing epoxy based resin emulsions for use in the present invention is not particularly limited, and they can be produced by known methods, for example the methods described in Japanese Patent Laid-Open No. 9-235495 and No. 9-208865.

The ultrafine particle-compounded epoxy based resin emulsion can be obtained by emulsifying the resin component in the presence of the above described inorganic ultrafine particles in accordance with these methods of producing epoxy based resin emulsions.

(iii) Methods of Producing Ultrafine Particle-Compounded Acryl Based Resin Emulsions The method of producing acryl based resin emulsions for use in the present invention is not particularly limited, and they can be produced by normal emulsion polymerization. As for monomers, one or more type of monomer selected from general acryl based and/or methacryl based monomers. At this time, for enabling electrodeposition of the resin component, it is preferable that monomers having cationic groups such as an amino group, an amide group and a phosphono group, or monomers having anionic groups such as a carboxyl group and a sulfonic group are copolymerized, and the amount of copolymerized monomers is 5 to 80% by weight (more preferably 10 to 50% by weight) with respect to the total amount of monomers to be used. For specific examples of the above described monomers having the above describe amino groups, dimethylaminoethyl acrylate, dimethylaminopropyl acrylamide and the like may be preferably used.

In this case, the ultrafine particle-compounded acryl based resin emulsion can be obtained by emulsifying the resin component in the presence of the inorganic ultrafine particles in a same way as described above.

(iv) Methods of Producing Ultrafine Particle-Compounded Polyester Based Resin Emulsions The method of producing polyester based resin emulsions for use in the present invention is not particularly limited, and they may be produced in accordance with well known conventional methods, for examples the methods described in Japanese Patent Laid-Open No. 57-10663, No. 57-70153 and No. 58-174421.

In this case, the ultrafine particle-compounded polyester based resin emulsion can be obtained by emulsifying the resin component in the presence of the inorganic ultrafine particles in a same way as described above.

(v) Methods of Producing Ultrafine Particle-Compounded Fluorine Based Resin Emulsions The method of producing fluorine based resin emulsions for use in the present invention is not particularly limited, and they may be produced in accordance with well known conventional methods, for examples the methods described in Japanese Patent Laid-Open No. 7-268163.

In this case, the ultrafine particle-compounded fluorine based resin emulsion can be obtained by emulsifying the resin component in the presence of the inorganic ultrafine particles in a same way as described above.

(vi) Methods of Producing Ultrafine Particle-Compounded Silicon Based Resin Emulsions The method of producing silicon based resin emulsions for use in the present invention is not particularly limited, and they may be produced in accordance with well known conventional methods, for examples the methods described in Japanese Patent Laid-Open No. 10-60280.

In this case, the ultrafine particle-compounded silicon based resin emulsion can be obtained by emulsifying the resin component in the presence of the inorganic ultrafine particles in a same way as described above.

Electrodeposition Liquid for Formation of Dielectrics

As described above, the electrodeposition liquid for formation of dielectrics according to the Invention 5 contains ultrafine particle-resin composite particles, inorganic particles or inorganic composite particles and an aqueous dispersion medium, in which the ultrafine particle-resin composite particles and the inorganic particles or inorganic composite particles are dispersed as particles capable of being electro-deposited. Furthermore, the meaning of the aqueous dispersion medium is similar to that described above.

This electrodeposition liquid for formation of dielectrics can be prepared by methods such as the method <<1>> in which water soluble solvent dispersions of inorganic particles or inorganic composite particles and the aqueous emulsion of above described ultrafine particle-resin composite particles are mixed together and the method <<2>> in which inorganic particles or inorganic composite particles are added in the aqueous emulsion of the above described ultrafine particle-resin composite particles and mixing the same. Of these, the method <<1>> is preferably used.

Furthermore, it is preferable that the pH of the water soluble solvent based dispersions of the inorganic particles or inorganic composite particles before being mixed with the aqueous emulsion of the above described ultrafine particle-resin composite particles is adjusted using an organic acid (e.g. formic acid, acetic acid, fumaric acid, itaconic acid, phthalic acid, etc.), or an organic alkaline compound (dimethylaminoethyl alcohol, tetramethyl ammonium hydroxide (TMAH), trimethyl hydroxyethyl ammonium hydroxide, monomethyl amine, etc.) so that the pH is in the range of from 2 to 10 in order to improve stability of these particles when they are mixed.

The pH of the electrodeposition liquid for formation of dielectrics is preferably 2 to 10, more preferably 3 to 9, the solid content of the electrodeposition liquid for formation of dielectrics is preferably 1 to 50% by weight, more preferably 5 to 20% by weight, and the viscosity of the electrodeposition liquid for formation of dielectrics at 20° C. is preferably 1 to 100 mPa·s. If the pH, solid content or viscosity deviates from the above described range, dispersibility and the like of the ultrafine particle-resin composite particles and inorganic particles or inorganic composite particles may be reduced resulting in insufficient preservation stability or reduced workability at the time when they are handled and used.

The electrodeposition liquid for formation of dielectrics of the present invention may have preservation stability such that the period over which they can be preserved without causing interlayer separation, significant changes in viscosity and the like is 5 days or longer (more preferably 7 days or longer, further preferably 10 days or longer, particularly preferably 14 days or longer) at 20° C.

Furthermore, the electrodeposition liquid for formation of dielectrics of the present invention may contain, in addition to the above described ultrafine particle-resin composite particles and above described inorganic particles or inorganic composite particles, at least one type of compound selected from organosilanes expressed by the following general formula (1):

$$(R^1)_n Si (OR^2)_{4-n} \qquad (1)$$

(In the above formula, $R^1$ represents a hydrogen atom or a monovalent organic acid having 1 to 8 carbon atoms, $R^2$ represents an alkyl group having 1 to 5 carbon atoms, or an acyl group or phenyl group having 1 to 6 carbon atoms, and n represents an integer number of 1 or 2. $R^1$ and $R^2$ may be the same or different.), hydrolyzed compounds such that part or all of hydrolyzable groups of the organosilane are hydrolyzed, and partially condensed compounds such that the hydrolyzed compound is partially dehydration-condensed (hereinafter referred to as "organosilane condensate, etc."). For the dielectric layer formed from the electrodeposition liquid for formation of dielectrics containing this organosilane condensate or the like, especially when it is thermally cured after electrodeposition, the organosilane condensate, etc. is crosslinked in the dielectric layer, whereby the resulting dielectric layer may have excellent mechanical, chemical and electric properties.

In the above described general formula (1), the organic group having 1 to 8 carbon atoms, which is represented by $R^1$, may include an alkyl group having a linear chain or branch, a halogen substituted alkyl group, a vinyl group, a phenyl group and a 3,4-epoxycyclohexylethyl group. Furthermore, $R^1$ may have a carbonyl group. Furthermore, $R^1$ is preferably an alkyl group or phenyl group having 1 to 4 carbon atoms.

In the above described general formula (1), the alkyl group having 1 to 5 carbon atoms or an acyl group having 1 to 6 carbon atoms, which is represented by $R^2$, includes a methyl group, an ethyl group, a n-propyl group, an isopropyl group, a n-butyl group, an isobutyl group, a sec-butyl group, a tert-butyl group, a n-pentyl group, an acetyl group, a propionyl group and a butyryl group. Furthermore, $R^2$ is preferably an alkyl group having 1 to 4 carbon atoms.

Examples of organosilanes that are preferably used include dimethyl methoxysilane, dimethyl diethoxysilane, isobutyl trimethoxysilane and phenyl triethoxysilane. For these organosilanes, only one type may be used, or two or more types may be used in combination.

Preferably, the above described "organosilane condensate, etc." forms complex particles with the above described ultrafine particle-resin composite particles in the electrodeposition liquid for formation of dielectrics of the present invention. The "complex particles" are particles in which the compound of organic particles of the resin component constituting the above described ultrafine particle-resin composite particles and the organosilane condensate, etc. are chemically bonded together, or particles in which the organosilane condensate, etc. is adsorbed on the surfaces of or inside the above described ultrafine particle-resin composite particles.

The amount of this organosilane condensate, etc. to be used is preferably 0.1 to 500 parts by weight, further preferably 0.5 to 250 parts by weight with respect to 100 parts by weight of the above described resin component. If the amount of organosilane condensate, etc. to be used is smaller than 0.1 parts by weight, it may be impossible to obtain a desired effect, and on the other hand, if the amount is larger than 500 parts by weight, adhesion of the film may be reduced.

These complex particles can be produced by the following method <<1>> or <<2>>, or the like. Furthermore, these methods may be used in combination.

<<1>> The above described organosilane is added to the emulsion of the above described ultrafine particle-resin composite particles to have at least part of the organosilane absorbed in the above described ultrafine particle-resin composite particles, followed by making hydrolysis and condensation reactions of this organosilane progress.

<<2>> A reaction is carried out to generate the above described ultrafine particle-resin composite particles in the presence of the above described organosilane condensate, etc. dispersed in the aqueous medium.

In order to have organosilane absorbed in ultrafine particle-resin composite particles in the above described method <<1>>, this may be done in accordance with a method in which organosilane is added in the emulsion, and is sufficiently stirred, and so on. At this time, preferably, 10% by weight or more (more preferably, 30% by weight or more) of added organosilane is absorbed in the particles. For avoiding the situation in which the hydrolysis/condensation reaction of organosilane takes place when organosilane is not sufficiently absorbed yet, adjustments may be made so that the pH of the reaction system is 4 to 10, preferably 5 to 10, further preferably 6 to 8. The process temperature at which organosilane is absorbed in the ultrafine particle-resin composite particles is preferably 70° C. or lower, more preferably 50° C. or lower, further preferably 0 to 30° C. Process time is usually 5 to 180 minutes, preferably about 20 to 60 minutes.

The temperature at which absorbed organosilane is hydrolyzed/condensed is normally 30° C. or higher, preferably 50 to 100° C., more preferably 70 to 90° C., and polymerization time is preferably 0.3 to 15 hours, more preferably 1 to 8 hours.

Also, in the above described method <<2>>, the above described organosilane is mixed in the aqueous solution of strong acid emulsion such as alkyl benzenesulfonic acid using a homomixer, a supersonic mixer or the like to hydrolyze/condense the organosilane, whereby the organosilane condensate, etc. dispersed in a aqueous medium is obtained. The above described organic particles may be produced in the presence of this organosilane condensate, etc., preferably by emulsion polymerization.

[Dielectrics]

The dielectric-forming composition according to Invention 5 may be used as necessary in production of dielectrics of high permittivity that are obtained by heating the dielectric-forming composition at a certain temperature or lower, directly or with additives added thereto. Also, the dielectric-forming composition may be used in production of dielectrics of high permittivity that are obtained by coating the dielectric-forming composition on a substrate and heating the same at a certain temperature or lower, with well known conventional additives blended therein as necessary preferably in the form of the above described electrodeposition liquid for formation of dielectrics. For the method of coating the dielectric-forming composition, well known methods may be used, and for example, screen printing, a various kinds of coaters (such as a blade coater, a slit coater, a curtain coater, a wore coater, and a die coater), the electrodeposition method and the like may suitably be used. Of these, the electrodeposition is excellent and preferable in the sense that the dielectric layer can be formed only in conductive portions selectively in such a manner as to reduce losses.

Also, the shape of dielectrics varies depending on applications, and is not particularly limited, but it is preferable that the dielectric-forming composition according to the present invention is used as a thin film-shaped layer of high permittivity. In addition, in the present invention, a thin film-shaped dielectric can be formed on the conductive foil.

Conductive Foils

The conductive foil for use in Invention 5 is not particularly limited as long as it has electrical conductivity, and may include foils made of copper, gold, silver, platinum, nickel, stainless, aluminum, iron and various kinds of alloys. Of these foils, foils made of copper, gold, silver, platinum, nickel and aluminum are particularly preferable in terms of oxidation resistance, electrical conductivity and flexibility. Also, a laminate of two or more conductive foils, or a board with foils laminated on a resin substrate or non-woven fabric resin impregnated substrate may be used as necessary. The thickness of these conductive foils is not particularly limited, but is usually in the range of from 5 to 75 μm, preferably from 8 to 50 μm, particularly preferably from 10 to 25 μm.

Methods of Producing Dielectrics

The dielectric of Invention 5 can be obtained by heating the above described dielectric-forming composition of Invention 5 at a temperature of 500° C. or lower, and the heating temperature is preferably 100 to 500° C., further preferably 150 to 300° C. More detailed explanation will be presented below.

The electrodeposition liquid for formation of dielectrics of Invention 5 may be used in formation of dielectrics, directly or in the diluted or condensed form and with well known conventional additives blended therein as necessary. By a usual electrodeposition method using this electrodeposition liquid for formation of dielectrics, ultrafine particle-resin composite particles in the electrodeposition liquid for formation of dielectrics and inorganic particles or inorganic composite particles can be electro-deposited on the surface of electrodes and the like to produce dielectrics.

For producing the dielectric of invention 5, it is desirable that the resin component of electro-deposited particles is further thermally cured. For conditions for the heat-curing, the resin component is thermally cured at 500° C. or lower, preferably at 100 to 500° C., more preferably at 150 to 300° C. The heating time is preferably in the range of from 5 minutes to 24 hours, further preferably from 10 minutes to 12 hours.

Properties of Dielectrics

For the dielectric obtained from this dielectric-forming composition of Invention 5, the permittivity is 30 or greater, preferably 100 or greater, further preferably 150 or greater, particularly preferably 200 or greater, and the dielectric loss tangent is 0.1 or smaller, preferably 0.08 or smaller, further preferably 0.06 or smaller. The lower limit of the dielectric loss tangent is not particularly limited. Also, the leakage current of the dielectric is $10^{-8}$ A/cm$^2$ or smaller, preferably $10^{-9}$ A/cm$^2$ or smaller, further preferably $10^{-10}$ A/cm$^2$ or smaller.

Furthermore, the thickness of the dielectric is preferably 50 μm or smaller, more preferably 30 μm or smaller. The lower limit of the thickness of the dielectric is not specified, but is usually 1 μm or larger.

[Electronic Parts]

The dielectric of the present invention is capable of forming a condenser and the like that can be obtained by heating and baking at a temperature of 500° C. or lower, have permittivity of 30 or greater and dielectric loss tangent of 0.1 or smaller, and have reduced thickness and increased electrostatic capacitance. Also, the electronic part such as a print circuit board, a semiconductor package, a condenser and a high frequency antenna comprising the dielectrics have a small size and high density.

Multilayer Circuit Board

The multilayer circuit board of the present invention is a buildup multilayer circuit board in which conductor layers and interlayer resin insulation layers are laminated alternatingly on an insulation substrate, and the conductor layers are connected to each other by a via hole, wherein the above described dielectric layer according to Inventions 1 to 5 is provided between the two conductor layers neighboring in the vertical direction.

Methods of Producing Multilayer Circuit Board

One method of producing the multilayer circuit board of the present invention will now be described.

The method of producing the multilayer circuit board according to the present invention is a method of producing a multilayer circuit board provided with a buildup wiring layer in which conductor layers and interlayer resin insulation layers are laminated alternatingly on an insulation substrate, and the conductor layers are connected to each other by a via hole, comprising at last the following steps (1) to (4):

(1) step of forming a first conductor circuit on the above described insulation resin substrate;

(2) step of forming an interlayer resin insulation layer with which the above described conductor circuit is covered;

(3) step of forming an opening extending from the above described interlayer resin insulation layer to the above described conductor circuit, and forming a dielectric layer by applying in the opening a dielectric-forming composition containing composite particles for dielectrics in which part or all of the surfaces of inorganic particles with permittivity of 30 or greater are coated with a conductive metal or a compound thereof, or a conductive organic compound or a conductive inorganic material; and (4) step of forming on the surface of the above described interlayer resin insulation layer a second conductor circuit with which the above described dielectric layer is covered.

The steps will be described more specifically below.

<<1>> First, a wiring board having an inlayer copper pattern formed on the surface of an insulating resin substrate is prepared. The resin substrate is preferably a resin substrate having inorganic fibers, and specifically, at least one type of substrate selected from a glass cloth epoxy substrate, a glass cloth polyimide substrate, a glass cloth bismaleimide-triazine resin substrate and glass cloth fluorine resin substrate is preferably used for the resin substrate. Formation of the copper pattern on this resin substrate is carried out by etching a copper-clad laminate with copper foils bonded to the both sides of the resin substrate. Also, a perforating hole is bored in this substrate by a drill, and nonelectrolytic plating is applied to the wall surface of the perforating hole and the surfaces of the copper foils to form a through-hole. For the nonelectrolytic plating, copper plating is preferably applied. Furthermore, in the case of a substrate to which plating is not smoothly applied, such as a fluorine resin substrate, it is preferable that the plate is treated with a pre-treatment liquid containing organomatallic sodium (tradename: Tetraetch), or is subjected to surface modification treatment such as plasma treatment, and thereafter nonelectrolytic plating is applied to the substrate.

Then, electrolytic plating is applied for formation in large thickness. For this electrolytic plating, copper plating is suitable. Furthermore, roughness treatment may be applied to the inner wall of the through-hole and the surface of the electrolytic-plated film. For the roughness treatment densification (oxidation)-reduction treatment, spray treatment with a mixed water solution of organic acid and cupric complex, treatment by plating a copper-nickel-phosphorous needle alloy or the like can be considered. In addition, it is also possible to fill the through-hole with a conductive paste, and form a conductive layer with which the conductive paste is covered by nonelectrolytic plating or electrolytic plating, as necessary.

<<2>> Interlayer resin insulation layers are formed on the both sides of the wiring board prepared in the above described step <<1>>. This resin insulation layer serves as the interlayer resin insulation layer of the composite printed-wiring board. This interlayer resin insulation layer is formed by coating an uncured resin liquid, and hot-pressing a filmy resin to laminate the same.

<<3>> Then, in this interlayer resin insulation layer are provided an opening for a via hole for securing electric connection with the inner conductor circuit and an opening for formation of the dielectric layer for forming the dielectric layer between inner and outer conductor circuits as described later. These openings are bored by a laser. The laser to be used is carbon dioxide gas laser, an ultraviolet laser, an excimer laser, a UV laser or the like. Then, if the opening is bored by the carbon dioxide gas laser, desmear processing is carried out. This desmear processing may be carried out using an oxidant composed of a solution of chromic acid, permanganate or the like, and processing with oxygen plasma, mixed plasma of $CF_4$ and oxygen, corona discharge or the like is acceptable. Also, surface modification can be carried out by using a low pressure mercury lamp to apply ultraviolet light. In particular, the mixed plasma of $CF_4$ and oxygen is advantageous because hydrophilic groups such as a hydroxyl group and carbonyl group can be introduced in the resin surface, thus making it possible to easily conduct subsequent CVD and PVD processing.

<<4>> The above described dielectric-forming composition according to Inventions 1, 3 and 5 is applied in the opening for formation of dielectric layers provided in the above described step <<3>> to form a dielectric layer. For the method of application, a method in which the opening is filled with the dielectric-forming composition by the electrodeposition method, the printing method, the spin coat method, the film laminate method, a method using a roll coater, a method using a curtain coater or the like is suitably used. At this time, for the opening for formation of via holes, it is desirable that openings other than the opening for formation of dielectric layers are covered by appropriate means, for example sticking a PET film.

<<5>> After the dielectric layer is formed in the way described in the above described step <<4>>, excessive materials of high permittivity existing on the surface of the interlayer resin insulation layer are removed by an appropriate method such as etching treatment. Such etching treatment includes etching using $KMnO_3$, $HF-NO_3$ or chromic acid, or dry etching.

<<6>> Then, the PET film for covering the via hole that has been stuck in the above described step <<4>> is peeled away, and thereafter conductor layers made of copper are formed on the surface of the dielectric layer, the surface of the resin insulation layer and the wall surface in the opening for formation of via holes by the PVD method, the CVD method or the plating method. The PVD method specifically includes vapor deposition methods such as sputtering and ion beam sputtering. Also, the CVD method specifically includes PE-CVD (Plasma Enhanced CVD) using as supply materials organometals (MO) such as allyl cyclopentadiphenyl paradium, dimethyl gold acetyl acetate, tin tetramethyl acrylonitrile and dicobalt octacarbonyl acrylonitrile.

<<7>> Then, a conductor layer is further formed on the copper conductor layer formed in the way described in the above described step <<6>> to provide a thin conductor layer constituted of two layers arranged in the vertical direction. For the upper conductor layer, it is desirable that a copper layer is provided by spattering in consideration of adhesion with the copper conductor layer formed in the above described step and antioxidation. It is desirable that the thickness of the thin conductor layer is 1 μm or smaller. In addition, a nonelectrolytic plated layer of same type may be formed on the above described conductor layer provided by sputtering. Copper plating is most suitable for this nonelectrolytic plating, and it is desirable that the thickness of the layer is in the range of from 0.1 to 3 μm. This is because the layer can be etched away without damaging the function as a conductor layer for electrolytic plating to be conducted later.

<<8>> Then, a plating resist is formed on the conductor layer formed in the above described step <<7>>. This plating resist is formed by laminating a photosensitive dry film to the layer, and exposing the layer to light to carry out development processing.

<<9>> Then, electrolytic plating is carried out using as a plating lead the upper conductor layer obtained in the above described step <<7>> to form a conductor circuit in large thickness and fill the opening for formation of via holes. The thickness of this electrolytic plated layer is preferably 5 to 30 μm.

<<10>> After electrolytic plating in the step <<9>>, the plating resist is peeled away, and the copper sputtered layer formed in the above described steps <<6>> and <<7>>, which is located below the above described plating resist, is etched away. For the etching method, a usual etching method such as dipping and spray is employed. Thereby, the copper sputtered layer as a thin conductor layer is completely removed to provide a printed-wiring board with the copper sputtered layer constituting a conductor circuit and the copper electrolytic plated layer left thereon.

<<11>> Further, the above described steps <<2>> to <<10>> are repeated, whereby a multillayered printed-wiring board is produced.

Each of these steps will be described in detail using FIGS. 3 to 5 in Examples.

Furthermore, the semi-additive method has been adopted as a method of forming the conductor circuit in the above explanation, but the full-additive method may also be adopted. In this full-additive method, a thin conductor layer is formed on the surface of the resin insulation layer by CVD or PVD treatment, and thereafter a photosensitive dry film is laminated or a liquid photosensitive resin is applied thereto, and is exposed to light and developed to provide a plating resist, and is subjected to nonelectrolytic plating treatment to form a conductor layer in large thickness to form a conductor circuit. Alternatively, the conductor circuit can also be formed by forming a plating resist on the surface of the resin insulation layer, and thereafter providing a thin conductor layer by CVD or PVD treatment, and removing this conductor layer bonded on the surface of the plating resist by grinding for example, to removing the plating resist itself, and carrying out nonelectrolytic plating using this conductive layer as a catalyst.

Wiring Board

The wiring board according to the present invention is a wiring board having at least a signal layer, a power layer, a grounding layer and an insulation layer, wherein the dielectric layer according to the above described Inventions 1 to 5 is provided between the above described power layer and the above described grounding layer.

Method of Producing Wiring Board

The method of producing the wiring board according to the present invention is a method of producing a wiring board having at least a signal layer, a power layer, a grounding layer and an insulation layer in which a dielectric layer is placed between the above described power layer and grounding layer, wherein the dielectric layer is formed using a dielectric-forming composition containing composite particles for dielectrics in which part or all of the surfaces of inorganic particles with permittivity of 30 or greater are covered with a conductive metal or a compound thereof, or a conductive organic compound or a conductive inorganic material.

Method of Producing Wiring Board

One method of producing the wiring board of the present invention will be described.

The wiring board of the present invention is schematically shown in FIG. 6. Furthermore, the figure emphasizes the direction of thickness for convenience of explanation. In FIG. 6, reference numeral 1 denotes a semiconductor, reference numeral 10 denotes a signal layer, reference numeral 12 denotes a power layer, and reference numeral 14 denotes a grounding layer. The power layer 12 and a power line are connected to each other by a connection piece 16, and the grounding layer 14 and a grounding line are connected to each other by a connection piece 18. In the wiring board of the present invention, a dielectric layer 24 for acting as a decoupling condenser is provided between the power layer 12 and the grounding layer 14, and this dielectric layer is formed from the dielectric-forming composition described above. This dielectric layer 24 is wedged with by conductor foils 22, and bonded to the power layer 12 and the grounding layer 14 via a jointing layer 26. Also, it is preferable that a connection is made between the signal layer 10 and the power layer 12 by an electric insulation layer 20 such as polyimide.

Methods of incorporating the dielectric layer 24 in the wiring board of the present invention include:

(1) method in which the dielectric layer 14 is formed as a separate component, and is thereafter incorporated in the wiring board.
(2) method in which the dielectric layer 14 is formed while it is incorporated in the wiring board.

As an example of the method (1), a wide conductor foil is coated with the dielectric-forming composition of the above described Inventions 1 to 5, and a conductor foil is further formed thereon, whereby a condenser body with a dielectric gripped at its midpoint position is formed, and the condenser body is punched in alignment with the grounding layer, followed by electrically connecting this condenser part by a well known method. This condenser part can be bonded to the grounding layer by, for example, the solder joint method by lead-tin, gold-tin, silver-copper-tin, silver-tin and the like, and conductive adhesives. The condenser part may be formed as a separate part in accordance with the size of the power layer 12 and the like as shown in FIG. 6, or the condenser body, which is formed in large size, may be punched to prepare a condenser part having a predetermined size as shown in FIG. 7. Also, the above described condenser part can be used with its size and shape designed as appropriate in accordance with the form of the wiring board. For example, by forming the grounding layer in a divided form, an appropriate electric capacitance can be set in each division.

Figure 8A:
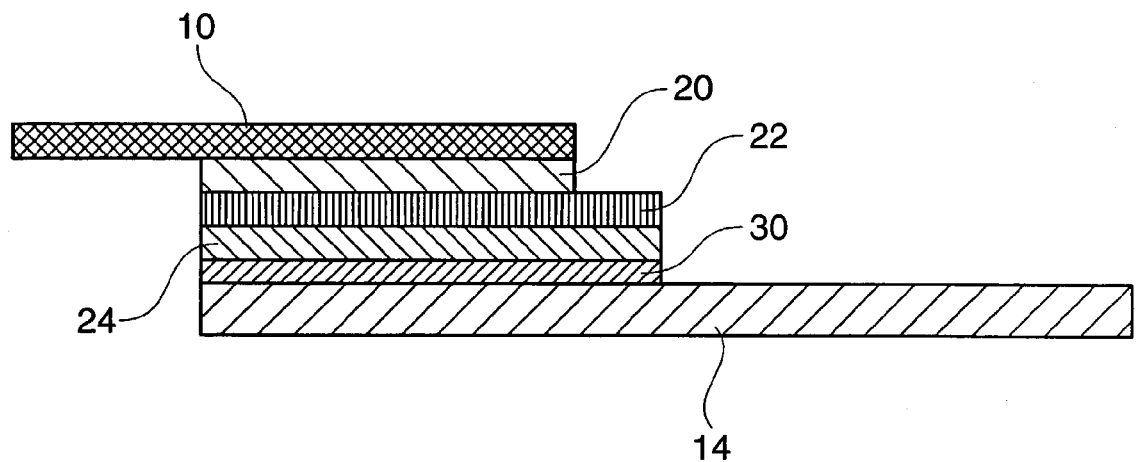
Figure 8B:
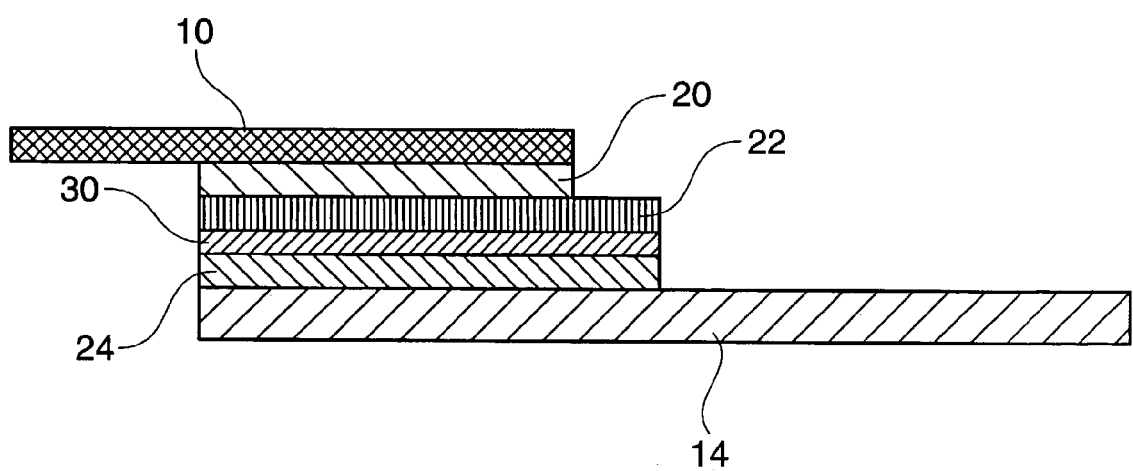

As an example of the method (2), the conductor foil 22 formed in accordance with the size of the power layer 12 and the like is coated with the above described dielectric-forming composition to form the dielectric layer 24, and is electrically and mechanically connected directly to a frame serving as the grounding layer 14 by a conductive adhesive 30 or the like (FIG. 8A). In addition, it is also possible to form a mask with a resist or the like so as to obtain a shape suitable for application to the grounding layer as necessary, and thereafter coat the above described dielectric-forming composition to form the dielectric layer 24, and thereafter electrically and mechanically connect the same directly to the power layer 12 by the conductive adhesive 30 or the like (FIG. 8B).

Also, for the wiring board described above, the lowermost layer is the grounding layer, but the order in which the power layer and the grounding layer are arranged can be set as appropriate, and the composite wiring board can be applied in a similar way. This composite wiring board of the present invention has a decoupling condenser included in the wiring board, thus making it possible to obtain a semiconductor device having the decoupling condenser in the vicinity of the position at which a semiconductor chip is mounted and obtain a semiconductor device excellent in properties of processing high signals, by directly mounting the semiconductor chip on the composite wiring board and resin-molding the same.

INDUSTRIAL APPLICABILITY

By using the composite particles for dielectrics of Invention 1, a dielectric or a film of high permittivity having small dielectric loss tangent of 0.1 or smaller and high permittivity of 30 or greater can be formed at a low heating temperature of 500° C. or lower as described above.

Also, since the film of high permittivity of Invention 1 can be prepared by screen printing and electrodeposition using a dielectric paste and aqueous dispersions for electrodeposition, it enables thickness to be controlled easily by adjustment of printing conditions and electrodeposition conditions, and has excellent formability and conformability with a substrate.

In addition, for the method of forming a film by an electrodeposition liquid, a film of high permittivity can be formed in a selective manner, thus making it possible to prepare the film of high permittivity at low costs and with high accuracy compared to photolithography, the printing method and the like.

The film of high permittivity of invention 1 has reduced thickness and increased permittivity, and is therefore used suitably in electronic parts and the like such as a print circuit board, a semiconductor package, a condenser and a high frequency antenna.

The electronic part of invention 1 has the above described film of high permittivity, and thus can be downsized and thinned.

By using the dielectric layer with a conductive foil according to Invention 1 or the dielectric layer with a conductive foil capable of being laminated according to Invention 2, the condenser can easily be formed at a low heating temperature of 300° C. or lower.

Also, the dielectric layer with a conductive foil of the present invention has reduced thickness and increased permittivity, and thus can be used suitably in electronic parts and the like such as a print circuit board, a semiconductor package, a condenser and a high frequency antenna.

By using the dielectric-forming composition according to Invention 3, a dielectric of high permittivity having small dielectric loss tangent of 0.1 or smaller and high permittivity of 30 or greater can be formed at a low heating temperature of 500° C. or lower as described above, and a pattern of high dimensional accuracy can be formed.

The dielectric of Invention 3 has reduced thickness and increased permittivity, and thus can be used suitably in electronic parts and the like such as a print circuit board, a semiconductor package, a condenser and a high frequency antenna. Also, the electronic part of Invention 3 has the above described dielectric, and thus can be downsized and thinned.

By using the photosensitive transfer film according to Invention 4, a dielectric of high permittivity having small dielectric loss tangent of 0.1 or smaller and high permittivity of 30 or greater can be formed at a low heating temperature of 500° C. or lower as described above.

The dielectric of Invention 4 has reduced thickness and increased permittivity, and thus can be used suitably in electronic parts and the like such as a print circuit board, a semiconductor package, a condenser and a high frequency antenna. Also, the electronic part of Invention 4 has the above described dielectric, and thus can be downsized and thinned.

By using the dielectric-forming composition of Invention 5, a dielectric of high permittivity having small dielectric loss tangent of 0.1 or smaller and high permittivity of 30 or greater can be formed at a low heating temperature of 500° C. or lower as described above.

Also, since the dielectric of Invention 5 can be prepared by electrodeposition using an electrodeposition liquid for formation of dielectrics, it enables thickness to be controlled easily by adjustment of electrodeposition conditions and the like, and has excellent formability and conformability with a substrate. In addition, for the method of forming a film by an electrodeposition, a layer of high permittivity can be formed in a selective manner, thus making it possible to prepare the layer of high permittivity at low costs and with high accuracy compared to photolithography, the printing method and the like. The dielectric of Invention 5 has reduced thickness and increased permittivity, and thus can be used suitably in electronic parts and the like such as a print circuit board, a semiconductor package, a condenser and a high frequency antenna. The electronic part of Invention 5 has the dielectric of high permittivity, and thus can be downsized and thinned.

According to the composite printed-wiring board of Invention 6, by using a specific dielectric-forming composition, a dielectric layer of high permittivity can be formed in the interlayer resin insulation layer between the inner conductor circuit and the outer conductor circuit in the buildup wiring layer to provide a condenser capability in the wiring layer, thus making it possible to obtain power stability in the high frequency region.

The wiring board according to Invention 7 has a dielectric layer provided between layers to include therein a decoupling condenser having a large electric capacitance as described above, and can be provided as a composite wiring board excellent in properties of processing high speed signals. Also, since the above described dielectric-forming composition is used to form the condenser part, conventional production processes can be applied to produce the wiring board, and the wiring board including therein a decoupling condenser can easily be produced. Also, by producing the condenser component as a separate component, a large electric capacitance can easily be obtained, and production costs can be reduced.

The semiconductor device provided with the wiring board according to the present invention enables the decoupling condenser to be provided in the vicinity of the position at which the semiconductor chip is mounted, and is an excellent semiconductor device having excellent power stability in the high frequency region, which can be used effectively for processing high speed signals and so on.

EXAMPLES

The present invention will be described more specifically below using Examples, but the present invention is not limited to these Examples. Furthermore, in the following description, "parts" and "%" are based on weight unless otherwise specified. Also, the weight average molecular weight (Mw) in Examples is polystyrene equivalent average weight measured by gel permeation chromatography (GPC) (trade name: HLC-802A) manufactured by Toso Co., Ltd.

Example A

Corresponding to Invention 1

Example A1

Production of Composite Particles for Dielectrics (1)

Barium titanate particles (trade name: "HPAT-1" manufactured by Fuji Titanium Co., Ltd., average particle size: 0.6 μm, permittivity : 2000) was coated with silver under reduced pressure by the vapor deposition method to obtain composite particles for dielectrics (1) with the surface of barium titanate coated with silver.

A change in weight before and after the vapor deposition showed that barium titanate had 10% of silver deposited thereon. Also, it was shown from SEM observation of powders that fine particles of silver were deposited on the surfaces of particles.

Example A2

Production of Composite Particles for Dielectrics (2)

100 parts of barium titanate particles (trade name: "AT-02" manufactured by Sakai Chemical Industry Co., Ltd., average particle size: 0.2 μm, permittivity: 2000) and 6 parts of Ketjenblack were preliminarily mixed together, and composite particles for dielectrics (2) with Ketjenblack deposited on the surface of barium titanate were obtained by the mechanochemical method using a hybridizer (Nara Kikai Co., Ltd.).

It was shown from SEM observation of the resulting powders that fine particles of carbon were deposited on the surfaces of particles. Also, it was shown by SIMS that barium titanate had 5% of carbon deposited on the surface based on the weight ratio.

Example A3

Production of Composite Particles for Dielectrics (3)

The surfaces of titanium oxide particles (trade name: "TTO-55" manufactured by Ishihara Sangyo Co., Ltd. average particle size: 0.2 μm, permittivity: 110) were coated with nickel by the nonelectrolytic phosphorous-nickel plating method to obtain composite particles for dielectrics (3).

It was shown from SEM observation of the resulting powders that fine particles of nickel were deposited on the surfaces of particles. Also, it was shown by SIMS that barium titanate had 20% of nickel deposited on the surface based on the weight ratio.

Example A4

Production of Composite Particles for Dielectrics (4)

100 parts of barium titanate particles (trade name: "HPAT-1" manufactured by Fuji Titanium Co., Ltd., average particle size: 0.6 μm, permittivity : 2000) and 10 parts of fine particles of silver (manufactured by Vacuum Metallurgical Co., Ltd., average particle size: 0.05 μm) are premixed, and composite particles for dielectrics (4) with silver deposited on the surface of barium titanate were obtained by the mechanochemical method using a hybridizer (Nara Kikai Co., Ltd.).

It was shown from SEM observation of the resulting powders that fine particles of silver were deposited on the surfaces of particles. Also, it was shown by SIMS that barium titanate had 8% of silver deposited on the surface based on the weight ratio.

Example of Synthesis A1

Preparation of Polymer: Production of Thermoset Resin (Epoxy Group-Containing Polymer)

In a reaction container, 25 g of glycidyl methacrylate (referred to as GMA in abbreviated form), 10 g of acrylonitrile (referred to as AN in abbreviated form), 15 g of methylmethacrylate (referred to as MMA in abbreviated form), and 50 g of dioxane (referred to as DOX in abbreviated form) were mixed together to prepare a uniform reaction stock solution.

This reaction stock solution was subjected to nitrogen bubbling for 30 minutes, followed by adding thereto 1.9 g of 2,2-azobisisobutylonitrile (referred to as AIAN in abbreviated form) as a polymerization initiator.

The temperature in the reaction vessel was increased to 70° C. while nitrogen bubbling was continued. The polymerization reaction was continuously carried out at the same temperature for 7 hours. The resulting reaction solution was mixed with a large amount of hexane to solidify the polymer, and thereafter this polymer was collected and redissolved in dioxane. This process of solidification by hexane and redissolution in dioxane was repeated 5 times to remove unreacted monomers. Then, dioxane was evaporated under reduced pressure at 70° C. to obtain a white epoxy group-containing polymer. The weight average molecular weight of this polymer was measured using GPC (gel permeation chromatography) to find that it was 110,000.

Example of Synthesis A2

Preparation of Organic Particle Emulsion: Polyimide Based Resin Emulsion 32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2, 5-dioxo-3-furanyl)-naphtho [1,2-c]-furane-1,3-dion, 36.95 g (90 milimol) of 2,2-bis[4-(4-aminophenoxy) phenyl] propane as a diamine compound and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate and 1 part of azobisisobutylonitrile were continuously added to this reaction vessel for 5 hours while the mixture was made to undergo solution polymerization under stirring. After the mixture was completely added, the mixture was further stirred continuously at 85° C. for 2 hours and the solution polymerization was completed to obtain an acryl polymer solution with solid content of 50%.

50 parts (solid content) of polyimide solution, 30 parts (solid content) of acryl polymer solution and 20 parts of Epicoat 828 (trade name of a product manufactured by Yuka Shell Epoxy Co., Ltd.) were mixed together and reacted at 70° C. for 3 hours, and thereafter 3 parts of acetic acid were gradually added thereto and mixed to adjust pH. Then, 1000 parts of distilled water were gradually added thereto and vigorously stirred to obtain a cationic emulsion of organic particles having polyimide based resin as a principal constituent.

Example of Synthesis A3

Preparation of Organic Particle Emulsion: Epoxy Based Resin Emulsion 46.3 parts of block isocyanate constituted of tolylene diisocyanate and 2-ethylhexanol, and 89.3 parts of epoxyamine adduct obtained by reacting Epicoat 828 (trade name of a product manufactured by Yuka Shell Epoxy Co., Ltd.) with diethylamine were mixed together, and 3.8 parts of acetic acid was added thereto as a pH regulator. This was put into 1200 parts of ion-exchanged water under stirring, whereby a cationic emulsion of organic particles having an epoxy based resin precursor as a principal constituent was obtained.

Example A5

Preparation of Dielectric Paste 8 parts by weight of Epicoat 1004 being an epoxy resin (average molecular weight: 1600, manufactured by Yuka Shell Epoxy Co., Ltd.) as a thermoset resin, and 3 parts by weight of epoxy group-containing polymer obtained in Example of Synthesis 1 were dissolved in 60 parts by weight of butyl acetate Cellosolve to prepare a uniform resin solution. To this resin solution were added 100 parts by weight of composite particles for dielectrics (1) obtained in Example A1 and 8 parts of acetylene black. Then, a triple roll was used to knead these dielectric paste composition materials for one hour to prepare a dielectric paste. The viscosity of this dielectric paste was 50000 mPa·s.

Example A6

Preparation of Aqueous Dispersions for Electrodeposition 15 parts by weight of composite particles for dielectrics (1) obtained in Example A1 and 0.2 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent, obtained in Example of Synthesis A2, were mixed with 100 parts by weight of the above described dispersions to prepare aqueous dispersions for electrodeposition.

Example A7

Preparation of Aqueous Dispersions for Electrodeposition 15 parts by weight of composite particles for dielectrics (4) obtained in Example A4 and 0.1 parts by weight of acetylene black were mixed with 85 parts by weight of isopropyl alcohol by a homomixer, were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent that had been obtained in Example of Synthesis A2 were mixed with 100 parts by weight of the above described dispersions to prepare aqueous dispersions for electrodeposition.

Example A8

Preparation of Aqueous Dispersions for Electrodeposition 15 parts by weight of composite particles for dielectrics (2) obtained in Example A2 and 0.1 parts by weight of silicon carbide (average particle size: 0.1 µm) were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 20 parts of cationic emulsion of organic particles having an epoxy based resin as a principal constituent that had been obtained in Example of Synthesis A3 were mixed with 100 parts by weight of the above described dispersions to prepare aqueous dispersions for electrodeposition.

Comparative Example A1

A paste composition was obtained in just a same way as Example A5 except that barium titanate particles (manufactured by Fuji Titanium Co., Ltd., trade name: "HPAT-1", average particle size: 0.6 µm, permittivity : 2000) were used instead of the composite particles for dielectrics (1) obtained in Example A1.

Comparative Example A2

Aqueous dispersions were prepared in just a same way as Example A6 except that barium titanate particles (manufactured by Fuji Titanium Co., Ltd., trade name: "HPAT-1", average particle size: 0.6 µm, permittivity : 2000) were used instead of the composite particles for dielectrics (1) obtained in Example A1.

Formation of Film and Evaluation of Performance Thereof

<<1>> Coating by Screen Printing Method

The dielectric paste of the above described Example A5 and Comparative Example A1 was printed on a copper foil by a screen printer. It was prebaked at 100° C. for 10 minutes, and was thereafter heat-cured in an oven at 150° C. for 30 minutes. When its thickness was measured by an electro magnetic thickness tester, it was shown that a uniform coating of dielectric film with thickness of 20 µm was obtained.

<<2>> Coating by Electrodeposition Method

Copper plates as cathodes and SUS plates as counter-electrodes were placed in the aqueous dispersions for electrodeposition of the above described Examples A6 to A8 and Comparative Example A2, respectively, and particles were electro-deposited on the copper plate on the cathode side by the constant-voltage method of 100 V. Thereafter, the dispersions were heated at 100° C. for 10 minutes, and were further heated at 250° C. for 30 minutes for Examples A6 and A7 and Comparative Example A2 and at 150° C. for 30 minutes for Example A8 to obtain dielectric films with thickness of 10 μm.

The performance of films produced through Examples A5 to A8 and Comparative Examples A1 and A2 was evaluated in accordance with the following methods.

The results are shown in Table A1.

[Permittivity, Dielectric Loss Tangent, Volume Resistivity and Leakage Current]

The permittivity, dielectric loss tangent and volume resistivity were measured in accordance with JIS K6911. Also, the leakage current was measured by an insulation resistance meter (manufactured by Hewlett-Packard Co., Ltd.).

The permittivity and dielectric loss tangent represent values measured at the frequency of 1 MHz.

[Resistance to Moist Heat (HAST Test)]

For cured films, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

◯ . . . no significant difference and satisfactory level of resistance.

× . . . significant difference and unsatisfactory level of resistance.

As apparent from Table A1, the films obtained from Examples A5 to A8 showed satisfactory electrical characteristics. For Examples A6 and A7 in which polyimide was used as organic particles, films having particularly high volume resistivity and small leakage current were obtained.

On the other hand, Comparative Examples A1 and A2 being outside the scope of the present invention were inferior in dielectric loss tangent.

Example B

Corresponding to Invention 1

Example B1

Production of Composite Particles for Dielectrics (1)

The surfaces of barium titanate particles (trade name: "HPBT-1", manufactured by Fuji Titanium Co., Ltd., average particle size: 0.6 μm, permittivity: 2000) were coated with nickel by the nonelectrolytic phosphorous-nickel plating method to obtain composite particles for dielectrics (1).

It was shown from SEM observation of the resulting powders that fine particles of nickel were partially deposited on the surfaces of particles. Also, it was shown by SIMS that barium titanate had 5% of nickel deposited on the surface based on the weight ratio. On the other hand, the specific area of powders was 3.6 m²/g.

Example B2

Production of Composite Particles for Dielectrics (2)

The surfaces of barium titanate particles (trade name: "HPBT-1", manufactured by Fuji Titanium Co., Ltd., aver-

TABLE A1

| | | Example A5 | Example A6 | Example A7 | Example A8 | Comparative example A1 | Comparative example A2 |
|---|---|---|---|---|---|---|---|
| Composite particles for dielectrics | Material of inorganic particles (parts) | Barium titanate (90) | Barium titanate (90) | Barium titanate (92) | Barium titanate (95) | Barium titanate (100) | Barium titanate (100) |
| | Particle size of inorganic particles (μm) | 0.6 | 0.6 | 0.6 | 0.2 | 0.6 | 0.6 |
| | Conductive material (parts) | Silver (10) | Silver (10) | Silver (8) | Carbon (5) | — | — |
| | Number of parts (solid content) | 100 | 15 | 15 | 15 | 100 | 15 |
| Resin component | Material of resin | Epoxy | Polyimide | Polyimide | Epoxy | Epoxy | Polyimide |
| | Number of parts (solid content) | 11 | 2 | 2 | 2 | 11 | 2 |
| Volume ratio | Composite particles for dielectrics/resin component | 59/41 | 54/46 | 55/45 | 61/39 | 60/40 | 56/44 |
| Process conditions | Coating method | Printing | Electro-deposition | Electro-deposition | Electro-deposition | Printing | Electro-deposition |
| | Baking temperature (° C.) | 150 | 250 | 250 | 150 | 150 | 250 |
| Film | Thickness (μm) | 20 | 20 | 20 | 20 | 20 | 20 |
| | Permittivity | 120 | 180 | 300 | 150 | 120 | 120 |
| | Dielectric loss tangent | 0.05 | 0.05 | 0.04 | 0.04 | 0.5 | 0.6 |
| | Resistance to moist heat | ◯ | ◯ | ◯ | ◯ | ◯ | ◯ |
| | Volume resistivity (Ωcm) | $10^{13}$ | $10^{15}$ | $10^{14}$ | $10^{13}$ | $10^{13}$ | $10^{14}$ |
| | Leakage current (A/cm²) | $10^{-11}$ | $10^{-12}$ | $10^{-11}$ | $10^{-11}$ | $10^{-11}$ | $10^{-11}$ | age particle size: 0.6 μm, permittivity: 2000) were coated with silver by the nonelectrolytic silver plating method to obtain composite particles for dielectrics (2).

It was shown from SEM observation of the resulting powders that fine particles of silver were partially deposited on the surfaces of particles. Also, it was shown by SIMS that barium titanate had 1% of silver deposited on the surface based on the weight ratio. On the other hand, the specific area of powders was 3.4 $m^2/g$.

Example B3

Production of Composite Particles for Dielectrics (3)

The surfaces of barium titanate particles (trade name: "HPBT-1", manufactured by Fuji Titanium Co., Ltd., average particle size: 0.6 μm, permittivity: 2000) were coated with copper by the nonelectrolytic copper plating method to obtain composite particles for dielectrics (3).

It was shown from SEM observation of the resulting powders that fine particles of copper were partially deposited on the surfaces of particles. Also, it was shown by SIMS that barium titanate had 10% of copper deposited on the surface based on the weight ratio. On the other hand, the specific area of powders was 3.7 $m^2/g$.

Example B4

Production of Composite Particles for Dielectrics (4)

The surfaces of calcium titanate particles (average particle size: 2 μm, permittivity: 140) were coated with nickel by the nonelectrolytic phosphorous-nickel plating method to obtain composite particles for dielectrics (4).

It was shown from SEM observation of the resulting powders that fine particles of nickel were partially deposited on the surfaces of particles. Also, it was shown by SIMS that calcium titanate had 2% of nickel deposited on the surface based on the weight ratio. On the other hand, the specific area of powders was 1.5 $m^2/g$.

Example B5

Production of Composite Particles for Dielectrics (5)

The surfaces of barium titanate particles (trade name: "BTZ-02", manufactured by Sakai Chemical Industry Co., Ltd., average particle size: 0.2 μm, permittivity: 2000) were coated with nickel by the nonelectrolytic phosphorous-nickel plating method to obtain composite particles for dielectrics (5).

It was shown from SEM observation of the resulting powders that fine particles of nickel were partially deposited on the surfaces of particles. Also, it was shown by SIMS that barium titanate had 5% of nickel deposited on the surface based on the weight ratio. On the other hand, the specific area of powders was 7.6 $m^2/g$.

Example of Synthesis B1

Preparation of Polymer: Production of Thermoset Resin (Epoxy Group-Containing Polymer)

In a reaction container, 25 g of glycidyl methacrylate (referred to as GMA in abbreviated form), 10 g of acrylonitrile (referred to as AN in abbreviated form), 15 g of methylmethacrylate (referred to as MMA in abbreviated form), and 50 g of dioxane (referred to as DOX in abbreviated form) were mixed together to prepare a uniform reaction stock solution.

This reaction stock solution was subjected to nitrogen bubbling for 30 minutes, followed by adding thereto 1.9 g of 2, 2-azobisisobutylonitrile (referred to as AIBN in abbreviated form) as a polymerization initiator.

The temperature in the reaction vessel was increased to 70° C. while nitrogen bubbling was continued. The polymerization reaction was continuously carried out at the same temperature for 7 hours. The resulting reaction solution was mixed with a large amount of hexane to solidify the polymer, and thereafter this polymer was collected and redissolved in dioxane. This process of solidification by hexane and redissolution in dioxane was repeated 5 times to remove unreacted monomers. Then, dioxane was evaporated under reduced pressure at 70° C. to obtain a white epoxy group-containing polymer. The weight average molecular weight of this polymer was measured using GPC (gel permeation chromatography) to find that it was 110,000.

Example of Synthesis B2

Preparation of Organic Particle Emulsion: Polyimide Based Resin Emulsion 32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2, 5-dioxo-3-furanyl)-naphtho [1, 2-c]-furane-1,3-dion, 36.95 g (90 milimol) of 2,2-bis[4-(4-aminophenoxy) phenyl] propane as a diamine compound and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate and 1 part of azobisisobutylonitrile were continuously added to this reaction vessel for 5 hours while the mixture was made to undergo solution polymerization under stirring. After the mixture was completely added, the mixture was further stirred continuously at 85° C. for 2 hours and the solution polymerization was completed to obtain an acryl polymer solution with solid content of 50%.

50 parts (solid content) of polyimide solution, 30 parts (solid content) of acryl polymer solution and 20 parts of Epicoat 828 (trade name of a product manufactured by Yuka Shell Epoxy Co., Ltd.) were mixed together and reacted at 70° C. for 3 hours, and thereafter 3 parts of acetic acid were gradually added thereto and mixed to adjust pH. Then, 1000 parts of distilled water were gradually added thereto and vigorously stirred to obtain a cationic emulsion of organic particles having polyimide based resin as a principal constituent.

Example of Synthesis B3

Preparation of Organic Particle Emulsion: Epoxy Based Resin Emulsion 46.3 parts of block isocyanate constituted of tolylene diisocyanate and 2-ethylhexanol, and 89.3 parts of epoxyamine adduct obtained by reacting Epicoat 828 (trade name of a product manufactured by Yuka Shell Epoxy Co., Ltd.) with diethylamine were mixed together, and 3.8 parts of acetic acid was added thereto as a pH regulator. This was put into 1200 parts of ion-exchanged water under stirring, whereby a cationic emulsion of organic particles having an epoxy based resin precursor as a principal constituent was obtained.

Example B6

Preparation of Dielectric Paste 8 parts by weight of Epicoat 1004 being an epoxy resin (average molecular weight: 1600, manufactured by Yuka Shell Epoxy Co., Ltd.) as a thermoset resin, and 3 parts by weight of epoxy group-containing polymer obtained in Example of Synthesis B1 were dissolved in 60 parts by weight of butyl acetate Cellosolve to prepare a uniform resin solution. To this resin solution were added 100 parts by weight of composite particles for dielectrics (1) obtained in Example B1 and 8 parts of acetylene black. Then, a triple roll was used to knead these dielectric paste composition materials for on hour to prepare a dielectric paste. The viscosity of this dielectric paste was 50000 m·Pa.

Example B7

Preparation of Aqueous Dispersions for Electrodeposition 15 parts by weight of composite particles for dielectrics (1) obtained in Example B1 and 0.2 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent, obtained in Example of Synthesis B2, were mixed with 100 parts by weight of the above described dispersions to prepare aqueous dispersions for electrodeposition.

Example B8

Preparation of Aqueous Dispersions for Electrodeposition 15 parts by weight of composite particles for dielectrics (2) obtained in Example B2 and 0.1 parts by weight of acetylene black were mixed with 85 parts by weight of isopropyl alcohol by a homomixer, were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent that had been obtained in Example of Synthesis B2 were mixed with 100 parts by weight of the above described dispersions to prepare aqueous dispersions for electrodeposition.

Example B9

Preparation of Aqueous Dispersions for Electrodeposition 15 parts by weight of composite particles for dielectrics (3) obtained in Example B3 and 0.1 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 20 parts of cationic emulsion of organic particles having an epoxy based resin as a principal constituent that had been obtained in Example of Synthesis B3 were mixed with 100 parts by weight of the above described dispersions to prepare aqueous dispersions for electrodeposition.

Example B10

Preparation of Aqueous Dispersions for Electrodeposition 15 parts by weight of composite particles for dielectrics (4) obtained in Example B4 and 0.1 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent that had been obtained in Example of Synthesis B2 were mixed with 100 parts by weight of the above described dispersions to prepare aqueous dispersions for electrodeposition.

Example B11

Preparation of Aqueous Dispersions for Electrodeposition 15 parts by weight of composite particles for dielectrics (5) obtained in Example B5 and 0.2 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 40 parts of cationic emulsion of organic particles having an polyimide based resin as a principal constituent that had been obtained in Example of Synthesis B2 were mixed with 100 parts by weight of the above described dispersions to prepare aqueous dispersions for electrodeposition.

Comparative Example B1

A paste composition was obtained in just a same way as Example B6 except that barium titanate particles (manufactured by Fuji Titanium Co., Ltd., trade name: "HPBT-1", average particle size: 0.6 µm, permittivity : 2000) were used instead of the composite particles for dielectrics (1) obtained in Example 1.

Comparative Example B2

Aqueous dispersions were prepared in just a same way as Example B7 except that barium titanate particles (manufactured by Fuji Titanium Co., Ltd., trade name: "HPBT-1", average particle size: 0.6 µm, permittivity: 2000) were used instead of the composite particles for dielectrics (1) obtained in Example B1.

Formation of Film and Evaluation of Performance Thereof

<<1>> Coating by Screen Printing Method

The dielectric paste of the above described Example B5 and Comparative Example B1 was printed on a copper foil by a screen printer. It was prebaked at 100° C. for 10 minutes, and was thereafter heat-cured in an oven at 150° C. for 30 minutes. When its thickness was measured by an electro magnetic thickness tester, it was shown as to obtain a uniform coating of dielectric film with thickness of 20 µm.

<<2>> Coating by Electrodeposition Method

Copper plates as cathodes and SUS plates as counter-electrodes were placed in the aqueous dispersions for electrodeposition of the above described Examples B6 to B9 and Comparative Example B2, respectively, and particles were electro-deposited on the copper plate on the cathode side by the constant-voltage method of 100 V. Thereafter, the dispersions were heated at 100° C. for 10 minutes, and were further heated at 250° C. for 30 minutes for Examples B6 and B7 and Comparative Example B2 and at 150° C. for 30 minutes for Example B8 to obtain dielectric films with thickness of 10 µm.

The performance of films produced through Examples B6 to B11 and Comparative Examples B1 and B2 was evaluated in accordance with the following methods.

The results are shown in Table B1.

[Permittivity, Dielectric Loss Tangent, Volume Resistivity and Leakage Current]

The permittivity, dielectric loss tangent and volume resistivity were measured in accordance with JIS K6911. Also, the leakage current was measured by an insulation resistance meter (manufactured by Hewlett-Packard Co., Ltd.).

The permittivity and dielectric loss tangent represent values measured at the frequency of 1 MHz.

[Resistance to Moist Heat (HAST Test)]

For cured films, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

◯ . . . no significant difference and satisfactory level of resistance.

× . . . significant difference and unsatisfactory level of resistance.

TABLE B1

| | | Example B6 | Example B7 | Example B8 | Example B9 | Example B10 | Example B11 | Comparative example B1 | Comparative example B2 |
|---|---|---|---|---|---|---|---|---|---|
| Composite particles for dielectrics | Material of inorganic particles (parts) | Barium titanate (95) | Barium titanate (95) | Barium titanate (99) | Barium titanate (90) | Calcium titanate (98) | Barium titanate (95) | Barium titanate (100) | Barium titanate (100) |
| | Particle size of inorganic particles (µm) | 0.6 | 0.6 | 0.6 | 0.6 | 2.0 | 0.2 | 0.6 | 0.6 |
| | Conductive material (parts) | Nickel (5) | Nickel (5) | Silver (1) | Copper (10) | Nickel (2) | Nickel (5) | — | — |
| | Number of parts (solid content) | 100 | 15 | 15 | 15 | 15 | 15 | 100 | 15 |
| Resion component | Material of resin | Epoxy | Polyimide | Polyimide | Epoxy | Polyimide | Polyimide | Epoxy | Polyimide |
| | Number of parts (solid content) | 11 | 2 | 2 | 2 | 2 | 2 | 11 | 2 |
| Volume ratio | Composite particles for dielectrics/resin component | 60/40 | 55/45 | 55/45 | 55/45 | 55/45 | 55/45 | 60/40 | 56/44 |
| Process Conditions | Coating method | Printing | Electro-deposition | Electro-deposition | Electro-deposition | Electro-deposition | Electro-deposition | Printing | Electro-deposition |
| | Baking temperature (° C.) | 150 | 250 | 250 | 150 | 250 | 250 | 150 | 250 |
| Film | Thickness (µm) | 20 | 20 | 20 | 20 | 20 | 20 | 20 | 20 |
| | Permittivity | 100 | 120 | 250 | 150 | 60 | 150 | 120 | 120 |
| | Dielectric loss tangent | 0.04 | 0.05 | 0.04 | 0.04 | 0.02 | 0.01 | 0.5 | 0.6 |
| | Resistance to moist heat | ◯ | ◯ | ◯ | ◯ | ◯ | ◯ | ◯ | ◯ |
| | Volume resistivity (Ωcm) | $10^{13}$ | $10^{15}$ | $10^{14}$ | $10^{13}$ | $10^{14}$ | $10^{14}$ | $10^{13}$ | $10^{14}$ |
| | Leakage current (A/cm$^2$) | $10^{-11}$ | $10^{-12}$ | $10^{-11}$ | $10^{-11}$ | $10^{-12}$ | $10^{-12}$ | $10^{-11}$ | $10^{-11}$ |

As apparent from Table B1, the films obtained from Examples B6 to B11 showed satisfactory electrical characteristics. For Examples B7, B8, B10 and B11 in which polyimide was used as organic particles, films having particularly high volume resistivity and small leakage current were obtained.

On the other hand, Comparative Examples B1 and B2 being outside the scope of the present invention were inferior in dielectric loss tangent.

Example C

Corresponding to Invention 2

Example of Synthesis C1

<Preparation of Polymer: Synthesis of Thermoset Resin (Epoxy Group-Containing Polymer)>

In a reaction container, 25 g of glycidyl methacrylate, 10 g of acrylonitrile, 15 g of methylmethacrylate, and 50 g of dioxane were mixed together to prepare a uniform reaction stock solution.

This reaction stock solution was subjected to nitrogen bubbling for 30 minutes, followed by adding thereto 1.9 g of 2,2-azobisisobutylonitrile as a polymerization initiator.

The temperature in the reaction container was increased to 70° C. while nitrogen bubbling was continued. The polymerization reaction was continuously carried out at the same temperature for 7 hours. The resulting reaction solution was mixed with a large amount of hexane to solidify the polymer, and thereafter this polymer was collected and redissolved in dioxane. This process of solidification by hexane and redissolution in dioxane was repeated 5 times to remove unreacted monomers. Then, dioxane was evaporated under reduced pressure at 70° C. to obtain a white epoxy group-containing polymer. The weight average molecular weight of this polymer was measured using GPC (gel permeation chromatography) to find that it was 110,000.

Example of Synthesis C2

<Preparation of Organic Particle Emulsion: Polyimide Based Resin Emulsion>

32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2,5-dioxo-3-furanyl)-naphtho [1, 2-c]-furane-1,3-dion, 36.95 g (90 milimol) of 2,2-bis[4-(4-aminophenoxy) phenyl]propane as a diamine compound and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate and 1 part of 2,2-azobisisobutylonitrile were continuously added to this reaction vessel for 5 hours while the mixture was made to undergo solution polymerization under stirring. After the mixture was completely added, the mixture was further stirred continuously at 85° C. for 2 hours and the solution polymerization was completed to obtain an acryl polymer solution with solid content of 50%.

50 parts (solid content) of polyimide solution, 30 parts (solid content) of acryl polymer solution and 20 parts of Epicoat 828 (trade name of a product manufactured by Yuka Shell Epoxy Co., Ltd.) were mixed together and reacted at 70° C. for 3 hours, and thereafter 3 parts of acetic acid were gradually added thereto and mixed to adjust pH. Then, 1000 parts of distilled water were gradually added thereto and vigorously stirred to obtain a cationic emulsion (solid content: 6.5%) of organic particles having polyimide based resin as a principal constituent.

Example of Synthesis C3

<Preparation of Organic Particle Emulsion: Epoxy Based Resin Emulsion>

46.3 parts of block isocyanate constituted of tolylene diisocyanate and 2-ethylhexanol, and 89.3 parts of epoxyamine adduct obtained by reacting Epicoat 828 (trade name of a product manufactured by Yuka Shell Epoxy Co., Ltd.) with diethylamine were mixed together, and 3.8 parts of acetic acid was added thereto as a pH regulator. This was put into 1200 parts of ion-exchanged water under stirring, whereby a cationic emulsion (solid content: 10%) of organic particles having an epoxy based resin precursor as a principal constituent was obtained.

Example of Synthesis C4

<Preparation of Inorganic Particle Dispersions 1>

100 parts of barium titanate particles (trade name: "HPBT-1" manufactured by Fuji Titanium Co., Ltd., average particle size: 0.6 μm, permittivity: 2000) were mixed with 300 parts of methyl propylene glycol by a homomixer and were further treated by a supersonic homogenizer to obtain inorganic particle dispersions 1 having no agglomerates (solid content: 25%).

Example of Synthesis C5

<Preparation of Dispersions of Composite Particles for Dielectrics 1]

The surfaces of barium titanate particles (trade name: "HPBT-1" manufactured by Fuji Titanium Co., Ltd., average particle size: 0.6 μm, permittivity: 2000) were coated with silver by the nonelectrolytic silver plating method. It was shown from SEM observation of the resulting dielectric composite particles (1) that fine particles of silver were partially deposited on the surfaces of the particles in an island form, and it was shown from the result of fluorescent X-ray measurements that the amount of deposited silver was 20% by weight with respect to the amount of barium titanate. Also, the specific surface area of the dielectric composite particles (1) was 3.0 $m^2/g$.

Then, 100 parts of resulting dielectric composite particles (1) were mixed with 300 parts of methyl propylene glycol by a homomixer, and were further treated by a bead mill to obtain dispersions of composite particles for dielectrics 1 having no agglomerates (solid content: 25%).

Example of Synthesis C6

<Preparation of Dispersions of Composite Particles for Dielectrics 2]

The surfaces of barium titanate particles (trade name: "BT-02" manufactured by Sakai Chemical Industry Co., Ltd., average particle size: 0.2 µm, permittivity: 2000) were coated with copper by the nonelectrolytic copper plating method. It was shown from SEM observation of the resulting dielectric composite particles (2) that fine particles of copper were partially deposited on the surfaces of the particles in an island form, and it was shown from the result of fluorescent X-ray measurements that the amount of deposited copper was 10% by weight with respect to the amount of barium titanate. Also, the specific surface area of the dielectric composite particles (2) was 7.0 m$^2$/g.

Then, 100 parts of resulting dielectric composite particles (2) were mixed with 300 parts of methyl propylene glycol by a homomixer, and were further treated by a bead mill to obtain dispersions of composite particles for dielectrics 2 having no agglomerates (solid content: 25%).

Example of Synthesis C7

<Preparation of Inorganic Particle Dispersions 2>

100 parts of aluminum oxide particles (manufactured by Bikovskii Co., Ltd., average particle size: 0.1 µm, permittivity 10) were mixed with 300 parts of isopropyl alcohol, and were further treated by an ultrasonic homogenizer to obtain organic particle dispersions 2 having no agglomerates (solid content: 25%).

Example of Synthesis C8

<Preparation of Conductive Adhesive]

2 parts of epoxy group-containing polymer of Example of Synthesis C1 and 10 parts of Epicoat 1004 (average molecular weight: 1600, manufactured by Yuka Shell Co., Ltd.) were dissolved in 100 parts by weight of butyl acetate Cellosolve to prepare a uniform resin solution. 10 parts of acetylene black and 90 parts of 50 µm scaly silver powders were added thereto and kneaded by a triple roll for one hour to obtain a conductive adhesive.

Example C1

[Preparation of Dielectric Paste]

8 parts by weight of Epicoat 1004 being an epoxy resin (average molecular weight: 1600, manufactured by Yuka Shell Epoxy Co., Ltd.) as a thermoset resin, and 3 parts by weight of epoxy group-containing polymer obtained in Example of Synthesis C1 were dissolved in 60 parts by weight of butyl acetate Cellosolve to prepare a uniform resin solution. To this resin solution were added 100 parts by weight of composite particles for dielectrics (1) obtained in Example of Synthesis C5 and 1 part of acetylene black. Then, a triple roll was used to knead these dielectric paste composition materials for one hour to prepare a dielectric paste (1). The viscosity of this dielectric paste was 50000 mPa·s.

[Application to Conductive Foil]

A 13 µm copper foil (rough surface) was coated with the dielectric paste (1) by a die coater and dried at 100° C. for 15 minutes. This dielectric layer was coated with the conductive adhesive of Example of Synthesis 8 by the die coater and dried at 100° C. for 15 minutes. Thereby, a dielectric layer with a copper foil having an adhesive layer (1) was obtained. It was shown from SEM observation of the cross section that the thickness of the dielectric layer was 10 µm and the thickness of the adhesive layer was 2 µm.

[Lamination to CCL Board]

The dielectric layer with a copper foil (1) was laminated to a CCL board of FR-5 at press pressure of 100 MPa·m under reduced pressure at 170° C. for 30 minutes.

[Formation of Condenser]

A pattern of 1 mm square was formed using DFR for the upper portion of the copper foil, and a pattern serving as the upper electrode of the condenser was formed using a cupric chloride etchant. The capacity of the formed condenser (1 MHz) was measured by a LCR meter (manufactured by Hewlett-Packard Co., Ltd.). Also, the leakage current was measured by an insulation resistance meter (manufactured by Hewlett-Packard Co., Ltd.). The results are shown in Table C1.

Example C2

[Preparation of Aqueous Dispersions for Electrodeposition]

40 parts of cationic emulsion of organic particles having an polyimide based resin as a principal constituent that had been obtained in Example of Synthesis C2 were mixed with 40 parts by weight of dispersions 1 of composite particles for dielectrics (solid content: 25%) obtained in Example of Synthesis C5 to prepare aqueous dispersions for electrodeposition (1).

[Application to Conductive Foil]

A 13 µm copper foil was bonded on a resin substrate, and was made to undergo electrodeposition in the aqueous dispersions for electrodeposition (1) using this foil as a cathode at a constant current of 10 mA, and was dried at 120° C. for 10 minutes. Then, this was dipped in the epoxy based resin emulsion solution of Example of Synthesis C3 using this emulsion solution as a conductive adhesive, and was dried at 100° C. for 10 minutes. Thereby, a dielectric layer with a copper foil (2) was obtained. It was shown from SEM observation of the cross section that the thickness of the dielectric layer was 10 µm and the thickness of the adhesive layer was 0.8 µm.

[Lamination to CCL Board]

The dielectric layer with a copper foil (2) was laminated to a CCL board of FR-5 at press pressure of 100 MPa·m under reduced pressure at 230° C. for 30 minutes.

Thereafter, a condenser was formed and the capacity and leakage current of the condenser were measured in a same way as Example C1. The results are shown in Table C1.

Example C3

Evaluation was conducted in just a same way as Example C2 except that the inorganic particle dispersions 1 of Example of Synthesis C4 were used instead of the dispersions of composite particles for dielectrics 1 of Example of Synthesis C5. The results are shown in Table C1.

Example C4

Evaluation was conducted in just a same way as Example C2 except that the dispersions of composite particles for dielectrics 2 of Example of Synthesis C6 were used instead of the dispersions of composite particles for dielectrics 1 of Example of Synthesis C5. The results are shown in Table C1.

Example C5

Evaluation was conducted in just a same way as Example C2 except that 20 parts by weight of cationic emulsion of organic particles having an epoxy based resin precursor as a principal constituent that had been obtained in Example of Synthesis C3 were used instead of 40 parts by weight of cationic emulsion of organic particles having a polyimide based resin as a principal constituent that had been obtained in Example of Synthesis C2, and the lamination temperature was changed from 230° C. to 170° C. The results are shown in Table C1.

Comparative Example C1

Evaluation was conducted in just a same way as Example C2 except that the inorganic particle dispersions 2 of Example of Synthesis C7 were used instead of the dispersions of composite particles for dielectrics 1 of Example of Synthesis C5. The results are shown in Table C1.

Example D

Corresponding to Invention 3-1

Example D1

(1) Production of Composite Particles for Dielectrics

The surfaces of barium titanate particles (trade name: "HPBT-1", manufactured by Fuji Titanium Co., Ltd., average particle size: 0.6 μm, permittivity: 2000) were coated with silver by the nonelectrolytic silver plating method to obtain composite particles for dielectrics (a).

It was shown from SEM (scanning electron microscope) observation of the resulting powders that fine particles of silver were partially deposited on the surfaces of particles. Also, it was shown by SIMS (secondary ion mass spectrometry) that barium titanate had 10% of silver deposited on the surface based on the weight ratio. On the other hand, the specific area of powders was 3.8 $m^2/g$.

(2) Preparation of Photosensitive Dielectric-Forming Composition 100 parts of the above described composite particles for dielectrics (a) as composite particles for dielectrics, 10 parts

TABLE C1

| | | Example C1 | Example C2 | Example C3 | Example C4 | Example C5 | Comparative example C1 |
|---|---|---|---|---|---|---|---|
| Inorganic particles (A-1) or composite Particles for dielectrics | Material of inorganic particles | Barium titanate | Barium titanate | Barium titanate | Barium titanate | Barium titanate | Alumina |
| | Particle size of inorganic particles (μm) | 0.6 | 0.6 | 0.6 | 0.2 | 0.6 | 0.1 |
| | Conductive coating material | Silver | Silver | — | Copper | Silver | — |
| | Inorganic particles: conductive coating material (parts by weight) | 90:10 | 80:20 | 100:0 | 90:10 | 80:20 | 100:0 |
| | Number of parts in dielectric-forming composition (solid content A) | 100 | 10 | 10 | 10 | 10 | 10 |
| Principal constituent of resin (B) | Material of resin | Epoxy based resin | Polyimide based resin | Polyimide based resin | Polyimide based resin | Epoxy based resin | Polyimide based resin |
| | Number of parts in dielectric-forming composition (solid content B) | 11 | 2.6 | 2.6 | 2.6 | 2 | 2.6 |
| Content of resin component (B) | B/A+B (% by Weight) | 10 | 21 | 21 | 21 | 17 | 21 |
| Process conditions | Method of forming dielectric layer | Coating (Printing) | Electro-deposition | Electro-deposition | Electro-deposition | Electro-deposition | Electro-deposition |
| | Lamination temperature | 170 | 230 | 230 | 230 | 170 | 230 |
| Condenser properties | Thickness of dielectric layer (μm) | 10 | 10 | 10 | 10 | 10 | 10 |
| | Electrostatic capacity (pF) | 81 | 90 | 36 | 99 | 90 | 7 |
| | Permittivity | 90 | 100 | 40 | 110 | 100 | 8 |
| | Leakage current ($A/cm^2$) | $10^{-12}$ | $10^{-13}$ | $10^{-15}$ | $10^{-14}$ | $10^{-12}$ | $10^{-15}$ |

As apparent from Table C1, the condensers obtained from the dielectric layer with a conductive foil of Examples C1 to C5 had large electrostatic capacity and small leakage current.

On the other hand, for Comparative Example C1 being outside the scope of the present invention, electrostatic capacity was small.

of n-butyl methacrylate/3-hydroxypropyl methacrylate/methacrylic acid=60/20/20 (% by mass) copolymer (Mw=50,000) as an alkali soluble resin, 5 parts of trimethylolpropane triacrylate as an ethylene based unsaturated group-containing compound, 1 part of 2-benzyl-2-dimethylamino-1-(4-morpholinophenyl)-butane-1-on as a photopolymerization initiator, 100 parts of propylene glycol monomethylether as a solvent, and 1 part of oleic acid as a dispersant, and 0.5 parts of acetylene black as a bulking agent were kneaded by a beadmill, and were thereafter filtered by a stainless mesh (500 meshes), whereby a photosensitive dielectric-forming composition was prepared.

(3) Step of Applying Photosensitive Dielectric-Forming Composition

A printed-wiring board was coated with the photosensitive dielectric-forming composition using a blade coater, and the coating was dried at 100° C. for 5 minutes to remove the solvent completely, whereby a photosensitive dielectric layer with thickness of 20 μm was formed.

(4) Steps of Exposure and Development of Dielectric Layer

The photosensitive dielectric layer was irradiated with an i-ray (ultraviolet light with wavelength of 365 nm) by an ultra-high pressure mercury lamp through a mask for exposure (dot pattern of 500-μm square). Here, the amount of irradiation was 400 mJ/cm$^2$.

After the step of exposure was completed, the photosensitive dielectric layer exposed to light was subjected to development processing for 1 minute by the shower method using 0.5% by mass of sodium carbonate solution (30° C.) as a developer. The photosensitive dielectric layer was then washed with ultrapure water, whereby the uncured photosensitive dielectric layer not exposed to ultraviolet light was removed to form a pattern.

(5) Step of Curing Dielectric Layer Pattern

The printed-wiring board with a photosensitive dielectric layer pattern formed thereon was cured in an oven at 200° C. for 30 minutes. Thereby, a dielectric pattern was provided on the surface of the printed-wiring board.

The patterning properties and dielectric properties of the obtained dielectric pattern were evaluated by methods described later. The results are shown in Table D1.

Example D2

A photosensitive dielectric-forming composition was prepared in a same way as Example D1 except that 20 parts of n-butyl methacrylate/3-hydroxypropyl methacrylate/methacrylic acid=60/20/20 (% by mass) copolymer (Mw=100,000) as an alkali soluble resin and 10 parts of trimethylolpropane triacrylate as an ethylene based unsaturated group-containing compound were used. A photosensitive dielectric layer with thickness of 20 μm was formed in a same way as Example D1 except that such a photosensitive dielectric-forming composition was used, followed by carrying out steps of exposure/development/curing to prepare a dielectric pattern and evaluating the dielectric pattern. The results are shown in Table D1.

Example D3

The surfaces of barium titanate particles (trade name: "BT-02", manufactured by Sakai Chemical Industry Co., Ltd., average particle size: 0.2 μm, permittivity: 2000) were coated with silver by the nonelectrolytic silver plating method to obtain composite particles for dielectrics (b).

It was shown from SEM observation of the resulting powders that fine particles of silver were partially deposited on the surfaces of particles. Also, it was shown by SIMS that barium titanate had 20% of silver deposited on the surface based on the weight ratio. On the other hand, the specific area of powders was 4.0 m$^2$/g.

A photosensitive dielectric-forming composition was prepared in a same way as Example D1 except that 100 parts of the above described composite particles for dielectrics (b) were used as (A) composite particles for dielectrics. A photosensitive dielectric layer with thickness of 20 μm was formed in a same way as Example D1 except that such a photosensitive dielectric-forming composition was used, followed by carrying out steps of exposure/development/curing to prepare a dielectric pattern and evaluating the dielectric pattern. The results are shown in Table D1.

Example D4

The surfaces of calcium titanate particles (average particle size: 2 μm, permittivity: 140) were coated with nickel by the nonelectrolytic phosphorous-nickel plating method to obtain composite particles for dielectrics (c).

It was shown from SEM observation of the resulting powders that fine particles of nickel were partially deposited on the surfaces of particles. Also, it was shown by SIMS that calcium titanate had 10% of nickel deposited on the surface based on the weight ratio. On the other hand, the specific area of powders was 2.0 m$^2$/g.

A photosensitive dielectric-forming composition was prepared in a same way as Example D1 except that 100 parts of the above described composite particles for dielectrics (c) were used as composite particles for dielectrics. A photosensitive dielectric layer with thickness of 20 μm was formed in a same way as Example D1 except that such a photosensitive dielectric-forming composition was used, followed by carrying out steps of exposure/development/curing to prepare a dielectric pattern and evaluating the dielectric pattern. The results are shown in Table D1.

Reference Example D1

A photosensitive dielectric-forming composition was prepared in a same way as Example D1 except that 1 part of trimethylol propane triacrylate was used as an ethylene based unsaturated group-containing compound. A photosensitive dielectric layer with thickness of 20 μm was formed in a same way as Example D1 except that such a photosensitive dielectric-forming composition was used, followed by carrying out steps of exposure/development/curing to prepare a dielectric pattern and evaluating the dielectric pattern. The results are shown in Table D1.

Reference Example D2

A photosensitive dielectric-forming composition was prepared in a same way as Example D1 except that 50 parts of trimethylolpropane triacrylate were used as an ethylene based unsaturated group-containing compound. A photosensitive dielectric layer with thickness of 20 μm was formed in a same way as Example D1 except that such a photosensitive dielectric-forming composition was used, followed by carrying out steps of exposure/development/curing to prepare a dielectric pattern and evaluating the dielectric pattern. The results are shown in Table D1.

[Patterning Properties]

For the dielectric patterns obtained from Examples D1 to D4 and Reference Examples D1 to D2, a scanning electron microscope (SEM) was used to measure the widths and heights of such dielectric patterns, and patterns with the wide within 500 μm±10 μm were rated as ○, and other patterns were rated as ×. Also, observations were made for loss of pattern, and patterns with no loss were rated as ◯, and patterns with loss were rated as ×.

[Permittivity, Dielectric Loss Tangent, Volume Resistivity and Leakage Current]

The permittivity, dielectric loss tangent and volume resistivity were measured in accordance with JIS K6911. Also, the leakage current was measured by an insulation resistance meter (manufactured by Hewlett-Packard Co., Ltd.).

The permittivity and dielectric loss tangent represent values measured at the frequency of 1 MHz.

[Resistance to Moist Heat (HAST Test)]

For cured films, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

◯ . . . no significant difference and satisfactory level of resistance.

× . . . significant difference and unsatisfactory level of resistance.

Example E

Corresponding to Invention 3-2

Example of Synthesis E1

A flask was purged and filled with nitrogen, followed by placing therein 459.0 g of diethylene glycol dimethyl ether solution with 9.0 g of 2,2'-azobisisobutylonitrile dissolved therein. Subsequently, 22.5 g of styrene, 45.0 g of methacrylic acid, 67.5 g of dicyclopentanyl methacrylate and 90.0 g of glycidyl methacrylate were placed therein, followed by starting stirring slowly. The solution was heated to 80° C., and was kept at this temperature for 5 hours, followed by heating at 90° C. for 1 hour to complete polymerization.

Thereafter, the reaction produced solution was dropped in a large amount of water to solidify the reaction product. This solidified product was washed with water, and was thereafter redissolved in 200 g of tetrahydrofuran, and was solidified again with a large amount of water. This redissolution-solidification process was conducted totally three times,

TABLE D1

| | | Example D1 | Example D2 | Example D3 | Example D4 | Reference example D1 | Reference example D2 |
|---|---|---|---|---|---|---|---|
| Photosensitive dielectric-forming composition | Composite particles for dielectrics | Composite particles for dielectrics (a) | Composite particles for dielectrics (a) | Composite particles for dielectrics (b) | Composite particles for dielectrics (c) | Composite particles for dielectrics (a) | Composite particles for dielectrics (a) |
| | (Parts) | 100 | 100 | 100 | 100 | 100 | 100 |
| | Material of inorganic particles (parts) | Barium titanate (90) | Barium titanate (90) | Barium titanate (80) | Calcium titanate (90) | Barium titanate (90) | Barium titanate (90) |
| | Particle size of inorganic particles (μm) | 0.6 | 0.6 | 0.2 | 2 | 0.6 | 0.6 |
| | Conductive material (parts) | Silver (10) | Silver (10) | Silver (20) | Nickel (10) | Silver (10) | Silver (10) |
| | Alkali soluble resin | | | | | | |
| | Mw | 50,000 | 100,000 | 50,000 | 50,000 | 50,000 | 50,000 |
| | (Parts) | 10 | 20 | 10 | 10 | 10 | 10 |
| | Ethylene based unsaturated group-containing compound (parts) | 5 | 10 | 5 | 5 | 1 | 50 |
| | Photopolymerization initiator (parts) | 1 | 1 | 1 | 1 | 1 | 1 |
| | Solvent (parts) | 100 | 100 | 100 | 100 | 100 | 100 |
| | Dispersant (parts) | 1 | 1 | 1 | 1 | 1 | 1 |
| | Bulking agent (parts) | 0.5 | 0.5 | 0.5 | 0.5 | 0.5 | 0.5 |
| Patterning properties of dielectrics | Pattern accuracy | ◯ | ◯ | ◯ | ◯ | × | × |
| | Pattern loss | ◯ | ◯ | ◯ | ◯ | × | ◯ |
| | Thickness (μm) | 20 | 20 | 20 | 20 | 20 | 20 |
| | Permittivity | 120 | 90 | 150 | 50 | 120 | 120 |
| | Dielectric loss tangent | 0.08 | 0.05 | 0.08 | 0.03 | 0.08 | 0.08 |
| | Resistance to moist heat | ◯ | ◯ | ◯ | ◯ | ◯ | ◯ |
| | Leakage current (A/cm$^2$) | $10^{-11}$ | $10^{-12}$ | $10^{-11}$ | $10^{-11}$ | $10^{-11}$ | $10^{-11}$ |

(Note)
Alkali soluble resin: n-butyl methacrylate/3-hydroxypropyl methacrylate/methacrylic acid = 60/20/20 (% by weight)
Ethylene based unsaturated group-containing compound: trimethylol propane triacrylate
Photopolymerization initiator: 2-benzyl-2-dimelamino-1-(4-morpholinophenyl)-butane-1-on
Solvent: propylene glycol monomethyl ether
Dispersant: oleic acid, bulking Agent: acetylene black followed by drying under reduced pressure the resulting solidified material at 60° C. for 48 hours to obtain a desired copolymer [1].

Example of Synthesis E2

A flask was purged and filled with nitrogen, followed by placing therein 459.0 g of 3-methoxy methyl propionate solution with 9.0 g of 2,2'-azobisisobutylonitrile dissolved therein. Subsequently, 56.25 g of methacrylic acid, 90.0 g of methyl methacrylate and 78.75 g of methacrylic acid-3,4-epoxybutyl were placed therein, followed by starting stirring slowly. Polymerization was started at 80° C., and the solution was kept at this temperature for 5 hours, followed by heating at 90° C. for 1 hour to complete the polymerization. Thereafter, a copolymer [2] was obtained in a same way as Example of Synthesis E1.

Example of Synthesis E3

32.29 g (90 milimol) of 3,3',4,4'-diphenylsulfone tetra-carboxylic dianhydride as tetracarboxylic dianhydride, 3.00 g (10 milimol) of 1,3,3a,4,5,9A-hexahydro-5 (tetrahydro-2,5-dioxo-3-furanyl)-naphtho [1, 2-c]-furane-1,3-dion, 28.74 g (70 milimol) of 2,2-bis[4-(4-aminophenoxy) phenyl]pro-pane as a diamine compound, 2.49 g (10 milimol) of organosiloxane LP7100 (trade name, manufactured by The Shin-Etsu Chemical Co., Ltd.) and 3.04 g (20 milimol) of 3,5-diamino benzoic acid were dissolved in 450 g of N-methyl-2-pyrolidone (NMP), and were reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide NMP solution with solid content of 15%.

Example E1

(1) Production of Composite Particles for Dielectrics

The surfaces of barium titanate particles (trade name: "HPBT-1", manufactured by Fuji Titanium Co., Ltd., average particle size: 0.6 μm, permittivity: 2000) were coated with silver by the nonelectrolytic silver plating method to obtain composite particles for dielectrics (a).

It was shown from SEM (scanning electron microscope) observation of the resulting powders that fine particles of silver were partially deposited on the surfaces of particles. Also, it was shown by X-ray fluorescence that barium titanate had 20% of silver deposited on the surface based on the weight ratio. On the other hand, the specific area of powders was 3.5 m$^2$/g.

(2) Preparation of Photosensitive Dielectric-Forming Composition 100 parts of the above described composite particles for dielectrics (a) as composite particles for dielectrics, 15 parts of the copolymer [1] obtained in Example of Synthesis E1 as a resin capable of undergoing alkali development, 50 parts of propylene glycol monomethyl ether and 50 parts of ethyl lactate as a solvent, and 1 part of 1,2-naphthoquino-nediazide-5-sulfonate (average esterification ratio: 66.7 mol %) of 4,4'-[1-[4-(1-(4-hydroxyphenyl)-1-methylethyl) phenyl] ethylidene] diphenol were kneaded by a bead mill, and were thereafter filtered by a stainless mesh (500 meshes) and a filter with the pore size of 1 μm, whereby a photosensitive dielectric-forming composition was prepared.

(3) Step of Applying Photosensitive Dielectric-Forming Composition

A printed-wiring board was coated with the photosensitive dielectric-forming composition using a blade coater, and the coating was dried at 100° C. for 5 minutes to remove the solvent completely, whereby a photosensitive dielectric layer with thickness of 10 μm was formed.

(4) Steps of Exposure and Development of Dielectric Layer

The photosensitive dielectric layer was irradiated with an i-ray (ultraviolet light with wavelength of 365 nm) by an ultra-high pressure mercury lamp through a mask for exposure (dot pattern of 500-μm square). The amount of irradiation was 100 mJ/cm$^2$.

After the step of exposure was completed, the photosensitive dielectric layer exposed to light was subjected to development processing for 2 minutes by the shower method using 0.12% by mass of tetramethyl ammonium hydroxide solution (25° C.) as a developer. The photosensitive dielectric layer was then washed with ultrapure water, whereby the photosensitive dielectric layer rendered soluble by exposure to ultraviolet light was removed to form a pattern.

(5) Step of Curing Dielectric Layer Pattern

The printed-wiring board with a photosensitive dielectric layer pattern formed thereon was cured in an oven at 20° C. for 60 minutes. Thereby, a dielectric pattern was provided on the surface of the printed-wiring board.

The patterning properties and dielectric properties of the obtained dielectric pattern were evaluated by methods described later. The results are shown in Table E1.

Example E2

A photosensitive dielectric-forming composition was prepared in just a same way as Example E1 except that 20 parts of the copolymer [2] obtained in Example of Synthesis E2 were used as (B) resin capable of undergoing alkali development, instead of the copolymer [1] of Example of Synthesis E1. A photosensitive dielectric layer with thickness of 10 μm was formed in a same way as Example E1 except that such a photosensitive dielectric-forming composition was used, followed by carrying out steps of exposure/development/curing to prepare a dielectric pattern and evaluating the dielectric pattern. The results are shown in Table E1.

Example E3

The surfaces of barium titanate particles (trade name: "BT-02", manufactured by Sakai Chemical Industry Co., Ltd., average particle size: 0.2 μm, permittivity: 2000) were coated with silver by the nonelectrolytic silver plating method to obtain composite particles for dielectrics (b).

It was shown from SEM observation of the resulting powders that fine particles of silver were partially deposited on the surfaces of particles. Also, it was shown by X-ray fluorescence that barium titanate had 15% of silver deposited on the surface based on the weight ratio. On the other hand, the specific area of powders was 4.0 m$^2$/g.

A photosensitive dielectric-forming composition was prepared in a same way as Example E1 except that 100 parts of the above described composite particles for dielectrics (b) were used as composite particles for dielectrics, 25 parts of ethyl lactate dispersions of titania (manufactured by C.I. Kasei Co., Ltd., average particle size: 20 nm, permittivity: 100) (solid content: 20%) were used as inorganic ultrafine particles, and 50 parts of propylene glycol monomethyl ether and 40 parts of ethyl lactate were used as a solvent were used as a solvent instead of 50 parts of propylene glycol monomethyl ether and 50 parts of ethyl lactate. A photosensitive dielectric layer with thickness of 10 μm was formed in a same way as Example E1 except that such a photosensitive dielectric-forming composition was used, followed by carrying out steps of exposure/development/curing to prepare a dielectric pattern and evaluating the dielectric pattern. The results are shown in Table E1.

Example E4

A photosensitive dielectric-forming composition was prepared in just a same way as Example E2 except that 100 parts of the above described composite particles for dielectrics (a) were not used as composite particles for dielectrics, 20 parts of NMP dispersions of barium titanate (prepared by sol-gel process having an average particle size of 30 nm and permittivity of 2000) (solid content: 20%) were used as inorganic ultrafine particles instead of titania, 100 parts of polyimide NMP solution (solid content: 15%) of Example of Synthesis E3 were used as a resin capable of undergoing alkali development instead of the copolymer [1] of Example of Synthesis E1, and 50 parts of propylene glycol monomethyl ether and 50 parts of ethyl lactate were not added as a solvent. A photosensitive dielectric layer with thickness of 10 μm was formed in a same way as Example E1 except that such a photosensitive dielectric-forming composition was used and the temperature inside the oven was changed from 200° C. to 230° C. in the curing step, followed by carrying out steps of exposure/development/curing to prepare a dielectric pattern and evaluating the dielectric pattern. The results are shown in Table E1.

Example E5

The surfaces of barium titanate particles (trade name: "BT-02", manufactured by Sakai Chemical Industry Co., Ltd., average particle size: 0.2 μm, permittivity: 2000) were coated with titanium nitride by the sputtering method to obtain composite particles for dielectrics (c).

It was shown from SEM observation of the resulting powders that fine particles of titanium nitride were partially deposited on the surfaces of particles. Also, it was shown by SIMS (secondary ion mass spectrometry) that barium titanate had 8% of titanium nitride deposited on the surface based on the weight ratio. On the other hand, the specific area of powders was 3.0 m$^2$/g.

A photosensitive dielectric-forming composition was prepared in a same way as Example E1 except that 100 parts of the above described composite particles for dielectrics (c) were used as composite particles for dielectrics. A photosensitive dielectric layer with thickness of 10 μm was formed in a same way as Example E1 except that such a photosensitive dielectric-forming composition was used, followed by carrying out steps of exposure/development/curing to prepare a dielectric pattern and evaluating the dielectric pattern. The results are shown in Table E1.

Comparative Example E1

A photosensitive dielectric-forming composition was prepared in a same way as Example E1 except that 100 parts of barium titanate particles (trade name: "HPBT-1", manufactured by Fuji Titanium Co., Ltd., average particle size: 0.6 μm, permittivity: 2000) being outside the scope of the present invention were used instead of the composite particles for dielectrics (a). A photosensitive dielectric layer with thickness of 10 μm was formed in a same way as Example E1 except that such a photosensitive dielectric-forming composition was used, followed by carrying out steps of exposure/development/curing to prepare a dielectric pattern and evaluating the dielectric pattern. The results are shown in Table E1.

Example E6

(1) Production of Composite Particles for Dielectrics

Composite particles for dielectrics (a) were obtained in a same way as Example E1.

(2) Preparation of Photosensitive Dielectric-Forming Composition

A photosensitive dielectric-forming composition was prepared in a same way as Example E1 except that 35 parts of copolymer [E1] of Example of Synthesis E1 were used instead of 15 parts thereof as a resin capable of undergoing alkali development, and 75 parts of propylene glycol monomethyl ether and 75 parts of ethyl lactate were used as a solvent instead of 50 parts of propylene glycol monomethyl ether and 50 parts of ethyl lactate.

(3) Preparation of Photosensitive Transfer Film

A substrate film made of a copper foil (width: 300 mm, length: 500 mm, thickness: 13 μm) was coated with the photosensitive dielectric-forming composition obtained as described above using a die coater, and the coating was dried at 100° C. for 5 minutes to remove a solvent to form a photosensitive dielectric-forming layer with thickness of 10 μm on the substrate film, whereby a photosensitive transfer film was prepared.

(4) Step of Transferring Photosensitive Transfer Layer

The photosensitive transfer film was superimposed on the surface of the printed-wiring boars so that the surface of the photosensitive transfer layer was abutted, and this photosensitive transfer film was thermo-compressed by a heat roller. Here, for the conditions of compression, the surface temperature of the heat roller was 120° C., the roll pressure was 4 kg/cm$^2$, and the traveling speed of the heat roller was 0.5 m/minute. Thereby, a board such that a photosensitive dielectric-forming layer with a copper foil was transferred and bonded to the surface of the printed-wiring board was obtained. For this photosensitive dielectric-forming layer, the thickness was measured to find that it was within 10 μm±1 μm.

(5) Steps of Exposure and Development of Dielectric Layer

A DFR for positives was laminated on the board obtained as described above, and was irradiated with an i-ray (ultraviolet light with wavelength of 365 nm) by an ultra-high pressure mercury lamp through a mask for exposure (dot pattern of 500-μm square) and patterned. This was developed by a specified method, and thereafter the opening was subjected to chemical etching using a cupric chloride solution to obtain a photosensitive dielectric-forming layer with a patterned copper foil. In addition, the photosensitive dielectric-forming layer was exposed to light by the ultra-high pressure mercury lamp using this patterned copper foil as a mask for exposure. The amount of irradiation was 400 mJ/cm$^2$.

After the step of exposure was completed, the photosensitive dielectric layer exposed to light was subjected to development processing for 2 minutes by the shower method using 0.12% by mass of tetramethyl ammonium hydroxide solution (30° C.) as a developer. The photosensitive dielectric layer was then washed with ultrapure water, whereby the photosensitive dielectric layer rendered soluble by exposure to ultraviolet light was removed to form a pattern.

(6) Step of Curing Dielectric Layer Pattern

The printed-wiring board having a pattern of photosensitive dielectric layer with a copper foil formed thereon was cured in an oven at 200° C. for 30 minutes. Thereby, a pattern of dielectric pattern with a copper foil was provided on the surface of the printed-wiring board.

The patterning properties and dielectric properties of the obtained dielectric pattern were evaluated by methods described later. The results are shown in Table E2.

Example E7

A photosensitive dielectric-forming composition was prepared in just a same way as Example E3 except that 35 parts of copolymer [E1] of Example of Synthesis E1 were used instead of 15 parts thereof as a resin capable of undergoing alkali development, and 75 parts of propylene glycol monomethyl ether and 55 parts of ethyl lactate were used as a solvent instead of 50 parts of propylene glycol monomethyl ether and 50 parts of ethyl lactate.

A photosensitive dielectric layer with thickness of 10 μm was formed in a same way as Example E6 except that such a photosensitive dielectric-forming composition was used, followed by carrying out steps of exposure/development/curing to prepare a dielectric pattern and evaluating the dielectric pattern. The results are shown in Table E2.

Example E8

A photosensitive dielectric-forming composition was prepared in just a same way as Example E4 except that 200 parts of polyimide NMP solution of Example of Synthesis E3 (solid content: 15%) were used instead of 100 parts thereof as a resin capable of undergoing alkali development.

A photosensitive dielectric layer with thickness of 10 μm was formed in a same way as Example E6 except that such a photosensitive dielectric-forming composition was used and the temperature inside the oven was changed from 200° C. to 230° C. in the curing step, followed by followed by carrying out steps of exposure/development/curing to prepare a dielectric pattern and evaluating the dielectric pattern. The results are shown in Table E2.

Comparative Example E2

A photosensitive dielectric-forming composition was prepared in just a same way as Comparative Example E1 except that 35 parts of copolymer [E1] of Example of Synthesis E1 were used instead of 15 parts thereof as a resin capable of undergoing alkali development, and 75 parts of propylene glycol monomethyl ether and 75 parts of ethyl lactate were used as a solvent instead of 50 parts of propylene glycol monomethyl ether and 50 parts of ethyl lactate, and a photosensitive dielectric layer with thickness of 10 μm was formed in a same way as Example E6 except that such a photosensitive dielectric-forming composition was used, followed by carrying out steps of exposure/development/curing to prepare a dielectric pattern and evaluating the dielectric pattern. The results are shown in Table E2.

Furthermore, the patterning properties and dielectric properties of the dielectric pattern were evaluated in the following way.

[Patterning Properties]

Examples E1 to E8 and Comparative Examples E1 to E2: For the obtained dielectric patterns, a scanning electron microscope (SEM) was used to measure the widths and heights of such dielectric patterns, and patterns with the wide within 500 μm±10 μm were rated as ○, and other patterns were rated as ×. Also, observations were made for loss of pattern, and patterns with no loss were rated as ○, and patterns with loss were rated as ×.

[Permittivity, Dielectric Loss Tangent and Volume Resistivity]

Examples E1 to E5 and Comparative Example E1: An upper electrode (thickness; 0.5 μm) was formed on the upper face of the obtained dielectric pattern by the aluminum deposition method.

Examples E6 to E8 and Comparative Example E2: the copper foil on the upper face of the obtained pattern of dielectric with a copper foil was used as an upper electrode.

The permittivity and dielectric loss tangent at 1 MHz were measured ten times between the printed-wiring board and the upper electrode by a LCR meter (HP4284A, manufactured by Hewlett-Packard Co., Ltd.), and average values thereof were determined. Also, the leakage current between the copper foil and the electrode was measured ten points by an insulation resistance meter (manufactured by Advantest Co., Ltd.), and the average value thereof was determined.

[Resistance to Moist Heat (HAST Test)]

For cured films, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

○ . . . no significant difference and satisfactory level of resistance.

× . . . significant difference and unsatisfactory level of resistance.

TABLE E1

|  |  | Example E1 | Example E2 | Example E3 | Example E4 | Example E5 | Reference example E1 |
|---|---|---|---|---|---|---|---|
| Photosensitive dielectric-forming composition | Composite particles for dielectrics | Composite particles for dielectrics (a) | Composite particles for dielectrics (a) | Composite particles for dielectrics (b) | Composite particles for dielectrics (a) | Composite particles for dielectrics (c) | Inorganic particles particles |
|  | (Parts) | 100 | 100 | 100 | 100 | 100 | 100 |
|  | Material of inorganic particles (parts) | Barium titanate (80) | Barium titanate (80) | Barium titanate (85) | Barium titanate (80) | Barium titanate (92) | Barium titanate (100) |

TABLE E1-continued

|  |  | Example E1 | Example E2 | Example E3 | Example E4 | Example E5 | Reference example E1 |
|---|---|---|---|---|---|---|---|
|  | Particle size of inorganic particles (μm) | 0.6 | 0.6 | 0.2 | 0.6 | 0.2 | 0.6 |
|  | Conductive Material (Parts) | Silver (20) | Silver (20) | Silver (15) | Silver (20) | Titanium nitride (8) | — |
|  | Inorganic ultrafine particles |  |  | Titania | Barium titanate |  |  |
|  | Average particle size (nm) | — | — | 20 | 30 | — | — |
|  | (parts) |  |  | 5 | 4 |  |  |
|  | Resin capable of undergoing alkali development |  |  |  |  |  |  |
|  | Mw | 50,000 | 100,000 | 50,000 | 80,000 | 50,000 | 50,000 |
|  | (Parts) | 15 | 20 | 15 | 15 | 15 | 15 |
|  | Photosensitive acid producing compound (parts) | 1 | 1 | 1 | 1 | 1 | 1 |
|  | Solvent (parts) | 100 | 100 | 110 | 101 | 100 | 100 |
| Patterning properties | Pattern Accuracy | ○ | ○ | ○ | ○ | ○ | ○ |
|  | Pattern Loss | ○ | ○ | ○ | ○ | ○ | ○ |
| Properties of dielectrics | Thickness (μm) | 10 | 10 | 10 | 10 | 10 | 10 |
|  | Permittivity | 43 | 45 | 100 | 110 | 50 | 25 |
|  | Dielectric loss tangent | 0.05 | 0.05 | 0.06 | 0.04 | 0.01 | 0.03 |
|  | Resistance to moist heat | ○ | ○ | ○ | ○ | ○ | ○ |
|  | Leakage current (A/cm$^2$) | $10^{-11}$ | $10^{-11}$ | $10^{-11}$ | $10^{-12}$ | $10^{-11}$ | $10^{-11}$ |

TABLE E2

|  |  | Example E6 | Example E7 | Example E8 | Reference example E2 |
|---|---|---|---|---|---|
| Photosensitive dielectric-forming composition | Composite particles for dielectrics | Composite particles for dielectrics (a) | Composite particles for dielectrics (b) | Composite particles for dielectrics (a) | Inorganic particles |
|  | (Parts) | 100 | 100 | 100 | 100 |
|  | Material of inorganic particles (parts) | Barium titanate (80) | Barium titanate (85) | Barium titanate (80) | Barium titanate (100) |
|  | Particle size of inorganic particles (μm) | 0.2 | 0.2 | 0.6 | 0.6 |
|  | Conductive Material (Parts) | Silver (20) | Silver (15) | Silver (20) | — |
|  | Inorganic ultrafine particles |  | Titania | Barium titanate |  |
|  | Average particle size (nm) | — | 20 | 30 | — |
|  | (parts) |  | 5 | 4 |  |
|  | Resin capable of undergoing alkali development |  |  |  |  |
|  | Mw | 50,000 | 50,000 | 80,000 | 50,000 |
|  | (Parts) | 35 | 35 | 30 | 35 |
|  | Photosensitive acid producing compound (parts) | 1 | 1 | 1 | 1 |
|  | Solvent (parts) | 150 | 150 | 186 | 150 |
| Patterning properties | Pattern Accuracy | ○ | ○ | ○ | ○ |
|  | Pattern Loss | ○ | ○ | ○ | ○ |
| Properties of dielectrics | Thickness (μm) | 10 | 10 | 10 | 10 |
|  | Permittivity | 35 | 80 | 90 | 18 |
|  | Dielectric loss tangent | 0.05 | 0.06 | 0.04 | 0.03 |
|  | Resistance to moist heat | ○ | ○ | ○ | ○ |
|  | Leakage current (A/cm$^2$) | $10^{-12}$ | $10^{-12}$ | $10^{-12}$ | $10^{-12}$ |

Example F

Corresponding to Invention 3-3

<1> Preparation of Components

Example of Synthesis F1

<Inorganic Particle Dispersions [1]>

100 parts of barium titanate particles (trade name: "BT-02", manufactured by Sakai Chemical Industry Co., Ltd., average particle size: 0.2 μm, permittivity: 2000) were mixed with 300 parts of isopropyl alcohol by a homomixer, and were further treated by a homogenizer to obtain organic particle dispersions [1] having no agglomerates (solid content: 25%).

Example of Synthesis F2

<Inorganic Particle Dispersions [2]>

100 parts of barium titanate particles (trade name: "HPBT-1", manufactured by Fuji Titanium Co., Ltd., average particle size: 0.6 μm, permittivity: 2000) were mixed with 300 parts of isopropyl alcohol by a homomixer, and were further treated by a homogenizer to obtain organic particle dispersions [2] having no agglomerates (solid content: 25%).

Example of Synthesis F3

<Inorganic Particle Dispersions [3]>
100 parts of aluminum oxide particles (manufactured by Bikovskii Co., Ltd., average particle size: 0.1 µm, permittivity: 10) were mixed with 300 parts of isopropyl alcohol by a homomixer, and were further treated by a homogenizer to obtain organic particle dispersions [3] having no agglomerates (solid content: 25%).

Example of Synthesis F4

<Dispersions of Composite Particles for Dielectrics [1]>
Using barium titanate particles (trade name: "HPBT-1", manufactured by Fuji Titanium Co., Ltd., average particle size: 0.6 µm, permittivity: 2000) as inorganic particles, the surfaces of the particles were coated with silver by the nonelectrolytic silver plating method. It was shown from SEM observation of the resulting granular dielectric composite particles that fine particles of silver were partially deposited on the surfaces of the particles in an island form, and it was shown from the result of fluorescent X-ray measurements that the amount of deposited silver was 20% by mass with respect to the amount of barium titanate. On the other hand, the specific surface area of the dielectric composite particles was 3.0 $m^2/g$. Then, 100 parts of resulting dielectric composite particles were mixed with 300 parts of methyl propylene glycol by a homomixer, and were further treated by a bead mill to obtain dispersions of composite particles for dielectrics [1] having no agglomerates (solid content: 25%).

Example of Synthesis F5

<Dispersions of Composite Particles for Dielectrics [2]>
Using barium titanate particles (trade name: "BT-02", manufactured by Sakai Chemical Industry Co., Ltd., average particle size: 0.2 µm, permittivity: 2000) as inorganic particles, the surfaces of the particles were coated with copper by the nonelectrolytic copper plating method. It was shown from SEM observation of the resulting granular dielectric composite particles that fine particles of copper were partially deposited on the surfaces of the particles in an island form, and it was shown from the result of fluorescent X-ray measurements that the amount of deposited copper was 10% by mass with respect to the amount of barium titanate. On the other hand, the specific surface area of the dielectric composite particles was 7.0 $m^2/g$. Then, 100 parts of resulting dielectric composite particles were mixed with 300 parts of methyl propylene glycol by a homomixer, and were further treated by a bead mill to obtain dispersions of composite particles for dielectrics [2] having no agglomerates (solid content: 25%).

Example of Synthesis F6

<Hydrolyzable Silane Compound (I)>
270 g (1.98 mol) of methyl trimethoxy silane, 67.2 g (0.22 mol) of methyloxetanyl methoxypropyl triethoxy silane, and 89.1 g (4.95 mol) of ion exchange water with electrical conductivity of $8.0 \times 10^{-5}$ S·cm$^{-1}$ were placed in a vessel equipped with a stirrer, and were thereafter heated and stirred at 60° C. for 6 hours, whereby the silane compounds were hydrolyzed. Then, methanol produced as a by-product was distilled away while methyl isobutyl ketone (hereinafter referred to as "MIBK" in abbreviated form) was dropped in the vessel. Then, an adjustment was made so that the final solid content was 75% to obtain a polysiloxane solution as a hydrolyzable silane compound (F-I). For the obtained polysiloxane solution, the polystyrene equivalent weight average molecular weight was 1500 when measured using GPC.

Example of Synthesis F7

<Hydrolyzable Silane Compound (II)>
301 g (1.98 mol) of tetramethoxy silane, 67.2 g (0.22 mol) of methyloxetanyl methoxypropyl triethoxy silane, and 89.1 g (4.95 mol) of ion exchange water with electrical conductivity of $8.0 \times 10^{-5}$ S·cm$^{-1}$ were placed in a vessel equipped with a stirrer, and were thereafter heated and stirred at 60° C. for 6 hours, whereby the silane compounds were hydrolyzed. Then, methanol produced as a by-product was distilled away while MIBK was dropped in the vessel. Then, an adjustment was made so that the final solid content was 75% to obtain a polysiloxane solution as a hydrolyzable silane compound [II]. For the obtained polysiloxane solution, the polystyrene equivalent weight average molecular weight was 1400 when measured using GPC.

<2> Preparation of Dielectric-Forming Composition and Formation of Dielectric Pattern Example F1

400 parts of inorganic particle dispersions [1] of Example of Synthesis F1 (solid content: 100 parts) and 26.7 parts of hydrolyzable silane compound [1] of Example of Synthesis 6 (solid content: 20 parts) were sufficiently mixed together to obtain the dielectric-forming composition of Example F1. Then, the dielectric-forming composition of Example F1 was applied to a printed-wiring board at a predetermined position using a screen printer, and the coating was preliminarily dried at 100° C. for 5 minutes to form a dielectric layer with thickness of 5 µm. Then, the printed-wiring board with the dielectric layer formed thereon was cured in an oven at 150° C. for 1 hour to form a dielectric pattern on the surface of the printed-wiring board.

Example F2

The dielectric-forming composition [II] of Example F2 was obtained in just a same way as Example F1 except that the dispersions of composite particles for dielectrics [1] of Example of Synthesis F4 were used instead of the inorganic particle dispersions [1] of Example of Synthesis F1, and the hydrolyzable silane compound [II] of Example of Synthesis F7 was used instead of the hydrolyzable silane compound [I] of Example of Synthesis F6. Then, a dielectric layer with thickness of 5 µm was formed in just a same way except that the dielectric-forming composition of Example F2 was used instead of the dielectric-forming composition of Example F1, and thereafter the curing step was carried out to form a dielectric pattern.

Example F3

The dielectric-forming composition of Example F3 was obtained in just a same way as Example F1 except that the inorganic particle dispersions [1] of Example of Synthesis F2 were used instead of the inorganic particle dispersions [1] of Example of Synthesis F1, and the hydrolyzable silane compound (II) of Example of Synthesis F7 was used instead of the hydrolyzable silane compound (I) of Example of Synthesis F6. Then, a dielectric layer with thickness of 5 μm was formed in just a same way except that the dielectric-forming composition of Example F3 was used instead of the dielectric-forming composition of Example F1, and thereafter the curing step was carried out to form a dielectric pattern.

Example F4

The dielectric-forming composition of Example F4 was obtained in just a same way as Example F1 except that the dispersions of composite particles for dielectrics [2] of Example of Synthesis F5 were used instead of the inorganic particle dispersions [1] of Example of Synthesis F1. Then, a dielectric layer with thickness of 5 μm was formed in just a same way except that the dielectric-forming composition of Example F4 was used instead of the dielectric-forming composition of Example F1, and thereafter the curing step was carried out to form a dielectric pattern.

Comparative Example F1

The dielectric-forming composition of Comparative Example F1 was obtained in just a same way as Example F1 except that the inorganic particle dispersions [3] of Example of Synthesis F3 were used instead of the inorganic particle dispersions [1] of Example of Synthesis F1. Then, a dielectric layer with thickness of 5 μm was formed in just a same way except that the dielectric-forming composition of Comparative Example F1 was used instead of the dielectric-forming composition of Example F1, and thereafter the curing step was carried out to form a dielectric pattern.

<3> Evaluation

For the obtained dielectric patterns of the above Examples F1 to F4 and Comparative Example F1, dielectric properties and patterning properties were evaluated in the following way. The results are shown in Table F1.

<<1>> Permittivity, Dielectric Loss Tangent, Volume Resistivity and Leakage Current Measurements were conducted in accordance with JIS K6911. Furthermore, the permittivity and dielectric loss tangent represent values measured at the frequency of 1 MHz. Also, the leakage current was measured by an insulation resistance meter (manufactured by Hewlett-Packard Co., Ltd.).

<<2>> Resistance to Moist Heat (HAST Test)

For the dielectric layers, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

○ . . . no significant difference and satisfactory level of resistance.

× . . . significant difference and unsatisfactory level of resistance.

TABLE F1

|  |  | Example F1 | Example F2 | Example F3 | Example F4 | Comparative example F1 |
|---|---|---|---|---|---|---|
| Dielectric-forming composition | (A) Inorganic particles or composite particles for dielectrics (parts) | Inorganic particles 100 | Composite particles for dielectrics 100 | Inorganic particles 100 | Composite particles for dielectrics 100 | Inorganic particles 100 |
|  | Material of inorganic particles (parts) | Barium titanate (100) | Barium titanate (80) | Barium titanate (80) | Barium titanate (90) | Aluminum oxide (100) |
|  | Particle size of inorganic particles (μm) | 0.2 | 0.6 | 0.6 | 0.2 | 0.1 |
|  | Permittivity of inorganic particles | 2000 | 2000 | 2000 | 2000 | 10 |
|  | Conductive material (parts) | — | Silver (20) | — | Copper (10) | — |
|  | (B) Hydrolyzable silane compound | (I) | (II) | (II) | (I) | (I) |
|  | Mw | 1500 | 1400 | 1400 | 1500 | 1500 |
|  | (Parts) | 20 | 20 | 20 | 20 | 20 |
| Properties of dielectrics | Thickness (μm) | 5 | 5 | 5 | 5 | 5 |
|  | Permittivity | 74 | 235 | 105 | 210 | 8 |
|  | Dielectric loss tangent | 0.02 | 0.05 | 0.01 | 0.03 | 0.01 |
|  | Resistance to moist heat | ○ | ○ | ○ | ○ | ○ |
|  | Volume resistivity ($\times 10^{14}$ Ωcm) | 1 | 0.1 | 1 | 1 | 1 |
|  | Leakage current (A/cm$^2$) | $10^{-11}$ | $10^{-10}$ | $10^{-11}$ | $10^{-11}$ | $10^{-11}$ |

<4> Preparation of Photosensitive Dielectric-Forming Composition and Dielectric Pattern

Example F5

26.7 parts of hydrolyzable silane compound (I) of Example of Synthesis 6, 0.2 parts of triphenylsulfone trifluoromethane sulfonate as a photo acid generator, 0.07 parts of 9-anthracene methanol as a sensitizer, and 0.02 parts of surfactant (manufactured by Dainippon Ink & Chemicals, Inc., trade name "MegafacF-172") were added to 400 parts of in organic particle dispersions (1) of the above Example of Synthesis F1, and were sufficiently mixed together to obtain the photosensitive dielectric-forming composition of Example 5. Then, a printed-wiring board was coated with the photosensitive dielectric-forming composition of Example 5 using a blade coater, and the coating was dried at 100° C. for 5 minutes to form a photosensitive dielectric layer with thickness of 3 μm.

Then, the photosensitive dielectric layer was irradiated with an i-ray (ultraviolet light with wavelength of 365 nm) by an ultra-high pressure mercury lamp through a mask for exposure (dot pattern of 500-μm square). Here, the amount of irradiation was 400 mJ/cm². After the step of exposure was completed, the photosensitive dielectric layer exposed to light was subjected to development processing for 90 seconds by the shower method using a 2.4% tetramethyl ammonium hydroxide (TMAH) solution (25° C.) as a developer. The photosensitive dielectric layer was then washed with ultrapure water, whereby the uncured photosensitive dielectric layer not exposed to ultraviolet light was removed to form a pattern. Thereafter, the printed-wiring board with a photosensitive dielectric layer pattern formed thereon was cured in an oven at 150° C. for 1 hour to provide a dielectric pattern on the surface of the printed-wiring board.

Example F6

The photosensitive dielectric-forming composition of Example F6 was obtained in just a same way as Example F5 except that the dispersions of composite particles for dielectrics (1) of Example of Synthesis F4 were used instead of the inorganic particle dispersions (1) of Example of Synthesis F1, and the hydrolyzable silane compound (II) of Example of Synthesis F7 was used instead of the hydrolyzable silane compound (I) of Example of Synthesis F6. Then, a photosensitive dielectric layer with thickness of 3 μm was formed in just a same way except that the photosensitive dielectric-forming composition of Example F6 was used instead of the photosensitive dielectric-forming composition (I) of Example F5, and thereafter the steps of exposure/development/curing were carried out to form a dielectric pattern.

Example F7

The photosensitive dielectric-forming composition of Example F7 was obtained in just a same way as Example F5 except that the inorganic particle dispersions (2) of Example of Synthesis F2 were used instead of the inorganic particle dispersions (1) of Example of Synthesis F1, and the hydrolyzable silane compound (II) of Example of Synthesis F7 was used instead of the hydrolyzable silane compound (I) of Example of Synthesis F6. Then, a photosensitive dielectric layer with thickness of 3 μm was formed in just a same way except that the photosensitive dielectric-forming composition of Example F7 was used instead of the photosensitive dielectric-forming composition of Example F5, and thereafter the steps of exposure/development/curing were carried out to form a dielectric pattern.

Example F8

The photosensitive dielectric-forming composition of Example F8 was obtained in just a same way as Example F5 except that the dispersions of composite particles for dielectrics (2) of Example of Synthesis F5 were used instead of the inorganic particle dispersions (1) of Example of Synthesis F1. Then, a photosensitive dielectric layer with thickness of 3 μm was formed in just a same way except that the photosensitive dielectric-forming composition of Example F8 was used instead of the photosensitive dielectric-forming composition of Example F5, and thereafter the steps of exposure/development/curing were carried out to form a dielectric pattern.

Comparative Example F2

The photosensitive dielectric-forming composition of Comparative Example F2 was obtained in just a same way as Example F5 except that the inorganic particle dispersions (3) of Example of Synthesis F3 were used instead of the inorganic particle dispersions (1) of Example of Synthesis F1. Then, a photosensitive dielectric layer with thickness of 3 μm was formed in just a same way except that the photosensitive dielectric-forming composition of Comparative Example F2 was used instead of the photosensitive dielectric-forming composition of Example F5, and thereafter the steps of exposure/development/curing were carried out to form a dielectric pattern.

<5> Evaluation

For the obtained dielectric patterns of the above Examples F5 to F8 and Comparative Example F2, a scanning electron microscope was used to measure the widths and heights of the dielectric patterns, and patterns with the wide within 500 μm±10 μm were rated as ○, and other patterns were rated as ×, and observations were made for loss of pattern by an optical microscope to conduct evaluations for patterning properties. Also, Evaluations for dielectric properties were conducted in accordance with the methods described in the above section <3>. The results are shown in Table F2.

TABLE F2

| | | Example F5 | Example F6 | Example F7 | Example F8 | Comparative example F2 |
|---|---|---|---|---|---|---|
| Photo-sensitive dielectric-forming composition | (A) Inorganic particles or composite particles for dielectrics (parts) | Inorganic particles 100 | Composite particles for dielectrics 100 | Inorganic particles 100 | Composite particles for dielectrics 100 | Inorganic particles 100 |
| | Material of inorganic particles (parts) | Barium titanate (100) | Barium titanate (80) | Barium titanate (80) | Barium titanate (90) | Aluminum oxide (100) |
| | Particle size of inorganic particles (μm) | 0.2 | 0.6 | 0.6 | 0.2 | 0.1 |
| | Permittivity of inorganic particles | 2000 | 2000 | 2000 | 2000 | 10 |
| | Conductive material (parts) | — | Silver (20) | — | Copper (10) | — |
| | (B) Hydrolyzable silane compound | (I) | (II) | (II) | (I) | (I) |
| | Mw | 1500 | 1400 | 1400 | 1500 | 1500 |
| | (Parts) | 20 | 20 | 20 | 20 | 20 |
| | (C) Photo acid generator (parts) | 0.2 | 0.2 | 0.2 | 0.2 | 0.2 |

TABLE F2-continued

|  |  | Example F5 | Example F6 | Example F7 | Example F8 | Comparative example F2 |
|---|---|---|---|---|---|---|
| Patterning Properties | Pattern accuracy | ○ | ○ | ○ | ○ | ○ |
| Properties | Pattern loss | ○ | ○ | ○ | ○ | ○ |
| Properties of dielectrics | Thickness (μm) | 3 | 3 | 3 | 3 | 3 |
|  | Permittivity | 70 | 230 | 100 | 200 | 8 |
|  | Dielectric loss tangent | 0.02 | 0.05 | 0.01 | 0.03 | 0.01 |
|  | Resistance to moist heat | ○ | ○ | ○ | ○ | ○ |
|  | Volume resistivity ($\times 10^{14}$ Ωcm) | 1 | 0.1 | 1 | 1 | 1 |
|  | Leakage current (A/cm$^2$) | $10^{-11}$ | $10^{-10}$ | $10^{-11}$ | $10^{-11}$ | $10^{-11}$ |

<6> Effects of Examples

It can be understood from Table F1 that for Examples F1 to F4, the dielectric loss tangent is small with the values of dielectric loss tangent being in the range of from 0.01 to 0.05, and the permittivity is large with the values of permittivity being in the range of from 74 to 235 reflecting high permittivity. On the other hand, it can be understood that for Comparative Example F1, the dielectric loss tangent is small with the value of dielectric loss tangent being equal to 0.01, but the permittivity is also small with the value of permittivity being equal to 8. Also, it can be understood form Table F2 that for Examples F5 to F8, the dielectric loss tangent is small with the values of dielectric loss tangent being in the range of from 0.01 to 0.05, and the permittivity is large with the values of permittivity being in the range of from 70 to 230 reflecting high permittivity as in the case of Examples F1 to F4. On the other hand, it can be understood that for Comparative Example F2, the dielectric loss tangent is small with the value of dielectric loss tangent being equal to 0.01, but the permittivity is also small with the value of permittivity being equal to 8. In addition, it can be understood that for Examples F5 to F8, excellent patterning properties are shown, thus making it possible to form patterns of high dimensional accuracy.

Furthermore, the present invention is not limited to the specific examples described above, but various examples changed within the scope of the present invention can be employed depending on purposes and uses. For example, the dielectric-forming composition and photosensitive dielectric-forming composition of the present invention can be prepared by kneading the respective components described above using a roll kneader, a mixer, a homomixer, a ball mill, a bead mill or the like. Also, the thickness of the dielectric of the present invention is not particularly limited, and is preferably 100 μm or smaller, 30 μm or smaller, further preferably 10 μm or smaller. The lower limit of the thickness of the dielectric is not specified, but is usually 1μ or larger.

Example G

Corresponding to Invention 4

Example G1

(1) Production of Composite Particles for Dielectrics

The surfaces of barium titanate particles (trade name: "HPBT-1", manufactured by Fuji Titanium Co., Ltd., average particle size: 0.6 μm, permittivity: 2000) were coated with silver by the nonelectrolytic silver plating method to obtain composite particles for dielectrics (a).

It was shown from SEM (scanning electron microscope) observation of the resulting powders that fine particles of silver were partially deposited on the surfaces of particles. Also, it was shown by SIMS (secondary ion mass spectrometry) that barium titanate had 10% of silver deposited on the surface based on the weight ratio. On the other hand, the specific area of powders was 3.8 m$^2$/g.

(2) Preparation of Photosensitive Composition 100 parts of the above described composite particles for dielectrics (a) as composite particles for dielectrics, 20 parts of n-butyl methacrylate/3-hydroxypropyl methacrylate/methacrylic acid=60/20/20 (% by weight) copolymer (Mw=50,000) as an alkali soluble resin, 10 parts of trimethylolpropane triacrylate as an ethylene based unsaturated group-containing compound, 2 parts of 2-benzyl-2-dimethylamino-1-(4-morpholinophenyl)-butane-1-on as a photopolymerization initiator, 100 parts of propylene glycol monomethylether as a solvent and 1 part of oleic acid as a dispersant, and 0.5 parts of acetylene black as a bulking agent were kneaded by a bead mill, and were thereafter filtered by a stainless mesh (500 meshes), whereby a photosensitive composition was prepared.

(3) Preparation of Photosensitive Transfer Film

The photosensitive transfer film of the present invention with a photosensitive transfer layer formed on a substrate film was prepared in accordance with the procedure (a) described below.

(a) The photosensitive composition obtained as described above was coated on a substrate film (width: 200 mm, length: 30 m, thickness: 38 μm) made of PET film subjected in advance to treatment for releasability using a baled coater, and the coating was dried at 100° C. for 5 minutes to remove solvents completely, whereby a photosensitive resin layer with thickness of 20 μm was formed on the substrate film.

(4) Step of Transferring Photosensitive Transfer Layer

The photosensitive transfer film was superimposed on the surface of the printed-wiring boars so that the surface of the photosensitive transfer layer was abutted, and this photosensitive transfer film was thermo-compressed by a heat roller. Here, for the conditions of compression, the surface temperature of the heat roller was 120° C., the roll pressure was 4 kg/cm$^2$, and the traveling speed of the heat roller was 0.5 m/minute. Thereby, the photosensitive transfer layer was transferred and bonded to the glass substrate. For this photosensitive dielectric-forming layer, the thickness was measured to find that it was in 20 μm±1 μm.

(5) Steps of Exposure and Development of Dielectric Layer

The photosensitive dielectric layer was irradiated with an i-ray (ultraviolet light with wavelength of 365 nm) by an ultra-high pressure mercury lamp through a mask for exposure (dot pattern of 500-μm square). Here, the amount of irradiation was 400 mJ/cm².

After the step of exposure was completed, the photosensitive dielectric layer exposed to light was subjected to development processing for 1 minute by the shower method using 0.5% by mass of sodium carbonate solution (30° C.) as a developer. The photosensitive dielectric layer was then washed with ultrapure water, whereby the uncured photosensitive dielectric layer not exposed to ultraviolet light was removed to form a pattern.

(6) Step of Curing Dielectric Layer Pattern

The printed-wiring board with a photosensitive dielectric layer pattern formed thereon was cured in an oven at 200° C. for 30 minutes. Thereby, a dielectric pattern was provided on the surface of the printed-wiring board.

The patterning properties and dielectric properties of the obtained dielectric pattern were evaluated by methods described later. The results are shown in Table G1.

Example G2

A photosensitive composition was prepared in a same way as Example G1 except that 10 parts of n-butyl methacrylate/3-hydroxypropyl methacrylate/methacrylic acid=60/20/20 (% by weight) copolymer (Mw=100,000) as an alkali soluble resin and 5 parts of trimethylolpropane triacrylate as an ethylene based unsaturated group-containing compound were used. A photosensitive transfer film having a photosensitive transfer layer with thickness of 20 μm was formed in a same way as Example G1 except that such a photosensitive composition was used, followed by carrying out steps of transfer/exposure/development/curing to prepare a dielectric pattern and evaluating the dielectric pattern. The results are shown in Table G1.

Example G3

The surfaces of barium titanate particles (trade name: "BT-02", manufactured by Sakai Chemical Industry Co., Ltd., average particle size: 0.2 μm, permittivity: 2000) were coated with silver by the nonelectrolytic silver plating method to obtain composite particles for dielectrics (b).

It was shown from SEM observation of the resulting powders that fine particles of silver were partially deposited on the surfaces of particles. Also, it was shown by SIMS that barium titanate had 20% of silver deposited on the surface based on the weight ratio. On the other hand, the specific area of powders was 4.0 m²/g.

A photosensitive composition was prepared in a same way as Example G1 except that 100 parts of the above described composite particles for dielectrics (b) were used as composite particles for dielectrics. A photosensitive film having a photosensitive dielectric layer with thickness of 20 μm was formed in a same way as Example G1 except that such a photosensitive composition was used, followed by carrying out steps of transfer/exposure/development/curing to prepare a dielectric pattern and evaluating the dielectric pattern. The results are shown in Table G1.

Example G4

The surfaces of calcium titanate particles (average particle size: 2 μm, permittivity: 140) were coated with nickel by the nonelectrolytic phosphorous-nickel plating method to obtain composite particles for dielectrics (c).

It was shown from SEM observation of the resulting powders that fine particles of nickel were partially deposited on the surfaces of particles. Also, it was shown by SIMS that calcium titanate had 10% of nickel deposited on the surface based on the weight ratio. On the other hand, the specific area of powders was 2.0 m²/g.

A photosensitive composition was prepared in a same way as Example G1 except that 100 parts of the above described composite particles for dielectrics (c) were used as composite particles for dielectrics. A photosensitive transfer film having a photosensitive dielectric layer with thickness of 20 μm was formed in a same way as Example G1 except that such a photosensitive composition was used, followed by carrying out steps of transfer/exposure/development/curing to prepare a dielectric pattern and evaluating the dielectric pattern. The results are shown in Table G1.

Reference Example G1

A photosensitive composition was prepared in a same way as Example G1 except that 1 part of trimethylolpropane triacrylate was used as an ethylene based unsaturated group-containing compound. A photosensitive transfer film having a photosensitive dielectric layer with thickness of 20 μm was formed in a same way as Example 1 except that such a photosensitive composition was used, followed by carrying out steps of transfer/exposure/development/curing to prepare a dielectric pattern and evaluating the dielectric pattern. The results are shown in Table G1.

Reference Example G2

A photosensitive composition was prepared in a same way as Example G1 except that 50 parts of trimethylol propane triacrylate were used as an ethylene based unsaturated group-containing compound. A photosensitive film having a photosensitive dielectric layer with thickness of 20 μm was formed in a same way as Example G1 except that such a photosensitive composition was used, followed by carrying out steps of transfer/exposure/development/curing to prepare a dielectric pattern and evaluating the dielectric pattern. The results are shown in Table G1.

Reference Example G3

A photosensitive composition was prepared in a same way as Example G1 except that 3 parts of n-butyl methacrylate/3-hydroxypropyl methacrylate/methacrylic acid=60/20/20 (% by mass) copolymer (Mw=100,000) were used as an alkali soluble resin. A photosensitive film having a photosensitive dielectric layer with thickness of 20 μm was formed in a same way as Example G1 except that such a photosensitive composition was used, and thereafter the photosensitive film was transferred onto the board, but caused transfer failure. The results are shown in Table G1.

[Transfer Properties]

In transferring the photosensitive film to the surface of the printed-wiring board, photosensitive films successfully transferred were rated as ○, and photosensitive films causing transfer failure were rated as ×.

[Patterning Properties]

For the obtained dielectric patterns, a scanning electron microscope (SEM) was used to measure the widths and heights of such dielectric patterns, and patterns with the wide within 500 μm±10 μm were rated as ○, and other patterns were rated as ×. Also, observations were made for loss of pattern, and patterns with no loss were rated as ○, and patterns with loss were rated as ×.

[Permittivity, Dielectric Loss Tangent, Volume Resistivity and Leakage Current]

The permittivity, dielectric loss tangent and volume resistivity were measured in accordance with JIS K6911. Also, the leakage current was measured by an insulation resistance meter (manufactured by Hewlett-Packard Co., Ltd.).

The permittivity and dielectric loss tangent represent values measured at the frequency of 1 MHz.

[Resistance to Moist Heat (HAST Test)]

For cured films, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

○ . . . no significant difference and satisfactory level of resistance.

× . . . significant difference and unsatisfactory level of resistance.

Example H

Corresponding to Invention 5

Example H1

Ultrafine Particle-resin Composite Particles (1);

[Preparation of Titanium Oxide Ultrafine Particle-Compounded Polyimide Based Resin Emulsion]

32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2, 5-dioxo-3-furanyl)-naphtho [1, 2-c]-furane-1,3-dion, 36.95 g (90 milimol) of 2,2-bis[4-(4-aminophenoxy) phenyl]propane as a diamine compound, and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours.

TABLE G1

| | | Example G1 | Example G2 | Example G3 | Example G4 | Reference example G1 | Reference example G2 | Reference example G3 |
|---|---|---|---|---|---|---|---|---|
| Photosensitive transfer layer | Composite particles for dielectrics | Composite particles for dielectrics (a) | Composite particles for dielectrics (a) | Composite particles for dielectrics (b) | Composite particles for dielectrics (c) | Composite particles for dielectrics (a) | Composite particles for dielectrics (a) | Composite particles for dielectrics (a) |
| | (Parts) | 100 | 100 | 100 | 100 | 100 | 100 | 100 |
| | Material of inorganic particles | Barium titanate | Barium titanate | Barium titanate | Calcium titanate | Barium titanate | Barium titanate | Barium titanate |
| | (parts) | (90) | (90) | (80) | (90) | (90) | (90) | (90) |
| | Particle size of inorganic particles (μm) | 0.6 | 0.6 | 0.2 | 2 | 0.6 | 0.6 | 0.6 |
| | Conductive material (parts) | Silver (10) | Silver (10) | Silver (20) | Nickel (10) | Silver (10) | Silver (10) | Silver (10) |
| | Alkali soluble resin | | | | | | | |
| | Mw | 50,000 | 100,000 | 50,000 | 50,000 | 50,000 | 50,000 | 100,000 |
| | (Parts) | 20 | 10 | 20 | 20 | 20 | 20 | 3 |
| | Ethylene based unsaturated group-containing compound (parts) | 10 | 5 | 10 | 10 | 1 | 50 | 10 |
| | Photopolymerization initiator (parts) | 2 | 2 | 2 | 2 | 2 | 2 | 2 |
| | (E) Solvent (parts) | 100 | 100 | 100 | 100 | 100 | 100 | 100 |
| | (F) Dispersant (parts) | 1 | 1 | 1 | 1 | 1 | 1 | 1 |
| | Bulking agent (parts) | 0.5 | 0.5 | 0.5 | 0.5 | 0.5 | 0.5 | 0.5 |
| Patterning properties | Transfer property | ○ | ○ | ○ | ○ | ○ | ○ | × |
| | Pattern accuracy | ○ | ○ | ○ | ○ | × | × | — |
| | Pattern loss | ○ | ○ | ○ | ○ | × | ○ | — |
| Properties of dielectrics | Thickness (μm) | 20 | 20 | 20 | 20 | 20 | 20 | — |
| | Permittivity | 110 | 85 | 140 | 45 | 110 | 110 | — |
| | Dielectric loss tangent | 0.05 | 0.04 | 0.07 | 0.02 | 0.07 | 0.07 | — |
| | Resistance to moist Heat | ○ | ○ | ○ | ○ | ○ | ○ | — |
| | Leakage current (A/cm$^2$) | $10^{-11}$ | $10^{-12}$ | $10^{-11}$ | $10^{-11}$ | $10^{-11}$ | $10^{-11}$ | — |

(Note)
Alkali soluble resin: n-butyl methacrylate/3-hydroxypropyl methacrylate/methacrylic acid = 60/20/20 (% by weight)
Ethylene based unsaturated group-containing compound: trimethylol propane triacrylate
Photopolymerization initiator: 2-benzyl-2-dimelamino-1-(4-morpholinophenyl)-butane-1-on
Solvent: propylene glycol monomethyl ether
Dispersant: oleic acid, bulking agent: acetylene black Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate, and 1 part of azobisisobutylonitrile were continuously added to this reaction vessel for 5 hours while the mixture was made to undergo solution polymerization under stirring. After the mixture was completely added, the mixture was further stirred continuously at 85° C. for 2 hours and the solution polymerization was completed to obtain an acryl polymer solution with solid content of 50%.

50 parts (solid content) of polyimide solution, 30 parts (solid content) of acryl polymer solution, 20 parts of Epicoat 828 (trade name of a product manufactured by Yuka Shell Epoxy Co., Ltd.), and 67 parts (solid content) of isopropyl alcohol dispersions (solid content: 15%) of rutile titanium oxide ultrafine particles (average particle size: 20 nm) produced by the sol-gel method were mixed together and reacted at 70° C. for 1 hour, and thereafter 3 parts of acetic acid were gradually added thereto and mixed to adjust pH. Then, this was gradually added in 1300 parts of distilled water and vigorously stirred to obtain a cationic emulsion (solid content: 7.3%) of titanium oxide ultrafine particle-polyimide based resin composite particles. The average particle size of these titanium oxide ultrafine particle-compounded polyimide based resin particles was 0.2 μm.

Example H2

Ultrafine Particle-resin Composite Particles (2);

[Preparation of Titanium Oxide Ultrafine Particle-Epoxy Based Resin Composite Emulsion]

46.3 parts of block isocyanate constituted of tolylene diisocyanate and 2-ethylhexanol, 89.3 parts of epoxyamine adduct obtained by reacting Epicoat 828 (trade name of a product manufactured by Yuka Shell Epoxy Co., Ltd.) with diethylamine, and 100 parts (solid content) of ethanol dispersions (solid content: 15%) of anatase-type titanium oxide ultrafine particles (average particle size: 20 nm) produced by the gas phase method were mixed together, and 3.8 parts of acetic acid was added thereto as a pH regulator. This was put into 1500 parts of ion-exchanged water under stirring to obtain a cationic emulsion (solid content: 10%) of titanium oxide ultrafine particle-compounded epoxy based resin particles having an epoxy based resin precursor as a principal constituent. The average particle size of these titanium oxide ultrafine particle-epoxy based resin composite particles was 0.3 μm.

Example H3

Ultrafine Particle-resin Composite Particles (3);

[Preparation of Barium Titanate Ultrafine Particle-Polyimide Based Resin Composite Emulsion]

32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2, 5-dioxo-3-furanyl)-naphtho [1, 2-c]-furane-1,3-dion, 36.95 g (90 milimol) of 2,2-bis[4-(4-aminophenoxy) phenyl]propane as a diamine compound, and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate, and 1 part of azobisisobutylonitrile were continuously added to this reaction vessel for 5 hours while the mixture was made to undergo solution polymerization under stirring. After the mixture was completely added, the mixture was further stirred continuously at 85° C. for 2 hours, and the solution polymerization was completed to obtain an acryl polymer solution with solid content of 50%.

50 parts (solid content) of polyimide solution, 30 parts (solid content) of acryl polymer solution, 20 parts of Epicoat 828 (trade name of a product manufactured by Yuka Shell Epoxy Co., Ltd.), and 67 parts (solid content) of isopropyl alcohol dispersions (solid content: 15%) of barium titanate ultrafine particles (average particle size: 30 nm) produced by the sol-gel method were mixed together and reacted at 70° C. for 1 hour, and thereafter 3 parts of acetic acid were gradually added thereto and mixed to adjust pH. Then, this was gradually added in 1300 parts of distilled water and vigorously stirred to obtain a cationic emulsion (solid content: 7.3%) of barium titanate ultrafine particle-compounded polyimide based resin particles. The average particle size of these barium titanate ultrafine particle-polyimide based resin composite particles was 0.2 μm.

Example of Synthesis H1

[Preparation of Polyimide Based Resin Emulsion]

A cationic emulsion (solid content: 6.5%) of polyimide based resin particles was prepared in just a same way as Example H1 except that isopropyl alcohol dispersions (solid content: 15%) of rutile titanium oxide ultrafine particles (average particle size: 20 nm) produced by the sol-gel method were not added. The average particle size of these polyimide based resin particles was 0.2 μm.

Comparative Example H1

29 parts of isopropyl alcohol dispersions (solid content: 15%) of rutile titanium oxide ultrafine particles (average particle size: 20 nm) produced by the sol-gel method were added to 100 parts of cationic emulsion of polyimide based resin particles obtained in Example of Synthesis H1, and were sufficiently stirred to obtain a dielectric-forming composition being outside the scope of the present invention.

Example of Synthesis H2

[Synthesis of Inorganic Composite Particles (1)]

Inorganic composite particles (1) with the surfaces of barium titanate particles (trade name: "HPBT-1", manufactured by Fuji Titanium Co., Ltd., average particle size: 0.6 μm, permittivity: 2000) coated with silver by the nonelectrolytic silver plating method were obtained.

The change in weight before and after the deposition showed that the content of silver deposited on barium titanate was 20%. Also, it was shown from SEM observation of powders that fine particles of silver were deposited on the surfaces of particles.

Example of Synthesis H3

[Synthesis of Inorganic Composite Particles (2)]
Inorganic composite particles (2) with the surfaces of barium titanate particles (trade name: "BT02", manufactured by Sakai Chemical Industry Co., Ltd., average particle size: 0.2 μm, permittivity: 2000) coated with copper by the nonelectrolytic copper plating method were obtained.
The change in weight before and after the deposition showed that the content of copper deposited on barium titanate was 20%. Also, it was shown from SEM observation of powders that fine particles of copper were deposited on the surfaces of particles.

Example H4

Electrodeposition Liquid for Formation of Dielectrics (1);

[Preparation of Aqueous Dispersions for Electrodeposition (1)]
10 parts by weight of barium titanate particles (trade name: "HPBT-1", manufactured by Fuji Titanium Co., Ltd., average particle size: 0.6 μm, permittivity: 2000) were mixed with 70 parts by weight of methyl propylene glycol by a homomixer, and were thereafter subjected to beadmill dispersion treatment to obtain dispersions of inorganic composite particles having no agglomerates (solid content: 12.5%).
In addition, 40 parts of cationic emulsion of ultrafine particle-resin composite particles (1) obtained in Example H1 were mixed with 100 parts by weight of the above described dispersions to prepare aqueous dispersions for electrodeposition (1).

Example H5

Electrodeposition Liquid for Formation of Dielectrics (2);

[Preparation of Aqueous Dispersions for Electrodeposition (2)]
15 parts by weight of inorganic composite particles (1) obtained in Example of Synthesis H2 and 0.1 parts by weight of acetylene black were mixed with 85 parts by weight of ethyl lactate by a homomixer, and were thereafter subjected to bead mill dispersion treatment to obtain dispersions of inorganic composite particles having no agglomerates (solid content: 15%).
In addition, 40 parts of cationic emulsion of ultrafine particle-resin composite particles (1) obtained in Example 1 were mixed with 100 parts by weight of the above described dispersions to prepare aqueous dispersions for electrodeposition (H2).

Example of Synthesis H4

[Preparation of Polymer: Production of Thermoset Resin (Epoxy Group-Containing Polymer)]
In a reaction container, 25 g of glycidyl methacrylate, 10 g of acrylonitrile, 15 g of methylmethacrylate, and 50 g of dioxane were mixed together to prepare a uniform reaction stock solution.

This reaction stock solution was subjected to nitrogen bubbling for 30 minutes, followed by adding thereto 1.9 g of 2,2-azobisisobutylonitrile as a polymerization initiator.
The temperature in the reaction vessel was increased to 70° C. while nitrogen bubbling was continued. The polymerization reaction was continuously carried out at the same temperature for 7 hours. The resulting reaction solution was mixed with a large amount of hexane to solidify the polymer, and thereafter this polymer was collected and redissolved in dioxane. This process of solidification by hexane and redissolution in dioxane was repeated 5 times to remove unreacted monomers. Then, dioxane was evaporated under reduced pressure at 70° C. to obtain a white epoxy group-containing polymer. The weight average molecular weight of this polymer was measured using GPC (gel permeation chromatography) to find that it was 110,000.

Example H6

Dielectric Forming Composition (1);

[Preparation of Dielectric Forming Composition (1)]
25 parts by weight of inorganic composite particles (2) obtained in Example of Synthesis H3 and 0.1 parts by weight of acetylene black were mixed with 75 parts by weight of methyl propylene glycol by a homomixer, and were thereafter subjected to bead mill dispersion treatment to obtain dispersions of inorganic composite particles having no agglomerates (solid content: 25%).
In addition, 40 parts of cationic emulsion of ultrafine particle-resin composite particles (3) obtained in Example H3 and 2 parts by weight of the polymer of Example of Synthesis H4 were mixed with 100 parts by weight of the above described dispersions to prepare a dielectric-forming composition (1).

Example H7

Electrodeposition Liquid for Formation of Dielectrics (3);

[Preparation of Aqueous Dispersions for Electrodeposition (3)]
15 parts by weight of inorganic composite particles (2) obtained in Example of Synthesis H3 and 0.1 parts by weight of acetylene black were mixed with 85 parts by weight of methyl propylene glycol by a homomixer, and were thereafter subjected to bead mill dispersion treatment to obtain dispersions of inorganic composite particles having no agglomerates (solid content: 15%).
In addition, 40 parts of cationic emulsion of ultrafine particle-resin composite particles (2) obtained in Example 2 were mixed with 113 parts by weight of the above described dispersions to prepare aqueous dispersions for electrodeposition (3).

Comparative Example H2

Aqueous dispersions for electrodeposition being outside the scope of the present invention was prepared in just a same way as Example H4 except that 40 parts of cationic emulsion obtained in Example of synthesis H1 were used instead of 40 parts of cationic emulsion of ultrafine particle-resin composite particles (1) obtained in Example H1.

Comparative Example H3

Aqueous dispersions for electrodeposition being outside the scope of the present invention was prepared in just a same way as Example H5 except that 40 parts of cationic emulsion obtained in Example of synthesis 1 were used instead of 40 parts of cationic emulsion of ultrafine particle-resin composite particles (1) obtained in Example H1.

Formation of Dielectrics

[Formation of Dielectric Layer by Electrodeposition Method]

Copper plates as cathodes and SUS plates as counter-electrodes were placed in the aqueous dispersions for electrodeposition of the cationic emulsions of ultrafine particle-resin composite particles of the above described Examples H1 to H3, the dielectric-forming composition of Comparative Example H1, and the aqueous dispersions for electrodeposition of Examples H4, H5, and H7 and Comparative Examples H2 and H3, and particles were electro-deposited on the copper foil (thickness: 13 μm) on the cathode side by the constant current method of 0.5 to 1 mA/cm². Thereafter, they were heated at 120° C. for 10 minutes, and were further heated at 250° C. for 30 minutes for Examples H1 and H3 to H5 and Comparative Example H1 to H3, and at 150° C. for 30 minutes for Examples H2 and H7 to obtain dielectrics with copper foils. The thickness of the obtained dielectric was measured in μm unit by an electro magnetic thickness tester.

[Formation of Dielectric Layer by Die Coater]

The copper foil (thickness: 13 μm) was coated with the dielectric-forming composition (1) of the above described Example H6 by a die coater. Thereafter, the copper foil was heated at 120° C. for 10 minutes, and was further heated at 250° C. for 30 minutes to obtain a dielectric with a copper foil. The thickness of the obtained dielectric was measured in μm unit by an electro magnetic thickness tester.

Evaluation of Performance of Dielectrics

The performance of the dielectric was evaluated in accordance with the methods described below.

The results are shown in Tables H1 and H2.

[Permittivity, Dielectric Loss Tangent and Leakage Current]

An electrode with a guide ring (area; 1 cm², thickness; 0.5 μm) was formed on the upper face of the obtained dielectric with a copper foil by the aluminum deposition method. The permittivity and dielectric loss tangent at 1 MHz were measured ten times between the copper foil and the electrode by a LCR meter (HP4284A, manufactured by Hewlett-Packard Co., Ltd.), and average values thereof were determined. Also, the leakage current between the copper foil and the electrode was measured ten times by an insulation resistance meter (manufactured by Advantest Co., Ltd.), and the average value thereof was determined.

[Resistance to Moist Heat (HAST Test)]

For cured films, the test of resistance to moist heat was carried out for 72 hours at 121° C. and 100% humidity and under a pressure of 2 atmospheres, and infrared spectroscopy measurements were performed before and after the test, and depending on the degree of the difference, their resistance to moist heat was evaluated on the basis of the following criteria.

○ . . . no significant difference and satisfactory level of resistance.

× . . . significant difference and unsatisfactory level of resistance.

TABLE H1

|  |  | Example H1 | Example H2 | Example H3 | Comparative example H1 |
|---|---|---|---|---|---|
| Ultrafine Particle-resin composite Particles | Material of inorganic ultrafine particles (parts) | Titanium oxide (40) | Titanium oxide (50) | Barium titanate (40) | — |
|  | Particle size of inorganic ultrafine particles (μm) | 0.02 | 0.02 | 0.03 | — |
|  | Material of principal constituent of resin (parts) | Polyimide based resin (60) | Epoxy based resin (50) | Polyimide based resin (60) | Polyimide based resin (100) |
|  | Number of added parts (solid content) | 100 | 100 | 100 | 60 |
|  | Particle size (μm) | 0.2 | 0.3 | 0.2 | 0.2 |
| Added inorganic particles | Material of inorganic particles (parts) | — | — | — | Titanium oxide (100) |
|  | Particle size (μm) | — | — | — | 0.02 |
|  | Conductive material (parts) | — | — | — | — |
|  | Number of added parts (solid content) |  |  |  | 40 |
| Process conditions | Coating method | Electro-deposition | Electro-deposition | Electro-deposition | Electro-deposition |
|  | Baking temperature (° C.) | 250 | 150 | 250 | 250 |
| Dielectrics | Thickness (μm) | 2 | 2 | 2 | 2 |
|  | Permittivity | 9 | 7 | 11 | 4 |
|  | Dielectric loss tangent | 0.01 | 0.01 | 0.02 | 0.01 |
|  | Resistance to moist heat | ○ | ○ | ○ | ○ |
|  | Leakage current (A/cm²) | $10^{-13}$ | $10^{-13}$ | $10^{-13}$ | $10^{-12}$ |

TABLE H2

| | | Example H4 | Example H5 | Example H6 | Example H7 | Comparative example H2 | Comparative example H3 |
|---|---|---|---|---|---|---|---|
| Ultrafine particle-resin composite particles (A) | Material of inorganic ultrafine particles (parts) | Titanium oxide (40) | Titanium oxide (40) | Barium titanate (40) | Titanium oxide (50) | — | — |
| | Particle size of inorganic ultrafine particles (μm) | 0.02 | 0.02 | 0.03 | 0.02 | — | — |
| | Material of principal constituent of resin (parts) | Polyimide based resin (60) | Polyimide based resin (60) | Polyimide based resin (60) | Epoxy based resin (50) | Polyimide based resin (100) | Polyimide based resin (100) |
| | Number of added parts (solid content) | 2.9 | 2.9 | 2.9 | 2.9 | 2.6 | 2.6 |
| Added inorganic particles, Inorganic composite particles (B) | Material of inorganic particles (parts) | Barium titanate (100) | Barium titanate (80) | Barium titanate (80) | Barium titanate (80) | Barium titanate (100) | Barium titanate (80) |
| | Particle size (μm) | 0.6 | 0.6 | 0.2 | 0.2 | 0.6 | 0.6 |
| | Conductive material (parts) | — | Silver (20) | Copper (20) | Copper (20) | — | Silver (20) |
| | Number of added parts (solid content) | 12.5 | 15 | 25 | 17 | 12.5 | 15 |
| Weight Ratio | B/A | 81/19 | 84/16 | 90/10 | 85/15 | — | — |
| Process conditions | Coating method | Electro-deposition | Electro-deposition | Die Coater | Electro-deposition | Electro-deposition | Electro-deposition |
| | Baking temperature (° C.) | 250 | 250 | 250 | 150 | 250 | 250 |
| Dielectrics | Thickness (μm) | 5 | 5 | 10 | 10 | 5 | 10 |
| | Permittivity | 90 | 120 | 100 | 150 | 45 | 65 |
| | Dielectric loss tangent | 0.02 | 0.03 | 0.04 | 0.04 | 0.02 | 0.07 |
| | Resistance to moist heat | ○ | ○ | ○ | ○ | ○ | ○ |
| | Leakage current (A/cm$^2$) | $10^{-13}$ | $10^{-12}$ | $10^{-12}$ | $10^{-12}$ | $10^{-12}$ | $10^{-11}$ |

As apparent from Table H1, the dielectrics obtained from Examples H1 to H3 have increased permittivity and reduced leakage current in thickness compared to the dielectric of Comparative Example H1.

Also, as apparent from Table H2, the dielectrics obtained from Examples H4 to H7 have high permittivity and better electric properties compared to the dielectrics of Comparative Examples H2 and H3.

Example I

Corresponding to Invention 6

Example of Synthesis I1

[Production of Composite Particles for Dielectrics (1)]

Composite particles for dielectrics (1) with the surfaces of barium titanate particles (trade name: "HPBT-1", manufactured by Fuji Titanium Co., Ltd., average particle size: 0.6 μm, permittivity: 2000) coated with silver under reduced pressure by the deposition method were obtained.

The change in weight before and after the deposition showed that the content of silver deposited on barium titanate was 10%. Also, it was shown from SEM observation of powders that fine particles of silver were deposited on the surfaces of particles.

Example of Synthesis I2

[Production of Composite Particles for Dielectrics (2)]

Composite particles for dielectrics (2) with the surfaces of barium titanate particles (trade name: "HPBT-1", manufactured by Fuji Titanium Co., Ltd., average particle size: 0.6 μm, permittivity: 2000) coated with nickel by the nonelectrolytic method were obtained.

It was shown from SEM observation of the resulting powders that fine particles of nickel were deposited on the surfaces of particles. Also, it was shown by XMA that the content of nickel deposited on the surfaces was 20% based on the weight ratio.

Example of Synthesis I3

[Preparation of Polymer: Production of Thermoset Resin (Epoxy Group-Containing Polymer)]

In a reaction container, 25 g of glycidyl methacrylate (referred to as GMA in abbreviated form), 10 g of acrylonitrile (referred to as AN in abbreviated form), 15 g of methylmethacrylate (referred to as MMA in abbreviated form), and 50 g of dioxane (referred to as DOX in abbreviated form) were mixed together to prepare a uniform reaction stock solution.

This reaction stock solution was subjected to nitrogen bubbling for 30 minutes, followed by adding thereto 1.9 g of 2,2-azobisisobutylonitrile (referred to as AIBN in abbreviated form) as a polymerization initiator.

The temperature in the reaction vessel was increased to 70° C. while nitrogen bubbling was continued. The polymerization reaction was continuously carried out at the same temperature for 7 hours. The resulting reaction solution was mixed with a large amount of hexane to solidify the polymer, and thereafter this polymer was collected and redissolved in dioxane. This process of solidification by hexane and redissolution in dioxane was repeated 5 times to remove unreacted monomers. Then, dioxane was evaporated under reduced pressure at 70° C. to obtain a white epoxy group-containing polymer. The weight average molecular weight of this polymer was measured using GPC (gel permeation chromatography) to find that it was 110,000.

Example of Synthesis I4

[Preparation of Organic Particle Emulsion: Polyimide Based Resin Emulsion]

32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2, 5-dioxo-3-furanyl)-naphtho [1, 2-c]-furane-1,3-dion, 36.95 g (90 milimol) of 2,2-bis[4-(4-aminophenoxy) phenyl]propane as a diamine compound, and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate, and 1 part of azobisisobutylonitrile were continuously added to this reaction vessel for 5 hours while the mixture was made to undergo solution polymerization under stirring. After the mixture was completely added, the mixture was further stirred continuously at 85° C. for 2 hours and the solution polymerization was completed to obtain an acryl polymer solution with solid content of 50%.

50 parts (solid content) of polyimide solution, 30 parts (solid content) of acryl polymer solution and 20 parts of Epicoat 828 (trade name of a product manufactured by Yuka Shell Epoxy Co., Ltd.) were mixed together and reacted at 70° C. for 3 hours, and thereafter 3 parts of acetic acid were gradually added thereto and mixed to adjust pH. Then, 1000 parts of distilled water were gradually added thereto and vigorously stirred to obtain a cationic emulsion of organic particles having polyimide based resin as a principal constituent.

Example of Synthesis I5

[Preparation of Organic Particle Emulsion: Epoxy Based Resin Emulsion]

46.3 parts of block isocyanate constituted of tolylene diisocyanate and 2-ethylhexanol, and 89.3 parts of epoxyamine adduct obtained by reacting Epicoat 828 (trade name of a product manufactured by Yuka Shell Epoxy Co., Ltd.) with diethylamine were mixed together, and 3.8 parts of acetic acid was added thereto as a pH regulator. This was put into 1200 parts of ion-exchanged water under stirring, whereby a cationic emulsion of organic particles having an epoxy based resin precursor as a principal constituent was obtained.

Example of Synthesis I6

[Preparation of Dielectric Paste]

8 parts by weight of Epicoat 1004 being an epoxy resin (average molecular weight: 1600, manufactured by Yuka Shell Epoxy Co., Ltd.) as a thermoset resin, and 3 parts by weight of epoxy group-containing polymer obtained in Example of Synthesis I1 were dissolved in 60 parts by weight of butyl acetate cellosolve to prepare a uniform resin solution. To this resin solution were added 100 parts by weight of composite particles for dielectrics (1) obtained in Example of Synthesis I1 and 8 parts of acetylene black. Then, a triple roll was used to knead these dielectric paste composition materials for an hour to prepare a dielectric paste (1). The viscosity of this dielectric paste was 50000 mPa·s.

Example of Synthesis I7

[Preparation of Aqueous Dispersions for Electrodeposition]

15 parts by weight of composite particles for dielectrics (1) obtained in Example of Synthesis I1 and 0.2 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 40 parts of cationic emulsion of organic particles having an epoxy based resin as a principal constituent, obtained in Example of Synthesis I5, were mixed with 100 parts by weight of the above described dispersions to prepare aqueous dispersions for electrodeposition (1).

Example of Synthesis I8

[Preparation of Aqueous Dispersions for Electrodeposition]

15 parts by weight of composite particles for dielectrics (2) obtained in Example of Synthesis I2 and 0.1 parts by weight of acetylene black were mixed with 85 parts by weight of ethyl lactate by a homomixer, were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent that had been obtained in Example of Synthesis I4 were mixed with 100 parts by weight of the above described dispersions to prepare aqueous dispersions for electrodeposition (2).

Comparative Example of Synthesis I1

A paste composition was obtained in just a same way as Example of Synthesis I5 except that barium titanate particles (tradename: "HPBT-1", manufactured by Fuji Titanium Co., Ltd., average particle size: 0.6 μm, permittivity: 2000) were used instead of composite particles for dielectrics (1) obtained in Example of Synthesis I1.

Comparative Example of Synthesis I2

Aqueous dispersions were obtained in just a same way as Example of Synthesis I6 except that barium titanate particles (tradename: "HPBT-1", manufactured by Fuji Titanium Co., Ltd., average particle size: 0.6 μm, permittivity: 2000) were used instead of composite particles for dielectrics (1) obtained in Example of Synthesis I1.

Production of Multilayer Circuit Board and Evaluation of Performance Thereof (1) A BT resin copper-clad laminate having 18-μm copper foils 2 laminated to the both sides of a substrate 1 with thickness of 0.8 mm made of BT (bismaleimidetriazine) (manufactured by Mitsubishi Gas Chemical Co., Inc., tradename: HLB30-0.8T12D) was used as a starting material (See FIG. 3A). First, a perforating hole 3a for formation of through-holes was provided in this copper-clad laminate by drilling (See FIG. 3B), and then palladium-tin colloids were deposited on the side face of this perforating hole 3a, and nonelectrolytic plating was applied thereto with a nonelectrolytic plating aqueous solution having the composition described blow in accordance with the conditions described below, thereby forming a on the entire surface of the substrate nonelectrolytic plated film with thickness of 0.7 μm.

[Nonelectrolytic Plating Aqueous Solution]

EDTA 150 g/l, copper sulfate 20 g/l, HCHO 30 ml/l, NaOH 40 g/l, a,a'-bipyridyl 80 mg/l, PEG 0.1 g/l [conditions for nonelectrolytic plating] temperature of solution: 70° C., plating time: 30 minutes.

In addition, electrolytic copper plating was applied with an electrolytic plating aqueous solution having the composition described below in accordance with the conditions described below, thereby forming an electrolytic copper plated film 3b with thickness of 15 μm to provide a through-hole 3 (See FIG. 3C).

[Electrolytic Plating Aqueous Solution]

Sulfuric acid 180 g/l, copper sulfate 80 g/l, additives (manufactured by Atotech Japan Co., Ltd., trade name: Kaparaside GL) 1 ml/l

[conditions for electrolytic plating] current density: 1 A/dm$^2$, time 30 minutes, temperature: room temperature.

(2) A substrate having formed on the entire surface a conductor layer (including the through-hole 3) constituted of nonelectrolytic and electrolytic plated films was washed with water and dried, and was thereafter subjected to oxidation-reduction treatment using as an oxidation bath (black bath) an aqueous solution of NaOH (20 g/l), NaClO$_2$ (50 g/l) and Na$_3$PO$_4$ (15.0 g/l) and using as a reduction bath an aqueous solution of NaOH (2.7 g/l) and NaBH$_4$ (1.0 g/l) to provide a roughened layer 4 on the entire surfaces of the conductor layer and through-hole (See FIG. 3D).

(3) Then, a conductive paste 5 containing copper particles loaded in the through-hole 3 by screen printing, and was dried and cured. Then, the portion of conductive paste 5 lying outside the through-hole 3 was removed belt sander polishing using a #400-belts and paper (manufactured by Sankyo Rikagaku Co., Ltd.), and further buff polishing for removing scars caused by this belt sander polishing was performed to flatten the surface of the substrate (See FIG. 3E).

(4) A palladium colloid catalyst is imparted to the surface of the substrate flattened in the above described step (3) in accordance with a normal method, and then nonelectrolytic plating was applied thereto, whereby a nonelectrolytic copper plated layer 6 with thickness of 0.6 μm was formed thereon (See FIG. 3F).

(5) Then, the substrate with the nonelectrolytic plated film formed thereon was electrolytic-plated with copper was applied to the substrate in accordance with the conditions described below to form an electrolytic copper plated film 7 with thickness of 15 μm (See FIG. 4A). This electrolytic copper plated layer 7 would become in the future a conductor layer (cap plated layer) 10 covering the conductor circuit 9 and the conductive paste 5 loaded in the through-hole 3.

[Electrolytic Plating Aqueous Solution]

Sulfuric acid 180 g/l, copper sulfate 80 g/l, additives (manufactured by Atotech Japan Co., Ltd., trade name: Kaparaside GL) 1 ml/l

[conditions for electrolytic plating] current density: 1 A/dm$^2$, time 30 minutes, temperature: room temperature.

(6) Commercially available photosensitive films were bonded to the both sides of the substrate with the electrolytic copper plated layer 7 formed thereon, and a mask was placed thereon, and this was exposed to light at 100 mJ/cm$^2$, and was then subjected to development processing with 0.8% sodium bicarbonate to form an etching resist 8 with thickness of 15 μm (See FIG. 4A).

(7) Then, the portion of plated film not having the etching resist 8 formed thereon was subjected to etching treatment to be dissolved away using a mixture of sulfuric acid and hydrogen peroxide, and the plating resist 8 was peeled off with 5% KOH to form the conductor layer 10 covering the conductor circuit 9 and conductive paste 5 (hereinafter this conductor layer will be referred to simply as "cap plating layer") (See FIG. 4B).

(8) Then, a roughened layer with thickness of 2.5 μm made of copper-nickel-phosphorous alloy (not shown) was formed on the entire surface including the conductor circuit 9 and the side face of the cap plated layer 10, and Sn layer with thickness of 0.3 μm was provided on the surface of this roughened layer. The producing method is as follows. Specifically, the substrate was acid-degreased and subjected to soft etching, and was then treated with a catalyst solution constituted of palladium chloride and organic acid to impart a palladium catalyst thereto, and this catalyst was activated, followed by plating the substrate in a nonelectrolytic plating bath of pH=9 constituted of 8 g/l of cupric sulfate, 0.6 g/l of nickel sulfate, 15 g/l of citric acid, 29 g/l of sodium hypophosphite, 31 g/l of boric acid, and 0.1 g/l of surfactant (Cirphynol 465 manufactured by Nisshin Chemical Industry Co., Ltd.) to provide a roughened layer of copper-nickel-phosphorous alloy on the entire surface of the conductor circuit 9 and cap plated layer 10.

(9) Thermoset resin sheets with thickness of 50 μm were laminated to the both sides of the substrate by heat-pressing the sheets at a pressure of 10 kg/cm$^2$ while increasing the temperature of the sheets to 50 to 180° C. to provide an interlayer resin insulation layer 12 made of thermoset resin (See FIG. 4C).

(10) A carbonic gas laser with wavelength of 10.4 μm was applied from the surface of the resin insulation layer 12 made of thermoset resin to provide an opening 13 for formation of a via hole 80 μm in diameter and 50 μm in depth and an opening 14 for formation of a dielectric layer 80 μm in diameter and 50 μm in depth, extending to the conductor circuit 9 and the cap plated layer 10, respectively (See FIG. 4D). For conditions for application of the carbonic gas laser to form the above openings 13 and 14, the level of pulse energy was 8 to 13 mJ, the pulse width was $10^{-12}$ to $10^{-14}$s, the pulse interval was 1 ms or greater, and the number of shots was 10 to 100. In addition, desmear and modification of the surface of the thermoset resin insulation layer were carried out by plasma treatment of a mixed gas of CF$_4$ and oxygen. It was shown that due to this modification, hydrophilic groups such as OH groups, carbonyl groups, COOH groups and the like existed on the surface. Furthermore, for the conditions for the oxygen plasma treatment, the power was 800 W, the pressure was 500 mTorr and treatment time was 20 minutes.

(11) Then, a dielectric layer 15 was formed in the opening 14 for formation of a dielectric layer by printing (Example I1 and Comparative Example I1) and electrodeposition (Examples I2 and I3 and Comparative Example I2) of the dielectric-forming composition. The dielectric-forming composition remaining on the above interlayer resin insulation layer was removed by the method of dipping in acid such as chromic acid and oxidant.

(12) In addition, sputtering was carried out using copper as a target under conditions of atmospheric pressure of 0.6 Pa, temperature of 80° C., power of 200W and time of 5 minutes to form a copper sputtered layer 16 on the surface of the dielectric layer 15 formed in the above described step (11), the surface of the resin insulation layer 12 made of thermoset resin and the inner wall of the opening for formation of a via hole 13 (See FIG. 5A). The thickness of the copper sputtered layer 16 formed in this way was 0.1 μm. Furthermore, for the sputtering equipment, Type SV-4540 manufactured by ULVAC was used.

(13) A photosensitive dry film was bonded to the copper sputtered layer 16 formed in the above described step (12), and a photo mask film was placed thereon, and this was exposed to light at 100 mJ/cm$^2$ and subjected to development processing with 0.8% sodium carbonate to provide a plating resist 17 with thickness of 15 μm (See FIG. 3B).

(14) In addition, electrolytic plating was carried out in accordance with the procedure of the above step (1) to form an electrolytic plated film 18 with thickness of 15 μm to partially thicken the conductor circuit 9 and fill the via hole portion 19 by plating (See FIG. 5C).

(15) In addition, the plating resist 17 was peeled off with 5% KOH, after which the copper sputtered layer 16 below the plating resist 17 was dissolved away by etching using a mixture of nitric acid and sulfuric acid/hydrogen peroxide, and conductor circuits 9 and 19 composed of the electrolytic plated film 18 and copper sputtered layer 16 were formed, and the dielectric layer 15 capable of serving as a condenser was formed between the inner conductor circuit 9a and the outer conductor circuit 9b (See FIG. 5D).

(16) Further, the procedures of the above described steps (8) to (15) were repeated, whereby a composite printed-wiring plate was obtained.

As a result of examining the capacity of the formed dielectric layer for the multilayer circuit boards produced in the above Examples, it was shown that they had capacitances described in (Table I1) and that they had good temperature stability.

(Example I1) and (Comparative Example I1)

Coating by Screen Printing Method

The dielectric pastes of the above described Example of Synthesis I6 and Comparative Example of Synthesis I1 were printed on copper foils by a screen printer. They were prebaked at 100° C. for 10 minutes, and were thereafter thermally cured in an oven at 150° C. for 30 minutes. The thickness of the dielectric layer was 20 μm when measured by a step thickness meter.

(Examples I2 TO I3) and (Comparative Example I2)

Coating by Electrodeposition

The plated layer 10 with the roughened layer 11 cathodes and SUS plates as counter-electrodes were placed in the aqueous dispersions for electrodeposition of the above described Examples of Synthesis I7 and I8 and Comparative Examples of Synthesis I2, and particles were electro-deposited on the roughened layer 11 as a cathode by the constant voltage method of 100V. Thereafter, they were at 100° C. for 10 minutes, and were further heated at 200° C. for 30 minutes for Example of Synthesis I8 and Comparative Example of Synthesis I2, and at 150° C. for 30 minutes for Example of Synthesis I7 to obtain dielectric layers with thickness of 10 μm.

The results are shown in Table I-1.

[Capacity of Dielectric Layer]

The electrostatic capacity at a frequency of 10 MHz was measured for a hundred dielectric layers in the board.

[Resistance to Moist Heat (HAST Test)]

For cured films, the test of resistance to moist heat was carried out for 72 hours at 121° C. and 100% humidity and under a pressure of 2 atmospheres, and from the electrostatic capacity before and after the test, their resistance to moist heat was evaluated on the basis of the following criteria.

○ . . . no significant difference and satisfactory level of resistance.

× . . . significant difference and unsatisfactory level of resistance.

[Volume Resistivity and Leakage Current]

Measurements were conducted in accordance with JIS K6911. Also, the leakage current was measured by an insulation resistance meter (manufactured by Hewlett-Packard Co., Ltd.)

TABLE I-1

| | | Example I1 | Example I2 | Example I3 | Comparative example I1 | Comparative example I2 |
|---|---|---|---|---|---|---|
| Composite particles for dielectrics | Material of inorganic particles (parts) | Barium titanate (90) | Barium titanate (90) | Barium titanate (90) | Barium titanate (100) | Barium titanate (100) |
| | Particle size of inorganic particles (μm) | 0.6 | 0.6 | 0.6 | 0.6 | 0.6 |
| | Conductive material (parts) | Silver (10) | Silver (10) | Nickel (20) | — | — |
| | Number of parts (solid content) | 100 | 15 | 15 | 100 | 15 |
| Resin component | Material of resin | Epoxy | Epoxy | Polyimide | Epoxy | Polyimide |
| | Number of parts (solid content) | 11 | 2 | 2 | 11 | 2 |
| Volume ratio | Composite particles for dielectrics/resin component | 59/41 | 54/46 | 54/46 | 60/40 | 56/44 |
| Process conditions | Coating method | Printing | Electro-deposition | Electro-deposition | Printing | Electro-deposition |
| | Heating temperature (° C.) | 150 | 200 | 150 | 150 | 200 |
| Properties of circuit board | Thickness (μm) | 20 | 10 | 10 | 20 | 10 |
| | Electrostatic Capacity (pF) | 200 | 400 | 400 | 90 | 120 |
| | Resistance to moist heat | ○ | ○ | ○ | ○ | ○ |
| | Volume resistivity (Ωcm) | $10^{13}$ | $10^{15}$ | $10^{13}$ | $10^{13}$ | $10^{14}$ |
| | Leakage current (A/cm$^2$) | $10^{-11}$ | $10^{-12}$ | $10^{-11}$ | $10^{-11}$ | $10^{-12}$ |

As apparent from Table I-1, the films obtained from Examples I1 to I3 had good electric properties. Example I3 in which polyimide was used as organic particles showed particularly good results with the difference before and after the test being remarkably small.

On the other hand, Comparative Examples I1 and I2 being outside the scope of the present invention showed poor results with the electrostatic capacity being smaller.

Example J1

Corresponding to Invention 7

[Production of Composite Particles for Dielectrics (1)]

Composite particles for dielectrics (1) with the surfaces of barium titanate particles (trade name: "HPBT-1", manufactured by Fuji Titanium Co., Ltd., average particle size: 0.6 µm, permittivity: 2000) coated with silver under reduced pressure by the deposition method were obtained.

The change in weight before and after the deposition showed that the content of silver deposited on barium titanate was 10%. Also, it was shown from SEM observation of powders that fine particles of silver were deposited on the surfaces of particles.

Example of Synthesis J2

[Production of Composite Particles for Dielectrics (2)]

Composite particles for dielectrics (2) with the surfaces of barium titanate particles (trade name: "HPBT-1", manufactured by Fuji Titanium Co., Ltd., average particle size: 0.6 µm, permittivity: 2000) coated with nickel by the nonelectrolytic method were obtained.

It was shown from SEM observation of the resulting powders that fine particles of nickel were deposited on the surfaces of particles. Also, it was shown by XMA that the content of nickel deposited on the surfaces was 20% based on the weight ratio.

Example of Synthesis J3

[Preparation of Polymer: Production of Thermoset Resin (Epoxy Group-Containing Polymer)]

In a reaction container, 25 g of glycidyl methacrylate (referred to as GMA in abbreviated form), 10 g of acrylonitrile (referred to as AN in abbreviated form), 15 g of methylmethacrylate (referred to as MMA in abbreviated form), and 50 g of dioxane (referred to as DOX in abbreviated form) were mixed together to prepare a uniform reaction stock solution.

This reaction stock solution was subjected to nitrogen bubbling for 30 minutes, followed by adding thereto 1.9 g of 2,2-azobisisobutylonitrile (referred to as AIAN in abbreviated form) as a polymerization initiator.

The temperature in the reaction vessel was increased to 70° C. while nitrogen bubbling was continued. The polymerization reaction was continuously carried out at the same temperature for 7 hours. The resulting reaction solution was mixed with a large amount of hexane to solidify the polymer, and thereafter this polymer was collected and redissolved in dioxane. This process of solidification by hexane and redissolution in dioxane was repeated 5 times to remove unreacted monomers. Then, dioxane was evaporated under reduced pressure at 70° C. to obtain a white epoxy group-containing polymer. The weight average molecular weight of this polymer was measured using GPC (gel permeation chromatography) to find that it was 110,000.

Example of Synthesis J4

[Preparation of Organic Particle Emulsion: Polyimide Based Resin Emulsion]

32.29 g (90 milimol) of 3,3',4,4'-diphenylsulfone tetracarboxylic dianhydride as tetracarboxylic dianhydride, 3.00 g (10 milimol) of 1,3,3a,4,5,9A-hexahydro-5 (tetrahydro-2,5-dioxo-3-furanyl)-naphtho [1, 2-c]-furane-1,3-dion, 36.95 g (90 milimol) of 2,2-bis[4-(4-aminophenoxy) phenyl] propane as a diamine compound, and 2.49 g (10 milimol) of organosiloxane LP 7100 (trade name, manufactured by The Shin-Etsu Chemical Co., Ltd.) were dissolved in 450 g of N-methyl-2-pyrolidone, and reacted at room temperature for 12 hours. Thereafter 32 g of pyridine and 71 g of acetic anhydride was added to this reaction solution to carry out a dehydration ring-closure reaction at 100° C. for 3 hours. Then, the reaction solution was evaporated under reduced pressure and purified to obtain a polyimide solution with solid content of 10%.

A reaction vessel containing 100 parts of diethylene glycol monoethyl ether was kept at 85° C. in the presence of nitrogen gas, and a mixture constituted of 65 parts of n-butyl acrylate, 30 parts of dimethyl aminoethyl acrylate, 5 parts of glycidyl metaacrylate and 1 part of azobisisobutylonitrile were continuously added to this reaction vessel for 5 hours while the mixture was made to undergo solution polymerization under stirring. After the mixture was completely added, the mixture was further stirred continuously at 85° C. for 2 hours and the solution polymerization was completed to obtain an acryl polymer solution with solid content of 50%.

50 parts (solid content) of polyimide solution, 30 parts (solid content) of acryl polymer solution and 20 parts of Epicoat 828 (trade name of a product manufactured by Yuka Shell Epoxy Co., Ltd.) were mixed together and reacted at 70° C. for 3 hours, and thereafter 3 parts of acetic acid were gradually added thereto and mixed to adjust pH. Then, 1000 parts of distilled water were gradually added thereto and vigorously stirred to obtain a cationic emulsion of organic particles having polyimide based resin as a principal constituent.

Example of Synthesis J5

[Preparation of Organic Particle Emulsion: Epoxy Based Resin Emulsion]

46.3 parts of block isocyanate constituted of tolylene diisocyanate and 2-ethylhexanol, and 89.3 parts of epoxyamine adduct obtained by reacting Epicoat 828 (trade name of a product manufactured by Yuka Shell Epoxy Co., Ltd.) with diethylamine were mixed together, and 3.8 parts of acetic acid was added thereto as a pH regulator. This was put into 1200 parts of ion-exchanged water under stirring, whereby a cationic emulsion of organic particles having an epoxy based resin precursor as a principal constituent was obtained.

Example of Synthesis J6

[Preparation of Dielectric Paste]

8 parts by weight of Epicoat 1004 being an epoxy resin (average molecular weight: 1600, manufactured by Yuka Shell Epoxy Co., Ltd.) as a thermoset resin, and 3 parts by weight of epoxy group-containing polymer obtained in Example of Synthesis J1 were dissolved in 60 parts by weight of butyl acetate cellosolve to prepare a uniform resin solution. To this resin solution were added 100 parts by weight of composite particles for dielectrics (1) obtained in Example of Synthesis J1 and 8 parts of acetylene black. Then, a triple roll was used to knead these dielectric paste composition materials for an hour to prepare a dielectric paste (1). The viscosity of this dielectric paste was 50000 mPa·s.

Example of Synthesis J7

[Preparation of Aqueous Dispersions for Electrodeposition]

15 parts by weight of composite particles for dielectrics (1) obtained in Example of Synthesis J1 and 0.2 parts by weight of acetylene black were mixed with 85 parts by weight of isopropyl alcohol by a homomixer, and were thereafter subjected to supersonic dispersion treatment to obtain dispersions of composite particles for dielectrics having no agglomerates (solid content: 15%).

In addition, 40 parts of cationic emulsion of organic particles having an epoxy based resin as a principal constituent, obtained in Example of Synthesis J5, were mixed with 100 parts by weight of the above described dispersions to prepare aqueous dispersions for electrodeposition (1).

Example of Synthesis J8

[Preparation of Aqueous Dispersions for Electrodeposition]

15 parts by weight of composite particles for dielectrics (2) obtained in Example of Synthesis J2 and 0.1 parts by weight of acetylene black were mixed with 85 parts by weight of ethyl lactate by a homomixer, were thereafter subjected to supersonic dispersion treatment to obtain dispersions of composite particles for dielectrics having no agglomerates (solid content: 15%).

In addition, 40 parts of cationic emulsion of organic particles having a polyimide based resin as a principal constituent that had been obtained in Example of Synthesis J4 were mixed with 100 parts by weight of the above described dispersions to prepare aqueous dispersions for electrodeposition (2).

Comparative Example of Synthesis J1

A paste composition was obtained in just a same way as Example of Synthesis J5 except that barium titanate particles (tradename: "HPBT-1", manufactured by Fuji Titanium Co., Ltd., average particle size: 0.6 μm, permittivity: 2000) were used instead of composite particles for dielectrics (1) obtained in Example of Synthesis J1.

Comparative Example of Synthesis 2

A paste composition was obtained in just a same way as Example of Synthesis J6 except that barium titanate particles (tradename: "HPBT-1", manufactured by Fuji Titanium Co., Ltd., average particle size: 0.6 μm, permittivity: 2000) were used instead of composite particles for dielectrics (1) obtained in Example of Synthesis J1.

Method of Producing Wiring Board and Evaluation of Performance Thereof

Coating by Screen Printing: (Example J1) and (Comparative J1)

(1) The dielectric pastes of the above described Example of Synthesis J6 and Comparative Example of Synthesis J1 were printed on copper foils (13 μm) by a screen printer. They were prebaked at 100° C. for 10 minutes, and were thereafter thermally cured at 150° C. for 10 minutes while being bonded to copper foils by application of pressure (3 MPa) with the copper foils superimposed thereon. The thickness of the dielectric layer was 20 μm when measured by a step thickness meter.

(2) This dielectric layer was punched in alignment with a lead frame serving as a predetermined grounding layer, and was attached to a frame by tin-silver soldering to obtain a wiring board.

(3) The results of examining the capacity of the dielectric layer for the obtained wiring board are shown in (Table J1).

Coating by Electrodeposition Method: (Examples J2 and J3) and (Comparative Example J2)

(1) Copper foils (13 μm) as cathodes and SUS plates as counter-electrodes were placed in the aqueous dispersions for electrodeposition of the above described Example of Synthesis J7and J8 and Comparative Example of Synthesis J2, and particles were electro-deposited on the copper foils as cathodes by using a 100 V constant voltage method. Thereafter, they were heated and prebaked at 100° C. for 10 minutes, and were then bonded to a lead frame serving as a grounding layer by application of pressure (5 MPa) while being heated at 200° C. for 30 minutes for Example of Synthesis J8 and Comparative Example of Synthesis J2, and at 150° C. for 30 minutes for Example of Synthesis J7 to obtain wiring boards each having a dielectric layer with thickness of 10 μm formed thereon.

(2) The results of examining the capacity of the dielectric layer for the obtained wiring board are shown in (Table J1).

The results are shown in Table J1.

[Capacity of Dielectric Layer]

The electrostatic capacity at a frequency of 10 MHz was measured for the dielectric layer.

[Resistance to Moist Heat (HAST Test)]

For cured films, the test of resistance to moist heat was carried out for 72 hours at 121° C. and 100% humidity and under a pressure of 2 atmospheres, and from the electrostatic capacity before and after the test, their resistance to moist heat was evaluated on the basis of the following criteria.

○ . . . no significant difference and satisfactory level of resistance.

× . . . significant difference and unsatisfactory level of resistance.

[Volume Resistivity and Leakage Current]

Measurements were conducted in accordance with JIS K6911. Also, the leakage current was measured by an insulation resistance meter (manufactured by Hewlett-Packard Co., Ltd.).

TABLE J1

|  |  | Example J1 | Example J2 | Example J3 | Comparative example J1 | Comparative example J2 |
|---|---|---|---|---|---|---|
| Composite particles for dielectrics | Material of inorganic particles (parts) | Barium titanate (90) | Barium titanate (90) | Barium titanate (90) | Barium titanate (100) | Barium titanate (100) |
|  | Particle size of inorganic particles (μm) | 0.6 | 0.6 | 0.6 | 0.6 | 0.6 |
|  | Conductive material (parts) | Silver (10) | Silver (10) | Nickel (20) | — | — |
|  | Number of parts (solid content) | 100 | 15 | 15 | 100 | 15 |
| Resin component | Material of resin | Epoxy | Epoxy | Polyimide | Epoxy | Polyimide |
|  | Number of parts (solid content) | 11 | 2 | 2 | 11 | 2 |
| Volume ratio | Composite particles for dielectrics/resin component | 59/41 | 54/46 | 54/46 | 60/40 | 56/44 |
| Process conditions | Coating method | Printing | Electro-deposition | Electro-deposition | Printing | Electro-deposition |
|  | Heating temperature (° C.) | 150 | 200 | 150 | 150 | 200 |
| Properties of circuit board | Thickness (μm) | 20 | 10 | 10 | 20 | 10 |
|  | Electrostatic Capacity (pF) | 10000 | 10000 | 12000 | 1000 | 2000 |
|  | Resistance to moist heat | ○ | ○ | ○ | ○ | ○ |
|  | Volume resistivity (Ωcm) | $10^{13}$ | $10^{13}$ | $10^{15}$ | $10^{13}$ | $10^{14}$ |
|  | Leakage current (A/cm$^2$) | $10^{-11}$ | $10^{-11}$ | $10^{-12}$ | $10^{-11}$ | $10^{-12}$ |

As apparent from Table J1, the wiring boards obtained from Examples J1 to J3 had good electric properties. Example J3 in which polyimide was used as organic particles showed particularly good results with the difference before and after the test being remarkably small.

On the other hand, Comparative Examples J1 and J2 being outside the scope of the present invention showed poor results with the electrostatic capacity being smaller.

The invention claimed is:

1. A dielectric-forming composition comprising:
   (A) composite particles for dielectrics in which part or all of the surfaces of inorganic particles with permittivity of 30 or greater are coated with
   at least one conductor selected from the group consisting of gold, silver, copper, tin, platinum, palladium, ruthenium, Fe, Ni, Co, Ge, Si, Zn, Ti, Mg Al, an alloy of gold, an alloy of silver, an alloy of copper, an alloy of tin, an alloy of platinum, an alloy of palladium, an alloy of ruthenium, an alloy of Fe, an alloy of Ni, an alloy of Co, an alloy of Ge, an alloy of Si, an alloy of Zn, an alloy of Ti, an alloy of Mg, an alloy of Al, titanium nitride, TCNQ (7,7,8,8-tetracyanoquinodimethane), polypyrrole, polyaniline, and polythiophene;
   wherein the average particle size of the composite particles for dielectrics is 0.1 to 5 μm,
   wherein the amount of the at least one conductor is 1 to 40% by weight, and
   wherein the specific surface area of the composite particles for dielectrics is 1 to 20 m2/g, and
   (B) a resin component comprising at least one of a polymerizable compound and a polymer,
   wherein the volume ratio of the composite particles for dielectrics (A) to the resin component comprising at least one of a polymerizable compound and a polymer (B), (A/B), is from 40/60 to 80/20.

2. The dielectric-forming composition according to claim 1, wherein the dielectric-forming composition forms a dielectric with permittivity of 30 or greater and dielectric loss tangent of 0.1 or smaller by heating to a temperature of 500° C. or lower.

3. The dielectric-forming composition according to claim 1, wherein the inorganic particles comprise a titanium based metal oxide.

4. The dielectric-forming composition according to claim 1, wherein the resin component comprising at least one of a polymerizable compound and a polymer (B) comprises:
   (C) an alkali soluble resin;
   (D) an ethylene based unsaturated group-containing compound; and
   (E) a photopolymerization initiator.

5. A photosensitive transfer film
   wherein the photosensitive transfer film comprises a substrate film and a photosensitive transfer layer formed on the substrate film, and
   wherein the photosensitive transfer layer comprises the dielectric-forming composition according to claim 4, and has a thickness of 5 to 100 μm.

6. A dielectric wherein the dielectric is formed using the photosensitive transfer film according to claim 5.

7. The dielectric-forming composition according to claim 1,
   wherein the average particle size of said composite particles for dielectrics (A) is 0.1 to 2 μm, and
   wherein the resin component comprising at least one of a polymerizable compound and a polymer (B) comprises:
   (F) a resin capable of undergoing alkali development; and
   (G) a photosensitive acid producing compound.

8. A photosensitive transfer film wherein the photosensitive transfer film comprises a substrate film and a photosensitive transfer layer formed on the substrate film, and
   wherein the photosensitive transfer layer comprises the dielectric-forming composition according to claim 7, and has a thickness of 5 to 100 μm.

9. A dielectric wherein the dielectric is formed using the photosensitive transfer film according to claim 8.

10. An electronic part comprising the dielectric according to claim 9.

11. A buildup multilayer circuit board wherein conductor layers and interlayer resin insulation layers are deposited alternatingly on an insulation substrate, and
    wherein the dielectric layer according to claim 9 is provided between two conductor layers neighboring in the vertical direction.

12. A wiring board comprising at least a signal layer, a power layer, a grounding layer and an insulation layer, wherein the dielectric layer according to claim 9 is provided between said power layer and said grounding layer.

13. A dielectric, wherein the dielectric is formed using the dielectric-forming composition according to claim 1.

14. A dielectric with a conductive foil wherein the dielectric according to claim 13 is formed on the conductive foil.

15. An electronic part, wherein the electronic part comprises the dielectric according to claim 13.

16. A buildup multilayer circuit board wherein conductor layers and interlayer resin insulation layers are deposited alternatingly on an insulation substrate, and wherein the dielectric layer according to claim 13 is provided between two conductor layers neighboring in the vertical direction.

17. A wiring board comprising at least a signal layer, a power layer, a grounding layer and an insulation layer, wherein the dielectric layer according to claim 13 is provided between the power layer and the grounding layer.

* * * * *